(12) United States Patent
Hirano et al.

(10) Patent No.: US 8,911,928 B2
(45) Date of Patent: Dec. 16, 2014

(54) RESIST COMPOSITION, METHOD OF FORMING RESIST PATTERN, POLYMERIC COMPOUND AND METHOD OF PRODUCING THE SAME

(75) Inventors: Tomoyuki Hirano, Kawasaki (JP); Daiju Shiono, Kawasaki (JP); Daichi Takaki, Kawasaki (JP); Junichi Tsuchiya, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 121 days.

(21) Appl. No.: 13/477,516

(22) Filed: May 22, 2012

(65) Prior Publication Data

US 2012/0308928 A1  Dec. 6, 2012

(30) Foreign Application Priority Data

Jun. 1, 2011  (JP) ................. P2011-123261

(51) Int. Cl.
| | | |
|---|---|---|
| *G03F 7/004* | (2006.01) | |
| *G03F 7/38* | (2006.01) | |
| *C08F 220/32* | (2006.01) | |
| *G03F 7/039* | (2006.01) | |
| *G03F 7/20* | (2006.01) | |
| *C08F 220/58* | (2006.01) | |

(52) U.S. Cl.
CPC .............. *C08F 220/32* (2013.01); *G03F 7/38* (2013.01); *G03F 7/0046* (2013.01); *G03F 7/0397* (2013.01); *G03F 7/2041* (2013.01); *C08F 220/58* (2013.01); *Y10S 430/107* (2013.01); *Y10S 430/111* (2013.01)
USPC ........ 430/270.1; 430/326; 430/906; 430/910; 526/287; 526/292.95; 526/304; 526/307.7

(58) Field of Classification Search
CPC ..... G03F 7/0397; C08F 222/38; C08F 228/06
USPC ............... 430/270.1, 906, 910, 326; 526/287, 526/292.95, 304, 307.7
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 7,074,543 B2 | 7/2006 | Iwai et al. | |
| 8,206,891 B2 * | 6/2012 | Seshimo et al. | ........... 430/270.1 |
| 2006/0172226 A1 * | 8/2006 | Mizutani | ................... 430/270.1 |
| 2009/0035692 A1 * | 2/2009 | Tarutani et al. | ............ 430/270.1 |
| 2009/0162784 A1 | 6/2009 | Ogata et al. | |
| 2009/0317743 A1 | 12/2009 | Shiono et al. | |

FOREIGN PATENT DOCUMENTS

| | | |
|---|---|---|
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2002-226474 | 8/2002 |
| JP | A-2003-241385 | 8/2003 |
| JP | A-2009-025707 | 2/2009 |
| JP | A-2010-002870 | 1/2010 |
| WO | WO 2004/074242 A2 | 9/2004 |
| WO | WO 2006/038477 A1 | 4/2006 |

* cited by examiner

*Primary Examiner* — John Chu
(74) *Attorney, Agent, or Firm* — Knobbe Martens Olson & Bear LLP

(57) ABSTRACT

A resist composition including a base component (A) that exhibits changed solubility in a developing solution under action of acid and an acid generator component (B) that generates acid upon exposure, wherein the base component (A) contains a resin component (A1) including a structural unit (a0) represented by general formula (a0-1) shown below and a structural unit (a1)) containing an acid decomposable group that exhibits increased polarity under action of acid, and the amount of the structural unit (a0) is less than 50 mol %,

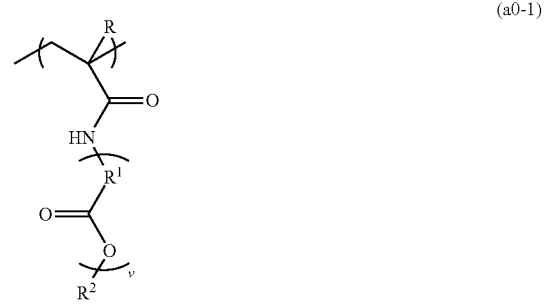

wherein R represents a hydrogen atom, an alkyl group of 1 to 5 carbon atoms or a halogenated alkyl group of 1 to 5 carbon atoms; $R^1$ represents a divalent linking group; $R^2$ represents a —$SO_2$— containing cyclic group; and v represents 0 or 1.

6 Claims, No Drawings

RESIST COMPOSITION, METHOD OF FORMING RESIST PATTERN, POLYMERIC COMPOUND AND METHOD OF PRODUCING THE SAME

BACKGROUND OF THE INVENTION

1. Field of the Invention

The present invention relates to a resist composition and a method of forming a resist pattern, as well as to a polymeric compound that is useful for use within the resist composition, and a method of producing the same.

Priority is claimed on Japanese Patent Application No. 2011-123261, filed Jun. 1, 2011, the content of which is incorporated herein by reference.

2. Description of Related Art

In lithography techniques, for example, a resist film composed of a resist material is formed on a substrate, and the resist film is subjected to selective exposure followed by development, thereby forming a resist pattern having a predetermined shape on the resist film. A resist material in which the exposed portions of the resist film become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these pattern miniaturization techniques involve shortening the wavelength (and increasing the energy) of the exposure light source. Conventionally, ultraviolet radiation typified by g-line and i-line radiation has been used, but nowadays KrF excimer lasers and ArF excimer lasers are starting to be introduced in the mass production of semiconductor elements. Furthermore, research is also being conducted into lithography techniques that use an exposure light source having a shorter wavelength (and a higher energy level) than these excimer lasers, such as extreme ultraviolet radiation (EUV), electron beam (EB), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, conventionally a chemically amplified composition has been used, which includes an acid generator component that generates acid upon exposure, and a base component that exhibits changed solubility in a developing solution under the action of acid.

Resins (base resins) are typically used as the base components used within chemically amplified resist compositions.

For example, in an alkali developing process where an alkali developing solution is used as a developing solution, a chemically amplified resist composition for forming a positive resist pattern typically contains an acid generator component and a resin component that exhibits increased solubility in an alkali developing solution under the action of acid. If the resist film formed using this resist composition is selectively exposed during formation of a resist pattern, then acid is generated from the acid generator component within the exposed portions, and the action of this acid causes an increase in the solubility of the resin component in an alkali developing solution, making the exposed portions soluble in the alkali developing solution. As a result, by performing alkali developing, the unexposed portions remain as a pattern, resulting in the formation of a positive-type pattern.

As the resin component, a resin that exhibits increased polarity under the action of acid is typically used. When the polarity of the resin is increased, the solubility in an alkali developing solution increases whereas the solubility in an organic solvent decreases. Accordingly, if a solvent developing process that uses a developing solution containing an organic solvent (an organic developing solution) is employed instead of the alkali developing process, then within the exposed portions of the resist film, the solubility in the organic developing solution decreases relatively, meaning that during the solvent developing process, the unexposed portions of the resist film are dissolved in the organic developing solution and removed, whereas the exposed portions remain as a pattern, resulting in the formation of a negative-type resist pattern. This type of solvent developing process that results in the formation of a negative-type resist pattern is sometimes referred to as a negative-type developing process (for example, see Patent Document 1).

Currently, resins that contain structural units derived from (meth)acrylate esters within the main chain (acrylic resins) are widely used as base resins for chemically amplified resist compositions that use ArF excimer laser lithography or the like, as they exhibit excellent transparency in the vicinity of 193 nm (for example, see Patent Document 2).

In order to improve various lithography properties, a plurality of structural units are introduced in the base resin. For example, in the case of a resin component that exhibits higher polarity under the action of acid, a base resin is typically used that includes not only a structural unit having an acid-degradable group that exhibits higher polarity by degrading under the action of the acid generated from the acid generator, but also a structural unit having a polar group such as a hydroxyl group, and a structural unit having a lactone structure.

In particular, the structural units having a polar group are widely used, since the compatibility with an alkali developing solution is improved, which contributes to favorable improvements in the resolution. A structural unit having a lactone structure is generally considered as being effective in improving the adhesion between the resist film and the substrate, and increasing the compatibility with an alkali developing solution, thereby contributing to improvement in various lithography properties.

Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

In recent years, with increasing demands for high resolution resist patterns of 0.15 microns or smaller, in addition to the above-mentioned improvement of various lithography properties and the like, improving the level of defects following developing (namely, surface defects) is now also becoming more necessary. Here, the term "defects" refers to general abnormalities of a resist pattern, which are detected when observed from right above the developed resist pattern, using a surface defect detection apparatus (product name: "KLA") manufactured by KLA-TENCOR Corporation. Examples of these "abnormalities" include post-developing blobs, scum, foam, dust and bridges between resist patterns.

As a method of improving such defects, for example, in the base resin, it is possible to lower the proportion of the structural unit having a highly hydrophobic, acid decomposable group, or to increase the proportion of the structural unit having a polar group. As a method of improving defects using the latter approach, a base resin having a structural unit that includes an oxo group (═O) has been disclosed in Patent Document 3. Further, as a monomer for deriving the structural unit having an oxo group or a monomer, obtained from the above monomer, for deriving the structural unit having a lactone structure, those described in Patent Document 4 are known.

DOCUMENTS OF RELATED ART

Patent Document

[Patent Document 1] Japanese Unexamined Patent Application, First Publication No. 2009-25707
[Patent Document 2] Japanese Unexamined Patent Application, First Publication No. 2003-241385
[Patent Document 3] International Patent Publication No. 2006/038477 pamphlet
[Patent Document 4] Japanese Unexamined Patent Application, First Publication No. 2002-226474

SUMMARY OF THE INVENTION

The method of using a structural unit having a polar group in the base resin which has been described in the above Patent Documents 3 and 4 was still not sufficient by itself for improving defects. For this reason, in order to further improve such defects, there was also a need to lower the proportion of the structural units having an acid decomposable group at the same time. However, when lowering the proportion of the structural units having an acid decomposable group, dissolution contrast is reduced, thereby deteriorating various lithography properties and resolution. Accordingly, a resist composition for achieving lithography properties and resolution while improving such defects at the same time is being required.

In addition, as further progress is made in lithography techniques and the potential application fields for lithography techniques continue to expand, demands are growing for novel materials capable of being used in these lithography applications. For example, further progress in pattern miniaturization will result in ever greater demands for improvements in resist materials, both in terms of various lithography properties such as the exposure latitude and reduction of roughness, not to mention the resolution, and in terms of the shape of the pattern to be obtained.

The present invention takes the above circumstances into consideration, with an object of providing a resist composition which exhibits excellent resolution, enables to suppress the occurrence of defects following development, and which also exhibits excellent lithography properties and resist pattern shape; a method of forming a resist pattern; a polymeric compound that is useful for the resist composition; and a method of producing the polymeric compound.

For solving the above-mentioned problems, the present invention employs the following aspects.

That is, a first aspect of the present invention is a resist composition including a base component (A) that exhibits changed solubility in a developing solution under the action of acid and an acid generator component (B) that generates acid upon exposure, the resist composition characterized in that the base component (A) contains a resin component (A1) including a structural unit (a0) represented by general formula (a0-1) shown below and a structural unit (a1) containing an acid decomposable group that exhibits increased polarity under the action of acid, and the amount of the structural unit (a0) is less than 50 mol %.

[Chemical Formula 1]

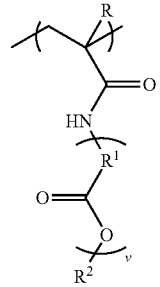

(a0-1)

In the formula, R represents a hydrogen atom, an alkyl group of 1 to 5 carbon atoms or a halogenated alkyl group of 1 to 5 carbon atoms; $R^1$ represents a divalent linking group; $R^2$ represents a —$SO_2$— containing cyclic group; and v represents 0 or 1.

A second aspect of the present invention is a method of forming a resist pattern, including: using a resist composition of the first aspect to form a resist film on a substrate; conducting exposure of the resist film; and developing the resist film to form a resist pattern.

A third aspect of the present invention is a polymeric compound including a structural unit (a0) represented by general formula (a0-1) shown below and a structural unit (a1) containing an acid decomposable group that exhibits increased polarity under the action of acid, wherein the amount of the structural unit (a0) is less than 50 mol %.

[Chemical Formula 2]

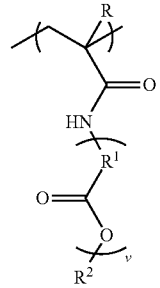

(a0-1)

In the formula, R represents a hydrogen atom, an alkyl group of 1 to 5 carbon atoms or a halogenated alkyl group of 1 to 5 carbon atoms; $R^1$ represents a divalent linking group; $R^2$ represents a —$SO_2$— containing cyclic group; and v represents 0 or 1.

A fourth aspect of the present invention is a method of producing a polymeric compound of the third aspect, characterized in that a nitrogen-containing solvent is used as a polymerization solvent.

In the present description and claims, the term "exposure" is used as a general concept that includes irradiation with any form of radiation.

The term "structural unit" refers to a monomer unit that contributes to the formation of a polymeric compound (namely, a resin, polymer or copolymer).

The term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic divalent saturated hydrocarbon, unless otherwise specified. The same applies for the alkyl group within an alkoxy group.

A "halogenated alkyl group" is a group in which part or all of the hydrogen atoms of an alkyl group have each been substituted with a halogen atom, and a "halogenated alkylene group" is a group in which part or all of the hydrogen atoms of an alkylene group have each been substituted with a halogen atom, wherein examples of the halogen atom include a fluorine atom, a chlorine atom, a bromine atom and an iodine atom.

A "fluorinated alkyl group" is a group in which part or all of the hydrogen atoms of an alkyl group have each been substituted with a fluorine atom, and a "fluorinated alkylene group" is a group in which part or all of the hydrogen atoms of an alkylene group have each been substituted with a fluorine atom.

According to the present invention, there are provided a resist composition which exhibits excellent resolution, enables to suppress the occurrence of defects following development, and which also exhibits excellent lithography properties and resist pattern shape; a method of forming a resist pattern; as well as a polymeric compound that is useful for the resist composition and the production method thereof.

DETAILED DESCRIPTION OF THE INVENTION

<<Resist Composition>>

The resist composition of the present invention includes a base component (A) (hereafter, referred to as "component (A)") that exhibits changed solubility in a developing solution under the action of acid and an acid generator component (B) (hereafter, referred to as "component (B)") that generates acid upon exposure.

When a resist film is formed using the resist composition, and that resist film is then subjected to selective exposure, acid is generated from the component (B) in the exposed portions, and the action of this generated acid causes a change in the solubility of the component (A) in a developing solution, whereas the solubility of the component (A) in a developing solution remains unchanged in the unexposed portions. Accordingly, the difference in the solubility in a developing solution is developed between the exposed portions and the unexposed portions. For this reason, when the resist film is subjected to developing, either a positive-type resist pattern is formed by dissolving and removing the exposed portions in the case of a positive-type resist composition, or a negative-type resist pattern is formed by dissolving and removing the unexposed portions in the case of a negative-type resist composition.

In this description, a resist composition in which the exposed portions are dissolved and removed to form a positive-type resist pattern is referred to as a "positive-type resist composition", whereas a resist composition in which the unexposed portions are dissolved and removed to form a negative-type resist pattern is referred to as a "negative-type resist composition".

The resist composition of the present invention may be either a positive-type resist composition or a negative-type resist composition.

Further, the resist composition of the present invention may be used for either an alkali developing process in which an alkali developing solution is used for the developing treatment during formation of the resist pattern, or a solvent developing process in which a developing solution containing an organic solvent (an organic developing solution) is used for the developing treatment.

<Component (A)>

The term "base component" for the component (A) refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compounds that can be used as the base component can be broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more.

With respect to a polymer, the "molecular weight" is the weight average molecular weight in terms of the polystyrene equivalent value determined by gel permeation chromatography (GPC).

In the present invention, the component (A) contains a resin component (A1) (hereafter, referred to as "component (A1)") including a structural unit (a0) represented by the aforementioned general formula (a0-1) and a structural unit (a1) containing an acid decomposable group that exhibits increased polarity under the action of acid, wherein the amount of the structural unit (a0) is less than 50 mol %.

In the component (A1), the structural unit (a1) is a structural unit which undergoes cleavage of at least some of the bonds within the structure thereof under the action of acid to thereby increase the polarity. For this reason, the resist composition of the present invention is a chemically amplified resist composition which becomes a positive type in the case of an alkali developing process, and a negative type in the case of a solvent developing process. Because the polarity of the component (A1) changes upon exposure, by using the component (A1), a favorable development contrast can be achieved, not only in an alkali developing process, but also in a solvent developing process.

In other words, in the case of applying an alkali developing process, the component (A1) is substantially insoluble in an alkali developing solution prior to exposure, but when acid is generated from the component (B) upon exposure, the action of the acid causes an increase in the polarity that increases the solubility in the alkali developing solution. Accordingly, during resist pattern formation, by conducting selective exposure of a resist film formed by applying the resist composition onto a substrate, the exposed portions change from being substantially insoluble in the alkali developing solution to being soluble, while the unexposed portions remain substantially insoluble in the alkali developing solution, meaning alkali developing can be used to form a positive-type resist pattern.

On the other hand, in the case of applying a solvent developing process, the component (A1) exhibits high solubility in an organic developing solution prior to exposure, but when acid is generated from the component (B) upon exposure, the action of the acid causes an increase in the polarity that reduces the solubility in the organic developing solution. Accordingly, during resist pattern formation, by conducting selective exposure of a resist film formed by applying the resist composition onto a substrate, the exposed portions change from being soluble in the organic developing solution to being substantially insoluble, while the unexposed portions remain soluble in the organic developing solution, meaning developing with the organic developing solution can be used to achieve a contrast between the exposed portions and the unexposed portions, enabling formation of a negative-type resist pattern.

[Structural Unit (a0)]

The structural unit (a0) is a structural unit represented by general formula (a0-1) shown below.

[Chemical Formula 3]

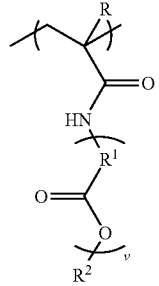

(a0-1)

In the formula, R represents a hydrogen atom, an alkyl group of 1 to 5 carbon atoms or a halogenated alkyl group of 1 to 5 carbon atoms; $R^1$ represents a divalent linking group; $R^2$ represents a —$SO_2$— containing cyclic group; and v represents 0 or 1.

In the aforementioned formula (a0-1), R represents a hydrogen atom, an alkyl group of 1 to 5 carbon atoms or a halogenated alkyl group of 1 to 5 carbon atoms.

The alkyl group of 1 to 5 carbon atoms for R is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group of 1 to 5 carbon atoms for R include groups in which part or all of the hydrogen atoms within the aforementioned "alkyl groups of 1 to 5 carbon atoms for R" has been substituted with halogen atoms. Examples of the halogen atom include a fluorine atom, a chlorine atom, a bromine atom and an iodine atom, and a fluorine atom is particularly desirable.

Of these, as R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the aforementioned formula (a0-1), although there are no particular limitations on the divalent linking group for preferred examples include divalent hydrocarbon groups which may have a substituent, and divalent linking groups containing a hetero atom.

The description that the hydrocarbon group "may have a substituent" means that part or all of the hydrogen atoms within the hydrocarbon group may each be substituted with a substituent (an atom other than a hydrogen atom or a group).

The hydrocarbon group for $R^1$ may be either an aliphatic hydrocarbon group or an aromatic hydrocarbon group.

An "aliphatic hydrocarbon group" refers to a hydrocarbon group that has no aromaticity.

The aliphatic hydrocarbon group as the divalent hydrocarbon group for $R^1$ described above may be either saturated or unsaturated. In general, the aliphatic hydrocarbon group is preferably saturated.

Specific examples of the aliphatic hydrocarbon group include a linear or branched aliphatic hydrocarbon group, and an aliphatic hydrocarbon group that includes a ring within the structure.

The linear or branched aliphatic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

Examples of the aliphatic hydrocarbon group that includes a ring within the structure include alicyclic hydrocarbon groups (groups in which two hydrogen atoms have been removed from an aliphatic hydrocarbon ring), groups in which an alicyclic hydrocarbon group is bonded to the terminal of a linear or branched aliphatic hydrocarbon group, and groups in which an alicyclic hydrocarbon group is interposed within the chain of a linear or branched aliphatic hydrocarbon group. Examples of the linear or branched aliphatic hydrocarbon group include the same groups as those mentioned above.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which two hydrogen atoms have been removed from a monocycloalkane is preferred. The monocycloalkane preferably contains 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group used as the divalent hydrocarbon group for $R^1$ described above preferably has 3 to 30 carbon atoms, more preferably 5 to 30 carbon atoms, still more preferably 5 to 20 carbon atoms, still more preferably 6 to 15 carbon atoms, and most preferably 6 to 10 carbon atoms. This number of carbon atoms does not include any carbon atoms within any substituents.

Specific examples of the aromatic ring within the aromatic hydrocarbon group include aromatic hydrocarbon rings such as benzene, biphenyl, fluorene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom.

Specific examples of the aromatic hydrocarbon groups include groups in which two hydrogen atoms have been removed from the aforementioned aromatic hydrocarbon ring (namely, arylene groups); and groups in which one of the hydrogen atoms of a group having one hydrogen atom removed from the aforementioned aromatic hydrocarbon ring (namely, an aryl group) has been substituted with an alkylene group (for example, groups in which one hydrogen atom has been further removed from the aryl group within an arylalkyl group, such as a benzyl group, a phenethyl group, a 1-naphthylmethyl group, a 2-naphthylmethyl group, a 1-naphthylethyl group or a 2-naphthylethyl group). The alkylene group (the alkyl chain within the arylalkyl group) preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring of an aforementioned aromatic hydrocarbon group may be substituted with a substituent. Examples of the substituent include an alkyl group, an alkoxy group, a halogen atom, a halogenated alkyl group, a hydroxyl group and an oxygen atom (=O).

The alkyl group for the substituent is preferably an alkyl group of 1 to 5 carbon atoms, and is most preferably a methyl group, an ethyl group, a propyl group, an n-butyl group or a tert-butyl group.

The alkoxy group as the substituent is preferably an alkoxy group of 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms of an aforementioned alkyl group have each been substituted with an aforementioned halogen atom.

Examples of the hetero atom in the "divalent linking group containing a hetero atom" for $R^1$ described above include atoms other than a carbon atom or hydrogen atom, and specific examples thereof include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH— (H may be substituted with a substituent such as an alkyl group, an acyl group or the like), —S—, —S(=O)$_2$—, —S(=O)$_2$—O—, —NH—C(=O)—, =N—, groups represented by general formula —$Y^{21}$—O—$Y^{22}$—, —[$Y^{21}$—C(=O)—O]$_{m'}$—$Y^{22}$— or —$Y^{21}$—O—C(C)—$Y^{22}$— [in the formulas, each of $Y^{21}$ and $Y^{22}$ independently represents a divalent hydrocarbon group which may have a substituent, O represents an oxygen atom, and m' represents an integer of 0 to 3].

When $R^1$ represents —NH—, this H may be substituted with a substituent such as an alkyl group or an acyl group.

In the formulas —$Y^{21}$—O—$Y^{22}$—, —[$Y^{21}$—C(=O)—O]$_{m'}$—$Y^{22}$— and —$Y^{21}$—O—C(=O)—$Y^{22}$—, each of $Y^{21}$ and $Y^{22}$ independently represents a divalent hydrocarbon group which may have a substituent. Examples of this divalent hydrocarbon group include the same groups as those described above for the "divalent hydrocarbon group which may have a substituent" for $R^1$.

$Y^{21}$ is preferably a linear aliphatic hydrocarbon group, more preferably a linear alkylene group, still more preferably a linear alkylene group of 1 to 5 carbon atoms, and most preferably a methylene group or an ethylene group.

$Y^{22}$ is preferably a linear or branched aliphatic hydrocarbon group, and is more preferably a methylene group, an ethylene group or an alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by formula —[$Y^{21}$—C(=O)—O]$_{m'}$—$Y^{22}$—, m' represents an integer of 0 to 3, and is preferably an integer of 0 to 2, more preferably 0 or 1, and most preferably 1. In other words, the group represented by formula —[$Y^{21}$—C(=O)—O]$_{m'}$—$Y^{22}$— is most preferably a group represented by a formula —$Y^{21}$—C(=O)—O—$Y^{22}$—. Among such groups, groups represented by —(CH$_2$)$_{a'}$—C(=O)—O—(CH$_2$)$_{b'}$— are particularly preferred. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking groups containing a hetero atom, linear groups containing an oxygen atom as a hetero atom, e.g., groups containing an ether bond or ester bond are preferred, and groups represented by the above formula —$Y^{21}$—O—$Y^{22}$—, —[$Y^{21}$—C(=O)—O]$_{m'}$—$Y^{22}$— or —$Y^{21}$—O—C(=O)—$Y^{22}$— are more preferred.

Of the various possibilities described above, as the divalent linking group for $R^1$, a linear or branched alkylene group, a divalent alicyclic hydrocarbon group or a divalent linking group containing a hetero atom is particularly desirable. Among these, a linear or branched alkylene group or a divalent linking group containing a hetero atom is more preferable, and a linear or branched alkylene group is still more preferable.

In the aforementioned formula (a0-1), $R^2$ represents a —SO$_2$— containing cyclic group.

By including the structural unit (a0) containing a —SO$_2$— containing cyclic group, a resist composition containing the component (A1) is capable of improving the adhesion of a resist film to a substrate. Further, various lithography properties such as sensitivity, resolution, exposure latitude (EL margin), line width roughness (LWR), line edge roughness (LER) and mask reproducibility are improved.

Here, an "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group.

In the —SO$_2$— containing cyclic group, the ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings.

The —SO$_2$— containing cyclic group may be either a monocyclic group or a polycyclic group.

As the —SO$_2$— containing cyclic group, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

The —SO$_2$— containing cyclic group preferably has 3 to 30 carbon atoms, more preferably 4 to 20 carbon atoms, still more preferably 4 to 15 carbon atoms, and most preferably 4 to 12 carbon atoms. Herein, the number of carbon atoms refers to the number of carbon atoms constituting the ring skeleton, excluding the number of carbon atoms within a substituent.

The —SO$_2$— containing cyclic group may be either a —SO$_2$— containing aliphatic cyclic group or a —SO$_2$— containing aromatic cyclic group. A —SO$_2$— containing aliphatic cyclic group is preferable.

Examples of the —SO$_2$— containing aliphatic cyclic group include aliphatic cyclic groups in which part of the carbon atoms constituting the ring skeleton thereof has been substituted with a —SO$_2$— group or a —O—SO$_2$— group and has at least one hydrogen atom removed from the aliphatic hydrocarbon ring. Specific examples include an aliphatic hydrocarbon ring in which a —CH$_2$— group constituting the ring skeleton thereof has been substituted with a —SO$_2$— group and has at least one hydrogen atom removed therefrom; and an aliphatic hydrocarbon ring in which a —CH$_2$—CH$_2$— group constituting the ring skeleton thereof has been substituted with a —O—SO$_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —SO$_2$— containing cyclic group may have a substituent. Examples of the substituent include an alkyl group, an alkoxy group, a halogen atom, a halogenated alkyl group, a hydroxyl group, an oxygen atom (=O), —COOR", —OC(=O)R", a hydroxyalkyl group and a cyano group (wherein R" represents a hydrogen atom or an alkyl group).

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably contains 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxyl group.

More specific examples of the —SO$_2$— containing cyclic group include groups represented by general formulas (3-1) to (3-4) shown below.

[Chemical Formula 4]

(3-1)

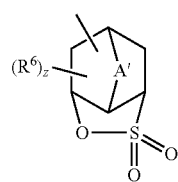

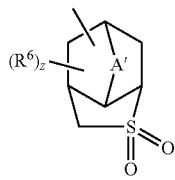 (3-2)

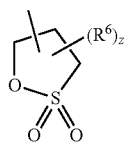 (3-3)

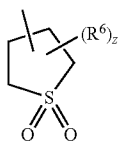 (3-4)

In the formulas, A' represents an oxygen atom, a sulfur atom or an alkylene group of 1 to 5 carbon atoms which may contain an oxygen atom or a sulfur atom; z represents an integer of 0 to 2; and $R^6$ represents an alkyl group, an alkoxy group, a halogenated alkyl group, a hydroxyl group, —COOR″, —OC(=O)R″, a hydroxyalkyl group or a cyano group, wherein R″ represents a hydrogen atom or an alkyl group.

In the general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^6$ may be the same or different from each other.

As the alkyl group, alkoxy group, halogenated alkyl group, —COOR″, —OC(=O)R″ and hydroxyalkyl group for $R^6$, the same alkyl groups, alkoxy groups, halogenated alkyl groups, —COOR″, —OC(=O)R″ and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 5]

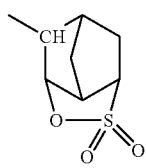 (3-1-1)

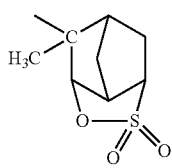 (3-1-2)

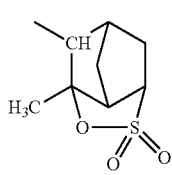 (3-1-3)

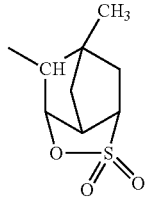 (3-1-4)

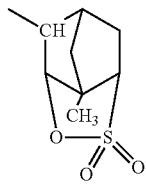 (3-1-5)

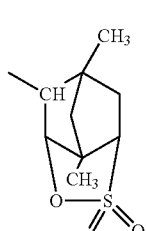 (3-1-6)

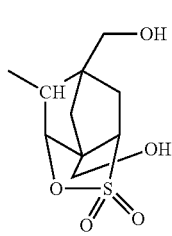 (3-1-7)

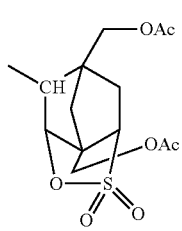 (3-1-8)

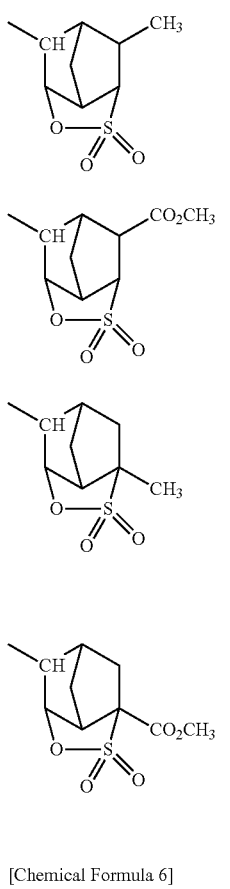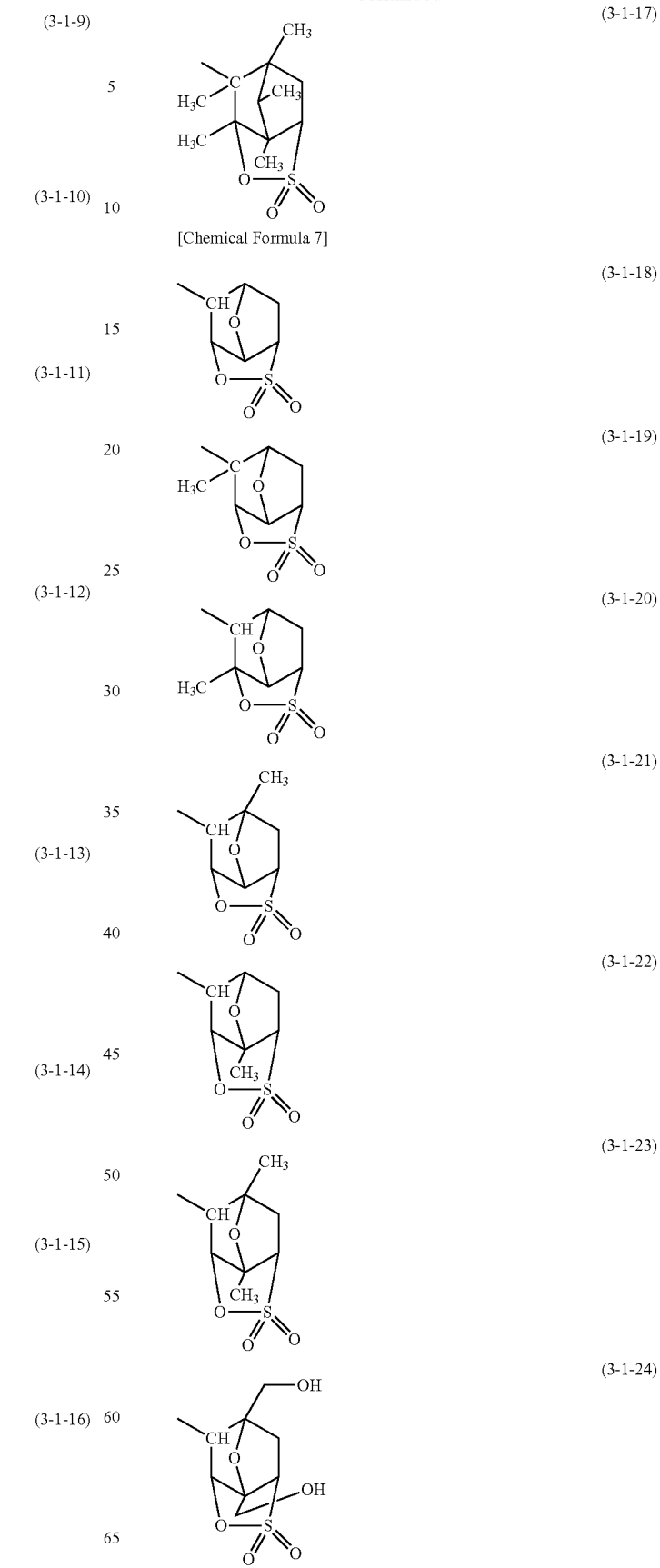

(3-1-25) 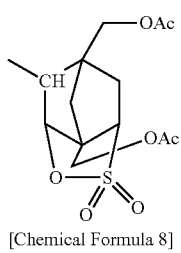

[Chemical Formula 8]

(3-1-26) 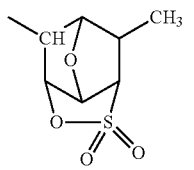

(3-1-27) 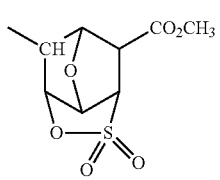

(3-1-28) 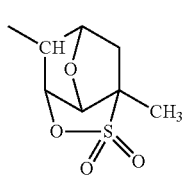

(3-1-29) 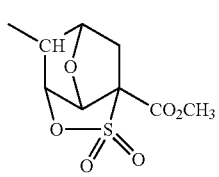

(3-1-30) 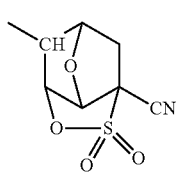

(3-1-31) 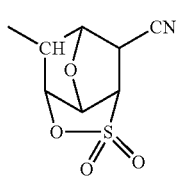

(3-1-32) 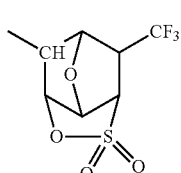

(3-1-33) 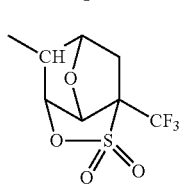

[Chemical Formula 9]

(3-2-1) 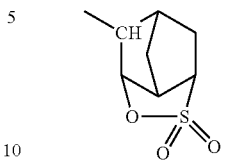

(3-2-2) 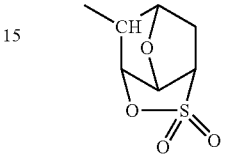

(3-3-1) 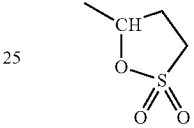

(3-4-1) 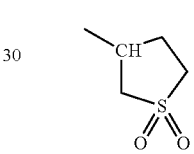

Of the groups shown above, as the —SO$_2$-containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by the aforementioned chemical formula (3-1-1) is most preferable.

In the aforementioned formula (a0-1), v is 0 or 1, and preferably 1.

In particular, as the structural unit (a0), a structural unit represented by general formula (a0-0-11) or (a0-0-12) shown below is preferable, and a structural unit represented by general formula (a0-0-12) is more preferable since the effect of reducing the roughness can be enhanced.

[Chemical Formula 10]

(a0-0-11) 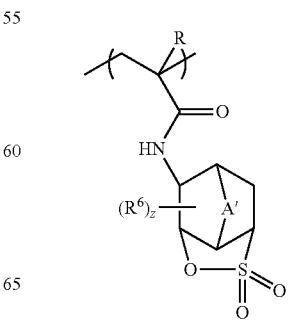

-continued (a0-0-12)

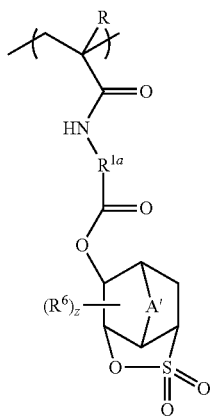

In the formulas, R, A', $R^6$ and z are each the same as defined above; and $R^{1a}$ is the same as defined for $R^1$ in the aforementioned general formula (a0-1).

In general formula (a0-0-11), A' is preferably a methylene group, an ethylene group, an oxygen atom (—O—) or a sulfur atom (—S—).

As $R^{1a}$, a linear or branched alkylene group or a divalent linking group containing an oxygen atom is preferable. Examples of the linear or branched alkylene group and the divalent linking group containing an oxygen atom for $R^{1a}$ include the same linear or branched alkylene groups and divalent linking groups containing a hetero atom (i.e., those containing an oxygen atom as the hetero atom) as those described above within the description of $R^1$ in the general formula (a0-1).

As the structural unit represented by general formula (a0-0-12), a structural unit represented by general formula (a0-0-12a) or (a0-0-12b) shown below is particularly desirable.

[Chemical Formula 11]

(a0-0-12a)

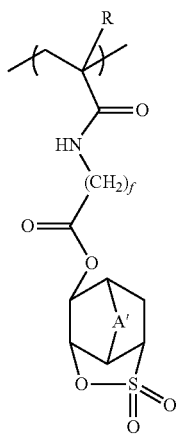

-continued (a0-0-12b)

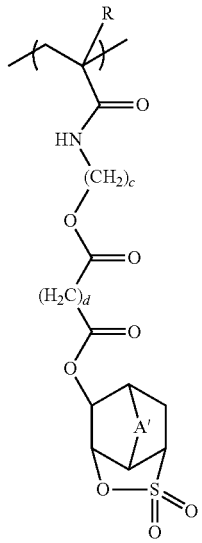

In the formulas, R and A' are the same as defined above; c and d are the same as defined above for a' and b', respectively; and f represents an integer of 1 to 5 (and preferably an integer of 1 to 3).

Specific examples of the structural units represented by general formulas (a0-0-11) and (a0-0-12) are shown below.

In the formulas shown below, $R^\alpha$ represents a hydrogen atom, a methyl group or a trifluoromethyl group.

[Chemical Formula 12]

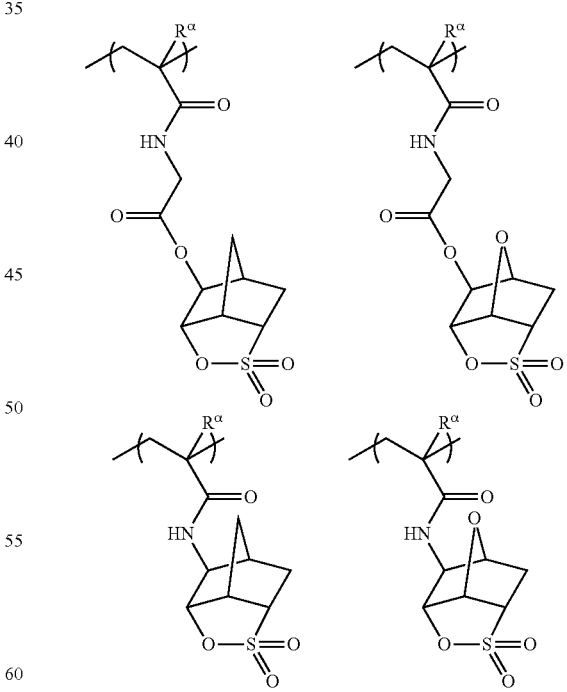

The structural unit (a0) contained within the component (A1)) may be either a single type of structural unit or a combination of two or more types of structural units.

In the component (A1), the amount of the structural unit (a0) based on the combined total of all structural units constituting the component (A1) is preferably less than 50 mol %, more preferably less than 48 mol %, still more preferably 1 to 45 mol %, and most preferably 10 to 40 mol %.

By making the amount of the structural unit (a0) no more than the upper limit of the above-mentioned range, the solubility of the component (A1) in an organic solvent (e.g., the component (S) described later) can be improved. On the other hand, when the amount of the structural unit (a0) is at least as large as the lower limit of the above range, a pattern can be formed easily using a resist composition prepared from the component (A1), and the lithography properties such as the resolution and LWR as well as the resist pattern shape can be improved further.

[Structural Unit (a1)]

The structural unit (a1) is a structural unit containing an acid decomposable group that exhibits increased polarity by the action of acid.

The term "acid decomposable group" refers to a group exhibiting acid decomposability in which at least a part of the bond within the structure of this acid decomposable group may be cleaved by the action of acid generated from the component (B) upon exposure.

Examples of acid decomposable groups that exhibit increased polarity by the action of an acid include groups which are decomposed by the action of an acid to form a polar group.

Examples of the polar group include a carboxyl group, a hydroxyl group, an amino group and a sulfo group (—$SO_3H$). Among these groups, polar groups that contain an —OH within the structure (hereinafter also referred to as "OH-containing polar groups") are preferred, a carboxyl group or a hydroxyl group is more preferred, and a carboxyl group is particularly desirable.

More specific examples of the acid decomposable groups include groups in which the aforementioned polar group is protected with an acid dissociable group (such as groups in which the hydrogen atom of an OH-containing polar group is protected with an acid dissociable group).

An "acid dissociable group" is a group exhibiting acid dissociability in which at least the bond between the acid dissociable group and the atom adjacent to this acid dissociable group may be cleaved by the action of acid generated from the component (B) upon exposure. It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. Increasing the polarity causes a relative change in the solubility within a developing solution, and the solubility increases when the developing solution is an alkali developing solution, whereas the solubility decreases when the developing solution is a developing solution containing an organic solvent (organic developing solution).

There are no particular limitations on the acid dissociable group, and any of the groups that have been proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

Here, the term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of the aliphatic branched, acid dissociable group include groups represented by the formula —$C(R^{71})(R^{72})(R^{73})$. In this formula, each of $R^{71}$ to $R^{73}$ independently represents a linear alkyl group of 1 to 5 carbon atoms. The group represented by the formula —$C(R^{71})(R^{72})(R^{73})$ preferably has 4 to 8 carbon atoms, and specific examples include a tert-butyl group, a 2-methyl-2-butyl group, a 2-methyl-2-pentyl group and a 3-methyl-3-pentyl group.

Among these, a tert-butyl group is particularly desirable.

The term "aliphatic cyclic group" refers to a monocyclic group or polycyclic group that has no aromaticity.

The aliphatic cyclic group within the "acid dissociable groups containing an aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the "aliphatic cyclic group" exclusive of substituents is not limited to structures constituted from only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group may be either a monocyclic group or a polycyclic group.

The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, in these aliphatic cyclic hydrocarbon groups, part of the carbon atoms constituting the ring may be replaced with an ether group (—O—).

Examples of acid dissociable groups containing an aliphatic cyclic group include (i) a group which forms a tertiary carbon atom on the ring structure of a monovalent aliphatic cyclic group in which a substituent (a group or an atom other than hydrogen) is bonded to the carbon atom to which an atom adjacent to the acid dissociable group (e.g., "—O—" within "—C(=O)—O— group") is bonded (hereafter, sometimes referred to as a "group which has a tertiary carbon atom on the ring structure of a cyclic alkyl group"); and (ii) a group which have a monovalent aliphatic cyclic group, and a branched alkylene group containing a tertiary carbon atom that is bonded to the monovalent aliphatic cyclic group.

In a group of type (i) described above, as the substituent bonded to the carbon atom to which an atom adjacent to the acid dissociable group is bonded on the ring skeleton of the aliphatic cyclic group, an alkyl group can be mentioned. Examples of these alkyl groups include the same groups as those described later fore in formulas (1-1) to (1-9).

Specific examples of groups of type (i) include groups represented by general formulas (1-1) to (1-9) shown below.

Specific examples of groups of type (ii) include groups represented by general formulas (2-1) to (2-6) shown below.

[Chemical Formula 13]

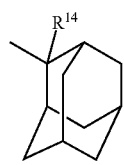
(1-1)

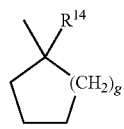
(1-2)

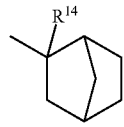
(1-3)

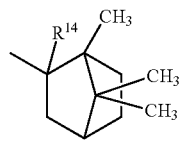
(1-4)

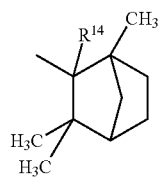
(1-5)

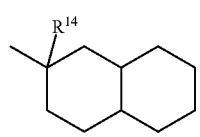
(1-6)

-continued

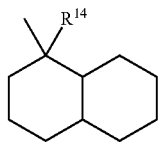
(1-7)

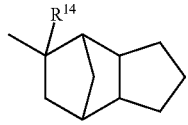
(1-8)

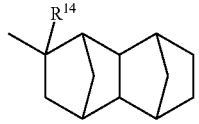
(1-9)

In the formulas above, $R^{14}$ represents an alkyl group; and g represents an integer of 0 to 8.

[Chemical Formula 14]

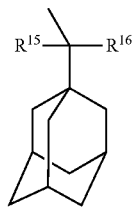
(2-1)

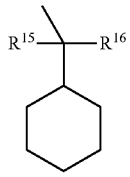
(2-2)

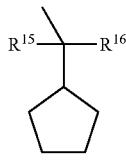
(2-3)

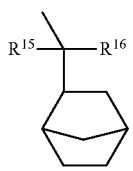
(2-4)

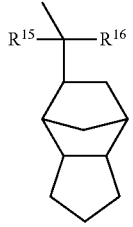
(2-5)

-continued (2-6)

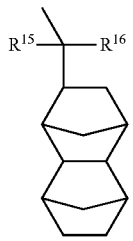

In the formulas above, each of $R^{15}$ and $R^{16}$ independently represents an alkyl group.

In formulas (1-1) to (1-9), the alkyl group represented by $R^{14}$ may be a linear, branched or cyclic group, and is preferably a linear or branched alkyl group.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably an integer of 1 to 3, and still more preferably 1 or 2.

In formulas (2-1) to (2-6), examples of the alkyl group for $R^{15}$ and $R^{16}$ include the same alkyl groups as those described above for $R^{14}$.

In formulas (1-1) to (1-9) and formulas (2-1) to (2-6), a portion of the carbon atoms that constitute the ring(s) may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxyl group, so as to be bonded with an oxygen atom. When acid is generated upon exposure, the generated acid acts to break the bond between the acetal-type acid dissociable group and the oxygen atom to which the acetal-type, acid dissociable group is bonded, thereby forming an OH-containing polar group such as a carboxyl group or a hydroxyl group.

Examples of acetal-type acid dissociable groups include groups represented by general formula (p1) shown below.

[Chemical Formula 15]

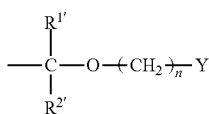
(p1)

In the formula, each of $R^{1'}$ and $R^{2'}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In formula (p1), n is preferably an integer of 0 to 2, more preferably 0 or 1, and most preferably 0.

Examples of the alkyl group for $R^{1'}$ and $R^{2'}$ include the same alkyl groups as those described below, within the description relating to the α-substituted acrylate ester, for the substituent which may be bonded to the carbon atom on the α-position. Among these, a methyl group or ethyl group is preferable, and a methyl group is the most desirable.

In the present invention, it is preferable that at least one of $R^{1'}$ and $R^{2'}$ be a hydrogen atom. That is, it is preferable that the acid dissociable group (p1) is a group represented by general formula (p1-1) shown below.

[Chemical Formula 16]

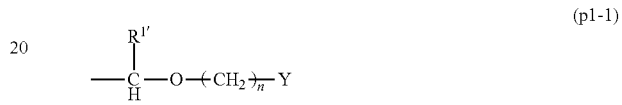
(p1-1)

In the formula, $R^{1'}$, n and Y are the same as defined above.

Examples of the alkyl group for Y include the same alkyl groups as those described below, within the description relating to the α-substituted acrylate ester, for the substituent which may be bonded to the carbon atom on the α-position.

As the aliphatic cyclic group for Y, any of the aliphatic monocyclic/polycyclic groups which have been proposed for conventional ArF resists and the like can be appropriately selected for use. For example, the same aliphatic cyclic groups as those described above in connection with the "acid dissociable group containing an aliphatic cyclic group" can be used.

Further, as the acetal-type, acid dissociable group, groups represented by general formula (p2) shown below can also be used.

[Chemical Formula 17]

(p2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein $R^{17}$ and $R^{19}$ are bonded to each other to form a ring.

The alkyl group for $R^{17}$ and $R^{18}$ preferably has 1 to 15 carbon atoms, and may be either linear or branched. As the alkyl group, an ethyl group or methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Further, in the above formula (p2), each of $R^{17}$ and $R^{19}$ may independently represent a linear or branched alkylene group (preferably an alkylene group of 1 to 5 carbon atoms), wherein $R^{19}$ and $R^{17}$ may be bonded to each other.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

In the resist composition of the present invention, examples of the structural unit (a1) include a structural unit (a11) derived from an acrylate ester which may have the hydrogen atom bonded to the carbon atom on the α-position substituted with a substituent and contains an acid decomposable group which exhibits increased polarity by the action of acid; a structural unit (a12) derived from a hydroxystyrene or hydroxystyrene derivative and having at least part of the hydrogen atoms in the hydroxyl group of the structural unit has been protected with a substituent containing an acid decomposable group; and a structural unit (a13) derived from a vinylbenzoic acid or vinylbenzoic acid derivative and having at least part of the hydrogen atom in the —C(=O)—OH group of the structural unit is protected with a substituent containing an acid decomposable group.

In the present descriptions and the claims, the term "structural unit derived from an acrylate ester" refers to a structural unit which is formed by the cleavage of the ethylenic double bond of an acrylate ester.

An "acrylate ester" refers to a compound in which the hydrogen atom at the carboxyl group terminal of acrylic acid ($CH_2$=CH—COOH) has been substituted with an organic group.

The acrylate ester may have the hydrogen atom bonded to the carbon atom on the α-position substituted with a substituent. The substituent for substituting the hydrogen atom bonded to the carbon atom on the α-position is an atom or group other than a hydrogen atom, and examples thereof include an alkyl group of 1 to 5 carbon atoms, a halogenated alkyl group of 1 to 5 carbon atoms and a hydroxyalkyl group of 1 to 5 carbon atoms. A carbon atom on the α-position of an acrylate ester refers to the carbon atom having the carbonyl group bonded thereto, unless specified otherwise.

Hereafter, an acrylate ester in which the hydrogen atom bonded to the carbon atom on the α-position has been substituted with a substituent is sometimes referred to as an "α-substituted acrylate ester". Further, the generic term "(α-substituted) acrylate ester" may be used to describe both the acrylate ester and the α-substituted acrylate ester.

With respect to the α-substituted acrylate esters, the alkyl group as a substituent on the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Further, specific examples of the halogenated alkyl group as a substituent on the α-position include groups in which some or all of the hydrogen atoms of the aforementioned "alkyl group as a substituent on the α-position" have been substituted with halogen atoms. Examples of the halogen atom include a fluorine atom, a chlorine atom, a bromine atom and an iodine atom, and a fluorine atom is particularly desirable.

Further, specific examples of the hydroxyalkyl group as a substituent on the α-position include groups in which some or all of the hydrogen atoms of the aforementioned "alkyl group as a substituent on the α-position" have been substituted with hydroxyl groups.

It is preferable that a hydrogen atom, an alkyl group of 1 to 5 carbon atoms or a halogenated alkyl group of 1 to 5 carbon atoms is bonded to the α-position of the α-substituted acrylate esters, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

The expression "structural unit derived from a hydroxystyrene or hydroxystyrene derivative" refers to a structural unit that is formed by the cleavage of the ethylenic double bond of a hydroxystyrene or hydroxystyrene derivative.

The term "hydroxystyrene derivative" is a generic term that includes both the compounds in which the α-position hydrogen atom of a hydroxystyrene has been substituted with another substituent, such as an alkyl group or a halogenated alkyl group, as well as the derivatives thereof. Furthermore, unless stated otherwise, the α-position (the carbon atom on the α-position) refers to the carbon atom having the benzene ring bonded thereto.

The expression "structural unit derived from a vinylbenzoic acid or vinylbenzoic acid derivative" refers to a structural unit that is formed by the cleavage of the ethylenic double bond of a vinylbenzoic acid or vinylbenzoic acid derivative.

The term "vinylbenzoic acid derivative" is a generic term that includes both the compounds in which the α-position hydrogen atom of a vinylbenzoic acid has been substituted with another substituent, such as an alkyl group or a halogenated alkyl group, as well as the derivatives thereof. Furthermore, unless stated otherwise, the α-position (the carbon atom on the α-position) refers to the carbon atom having the benzene ring bonded thereto.

The structural units (a11), (a12) and (a13) will be described below.

(Structural Unit (a11))

Specific examples of the structural unit (a11) include structural units represented by a general formula (a11-0-1) shown below and structural units represented by a general formula (a11-0-2) shown below.

[Chemical Formula 18]

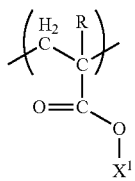
(a11-0-1)

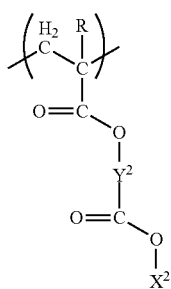
(a11-0-2)

In the formulas, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In the general formula (a11-0-1), examples of the alkyl group and the halogenated alkyl group for R include the same alkyl groups and halogenated alkyl groups as those described above for the alkyl group and the halogenated alkyl group for the substituent which may be bonded to the carbon atom on the α-position within the description relating to the α-substituted acrylate ester. R is preferably a hydrogen atom, an alkyl group of 1 to 5 carbon atoms or a fluorinated alkyl group of 1 to 5 carbon atoms, and is most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a11-0-2), R is the same as defined above.

$X^2$ is the same as defined for $X^1$ in general formula (a11-0-1).

Although there are no particular limitations on the divalent linking group for $Y^2$, preferred examples include divalent hydrocarbon groups which may have a substituent, and divalent linking groups containing a hetero atom.

The description that the hydrocarbon group "may have a substituent" means that part or all of the hydrogen atoms within the hydrocarbon group may each be substituted with a substituent (an atom other than a hydrogen atom or a group).

The hydrocarbon group may be either an aliphatic hydrocarbon group or an aromatic hydrocarbon group.

An "aliphatic hydrocarbon group" refers to a hydrocarbon group that has no aromaticity.

The aliphatic hydrocarbon group as the divalent hydrocarbon group for $Y^2$ described above may be either saturated or unsaturated. In general, the aliphatic hydrocarbon group is preferably saturated.

Specific examples of the aliphatic hydrocarbon group include a linear or branched aliphatic hydrocarbon group, and an aliphatic hydrocarbon group that includes a ring within the structure.

The linear or branched aliphatic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

Examples of the aliphatic hydrocarbon group that includes a ring within the structure include alicyclic hydrocarbon groups (groups in which two hydrogen atoms have been removed from an aliphatic hydrocarbon ring), groups in which an alicyclic hydrocarbon group is bonded to the terminal of a linear or branched aliphatic hydrocarbon group, and groups in which an alicyclic hydrocarbon group is interposed within the chain of a linear or branched aliphatic hydrocarbon group. Examples of the linear or branched aliphatic hydrocarbon group include the same groups as those mentioned above.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which two hydrogen atoms have been removed from a monocycloalkane is preferred. The monocycloalkane preferably contains 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group as the divalent hydrocarbon group for $Y^2$ described above preferably has 5 to 30 carbon atoms, more preferably 5 to 20 carbon atoms, still more preferably 6 to 15 carbon atoms, and most preferably 6 to 10 carbon atoms. This number of carbon atoms does not include any carbon atoms within any substituents. Specific examples of the aromatic ring within the aromatic hydrocarbon group include aromatic hydrocarbon rings such as benzene, biphenyl, fluorene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom.

Specific examples of the aromatic hydrocarbon group include groups in which two hydrogen atoms have been removed from the aforementioned aromatic hydrocarbon ring (namely, arylene groups), and groups in which one of the hydrogen atoms of a group having one hydrogen atom removed from the aforementioned aromatic hydrocarbon ring (namely, an aryl group) has been substituted with an alkylene group (for example, groups in which one hydrogen atom has been further removed from the aryl group within an arylalkyl group, such as a benzyl group, a phenethyl group, a 1-naphthylmethyl group, a 2-naphthylmethyl group, a 1-naphthylethyl group or a 2-naphthylethyl group). The alkylene group (the alkyl chain within the arylalkyl group) preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring of an aforementioned aromatic hydrocarbon group may be substituted with a substituent. Examples of the substituent include an alkyl group, an alkoxy group, a halogen atom, a halogenated alkyl group, a hydroxyl group and an oxygen atom (=O).

The alkyl group for the substituent is preferably an alkyl group of 1 to 5 carbon atoms, and is most preferably a methyl group, an ethyl group, a propyl group, an n-butyl group or a tert-butyl group.

The alkoxy group as the substituent is preferably an alkoxy group of 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms of an aforementioned alkyl group have each been substituted with an aforementioned halogen atom.

Examples of the hetero atom in the "divalent linking group containing a hetero atom" for $Y^2$ described above include atoms other than a carbon atom or hydrogen atom, and specific examples thereof include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH— (H may be substituted with a substituent such as an alkyl group, an acyl group or the like), —S—, —S(=O)$_2$—, —S(=O)$_2$—O—, —NH—C(=O)—, =N—, groups represented by general formula —$Y^{21}$—O—$Y^{22}$—, —[$Y^{21}$—C(=O)—O]$_{m'}$—$Y^{22}$— or —$Y^{21}$—O—C(=O)—$Y^{22}$— [in the formulas, each of $Y^{21}$ and $Y^{22}$ independently represents a divalent hydrocarbon group which may have a substituent, O represents an oxygen atom, and m' represents an integer of 0 to 3].

When $Y^2$ represents —NH—, this H may be substituted with a substituent such as an alkyl group or an acyl group. The substituent (an alkyl group, an acyl group or the like) preferably has 1 to 10 carbon atoms, more preferably 1 to 8 carbon atoms, and most preferably 1 to 5 carbon atoms.

In the formulas —$Y^{21}$—O—$Y^{22}$—, —[$Y^{21}$—C(=O)—O]$_{m'}$—$Y^{22}$— and —$Y^{21}$—O—C(=O)—$Y^{22}$—, each of $Y^{21}$ and $Y^{22}$ independently represents a divalent hydrocarbon group which may have a substituent. Examples of the divalent hydrocarbon groups include the same groups as those described above for the "divalent hydrocarbon group which may have a substituent" for $Y^2$.

$Y^{21}$ is preferably a linear aliphatic hydrocarbon group, more preferably a linear alkylene group, still more preferably a linear alkylene group of 1 to 5 carbon atoms, and most preferably a methylene group or an ethylene group.

$Y^{22}$ is preferably a linear or branched aliphatic hydrocarbon group, and is more preferably a methylene group, an ethylene group or an alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by formula —[$Y^{21}$—C(=O)—O]$_{m'}$—$Y^{22}$—, m' represents an integer of 0 to 3, and is preferably an integer of 0 to 2, more preferably 0 or 1, and most preferably 1. In other words, the group represented by formula —[$Y^{21}$—C(=O)—O]$_{m'}$—$Y^{22}$— is most preferably a group represented by a formula —$Y^{21}$—C(=O)—O—$Y^{22}$—. Among such groups, groups represented by —(CH$_2$)$_{a'}$—C(=O)—O—(CH$_2$)$_{b'}$— are particularly preferred. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking groups containing a hetero atom, linear groups containing an oxygen atom as a hetero atom, e.g., groups containing an ether bond or ester bond are preferred, and groups represented by the above formula —$Y^{21}$—O—$Y^{22}$—, —[$Y^{21}$—C(=O)—O]$_{m'}$—$Y^{22}$— or —$Y^{21}$—O—C(=O)—$Y^{22}$— are more preferred.

Of the various possibilities described above, as the divalent linking group for $Y^2$, a linear or branched alkylene group, a divalent alicyclic hydrocarbon group or a divalent linking group containing a hetero atom is particularly desirable. Among these, a linear or branched alkylene group or a divalent linking group containing a hetero atom is more preferable.

Specific examples of the structural unit (a11) include structural units represented by general formulas (a1-1) to (a1-4) shown below.

[Chemical Formula 19]

(a1-1)

-continued (a1-2)

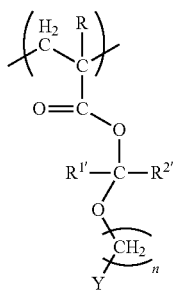

(a1-3)

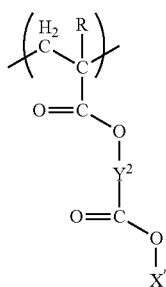

(a1-4)

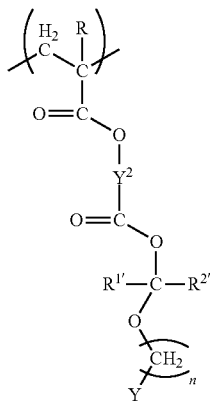

In the formulas, R, $R^{1'}$, $R^{2'}$, n, Y and $Y^2$ are each the same as defined above, and X' represents a tertiary alkyl ester-type acid dissociable group.

In the above formulas, examples of X' include the same tertiary alkyl ester-type acid dissociable groups as those described above.

$R^{1'}$, $R^{2'}$, n and Y are the same as defined above for $R^{1'}$, $R^{2'}$, n and Y respectively in general formula (p1) within the description relating to the "acetal-type acid dissociable group".

Examples of $Y^2$ include the same groups as those described above for $Y^2$ in general formula (a11-0-2).

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 20]

(a1-1-1)

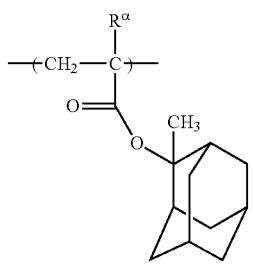

(a1-1-2)

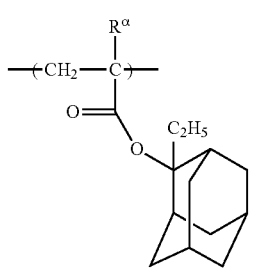

(a1-1-3)

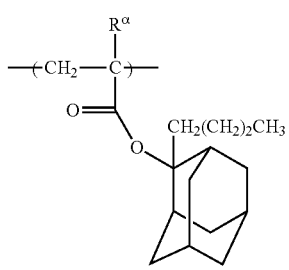

(a1-1-4)

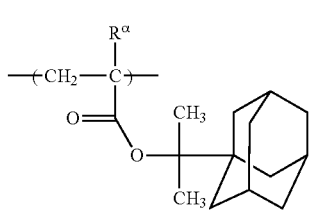

(a1-1-5)

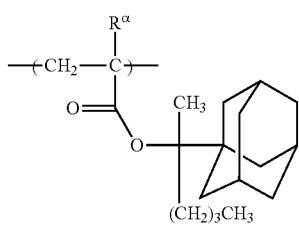

(a1-1-6)

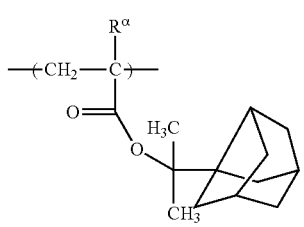

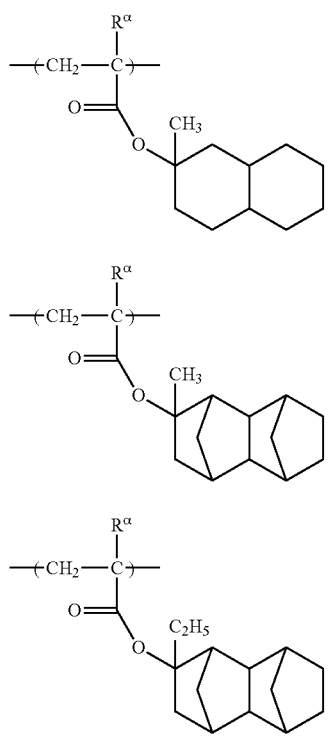
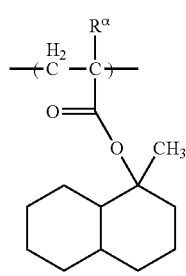
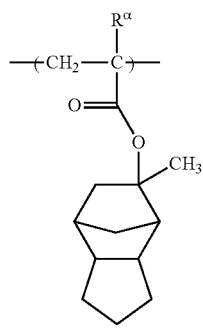
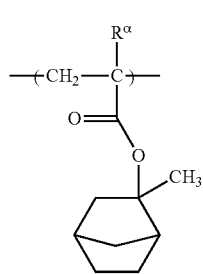
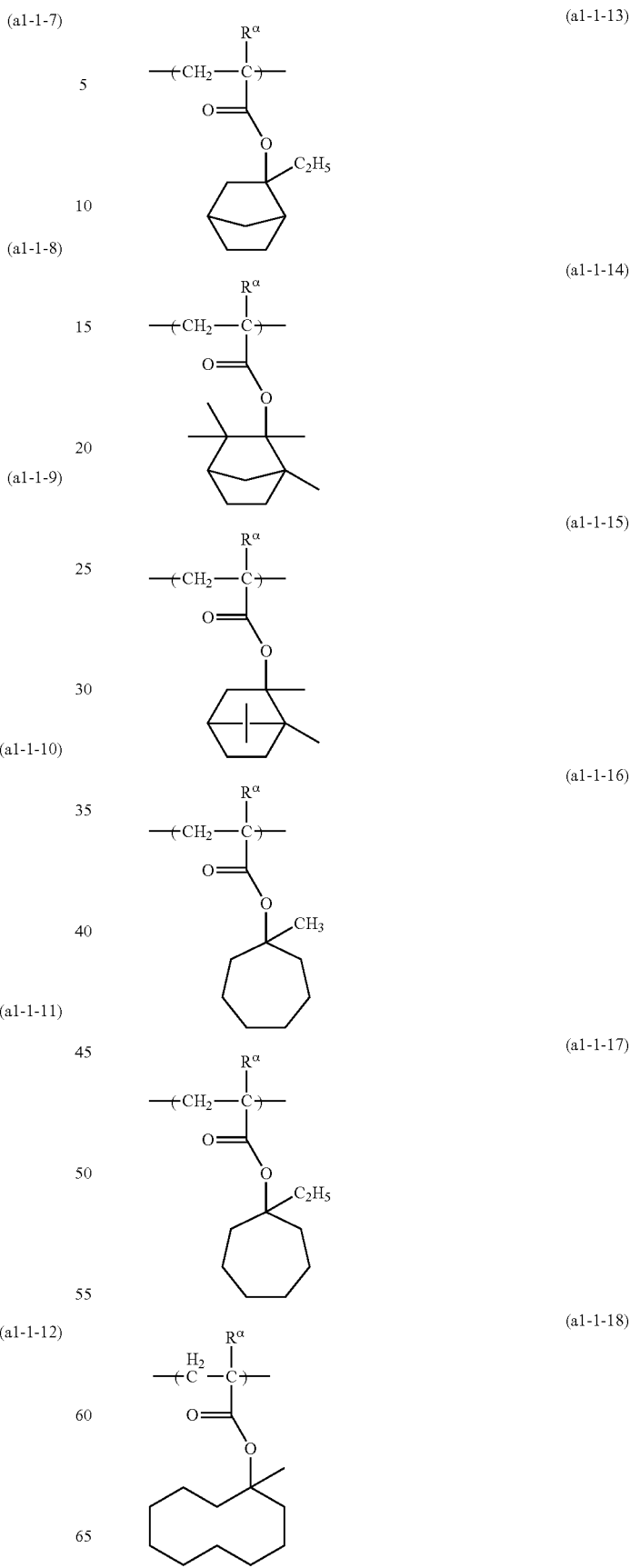

(a1-1-19) 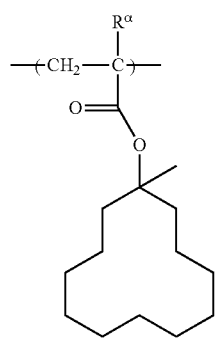
(a1-1-20) 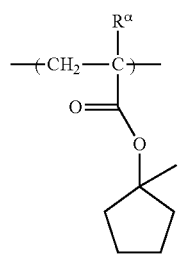
(a1-1-21) 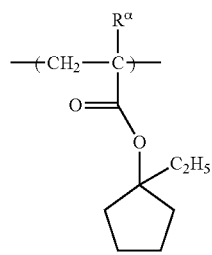
[Chemical Formula 22]
(a1-1-22) 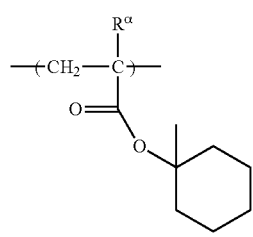
(a1-1-23) 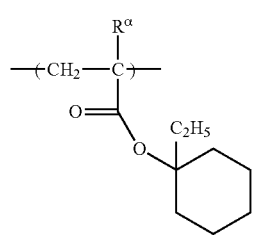
(a1-1-24) 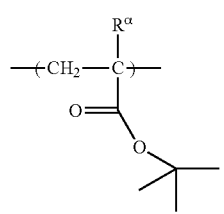
(a1-1-25) 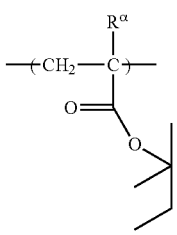
(a1-1-26) 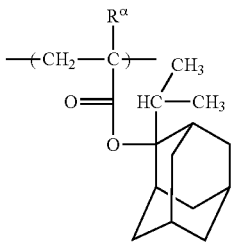
(a1-1-27) 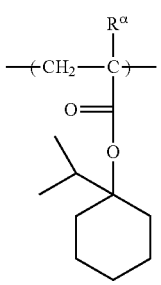
(a1-1-28) 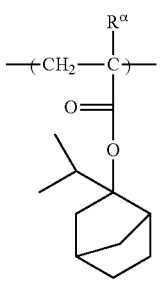
(a1-1-29) 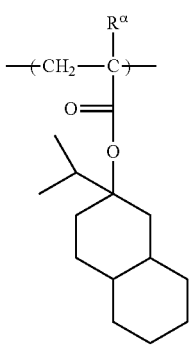

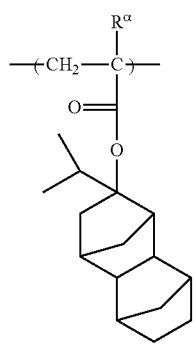
(a1-1-30)
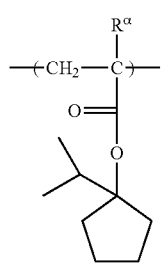
(a1-1-31)
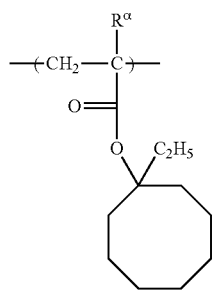
(a1-1-32)
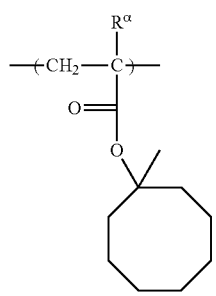
(a1-1-33)
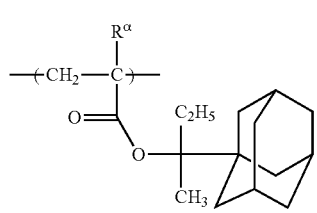
(a1-1-34)
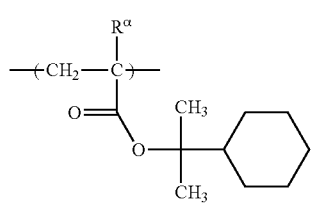
(a1-1-35)
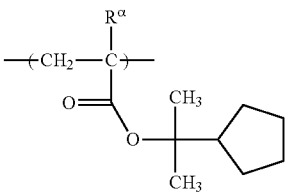
(a1-1-36)
[Chemical Formula 23]
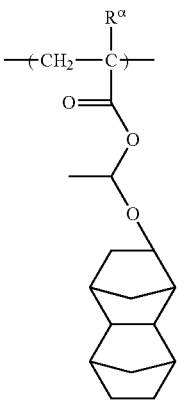
(a1-2-1)
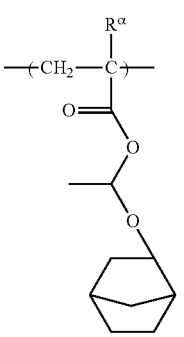
(a1-2-2)
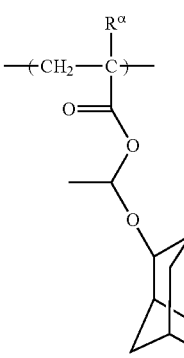
(a1-2-3)

(a1-2-4)
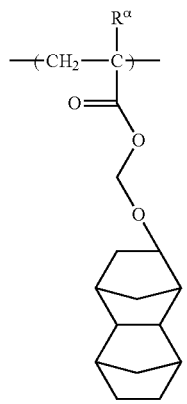
(a1-2-5)
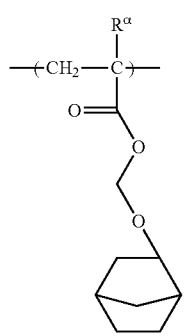
(a1-2-6)
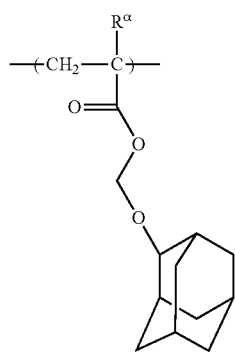
(a1-2-7)
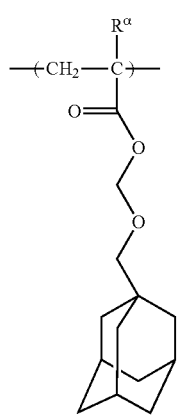
(a1-2-8)
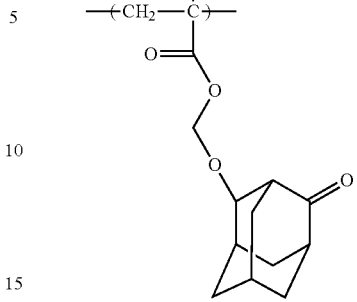
(a1-2-9)
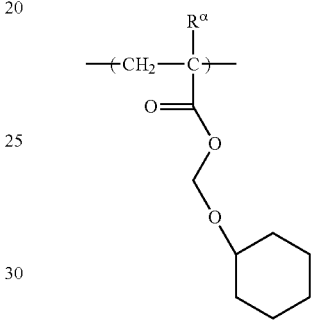
(a1-2-10)
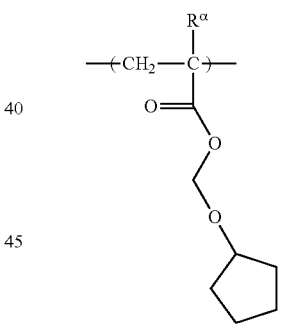
(a1-2-11)
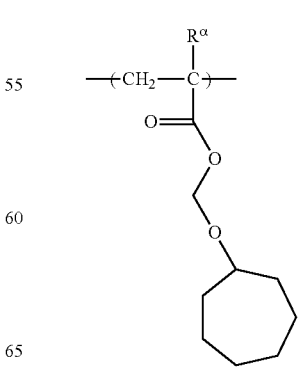

(a1-2-12)
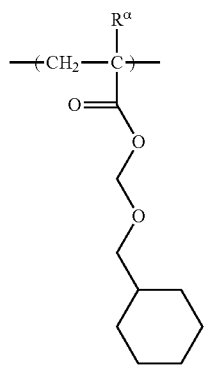
(a1-2-13)
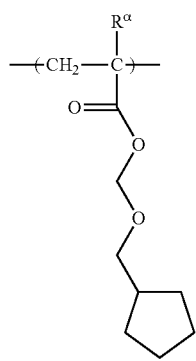
(a1-2-14)
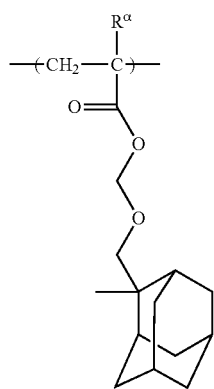
(a1-2-15)
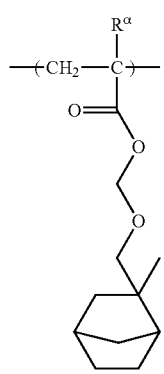
(a1-2-16)
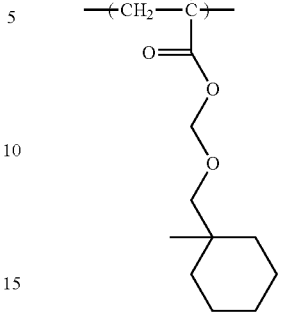
(a1-2-17)
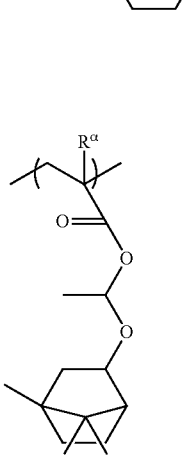
(a1-2-18)
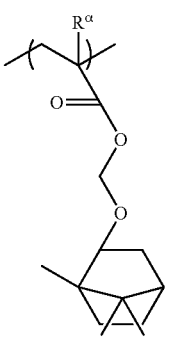
(a1-2-19)
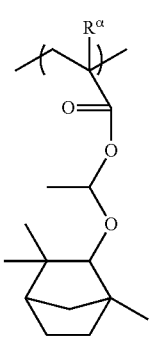

(a1-2-20)
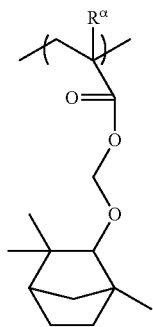
(a1-2-21)
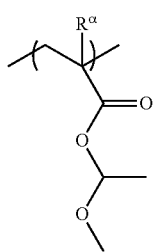
(a1-2-22)
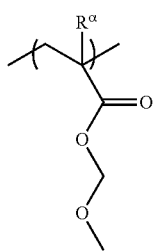
(a1-2-23)
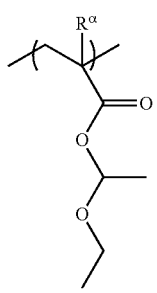
(a1-2-24)
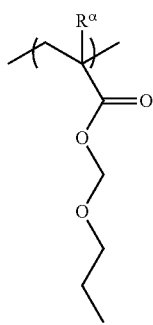
[Chemical Formula 24]
(a1-3-1)
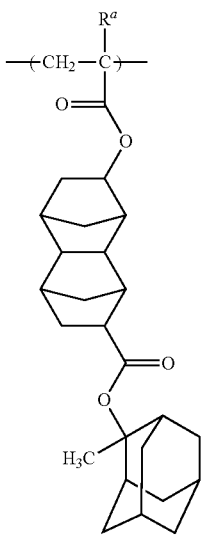
(a1-3-2)
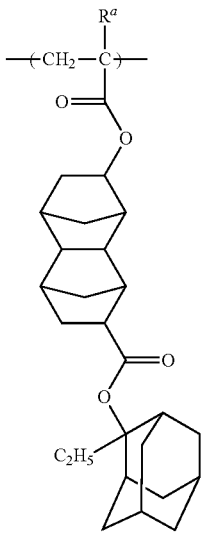
(a1-3-3)
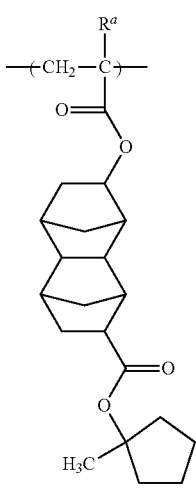

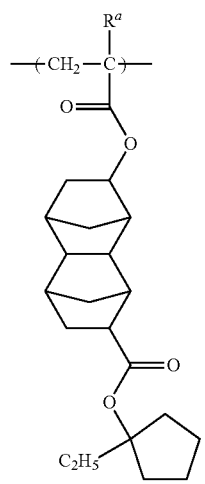
(a1-3-4)
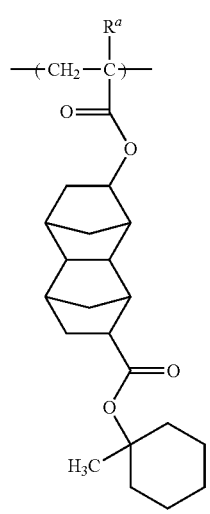
(a1-3-5)
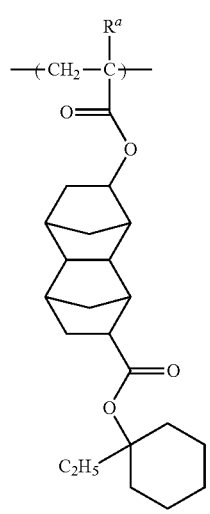
(a1-3-6)
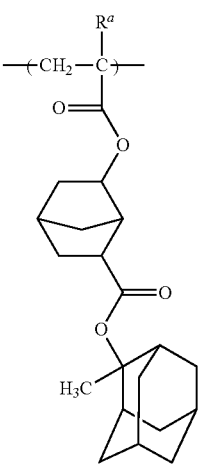
(a1-3-7)
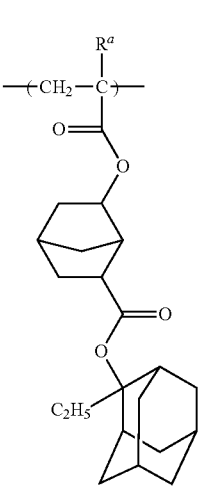
(a1-3-8)
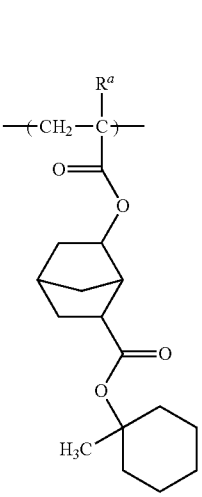
(a1-3-9)

(a1-3-10) 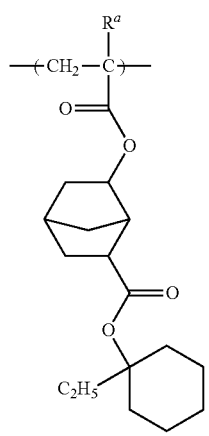
(a1-3-11) 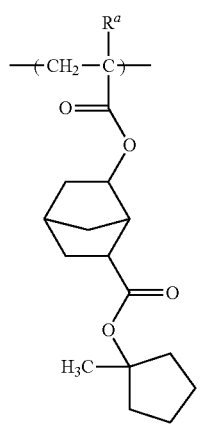
(a1-3-12) 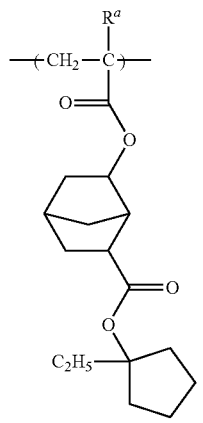
(a1-3-13) 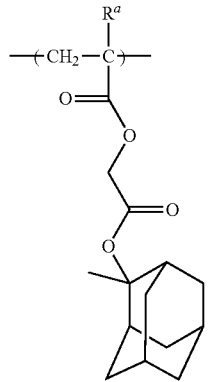
(a1-3-14) 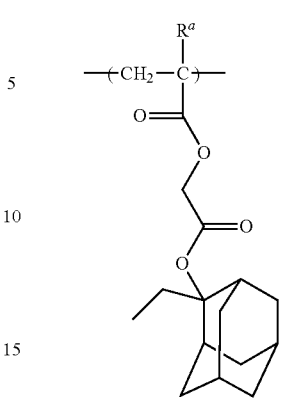
(a1-3-15) 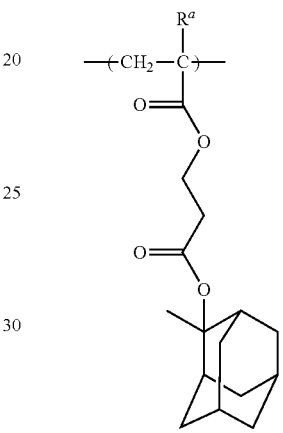
(a1-3-16) 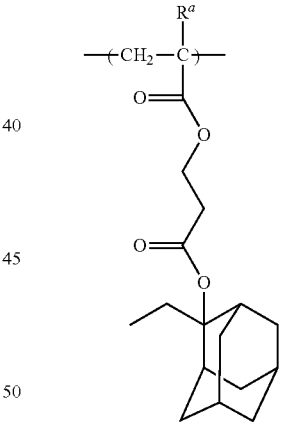
(a1-3-17) 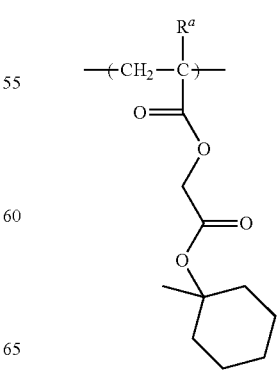

(a1-3-18)
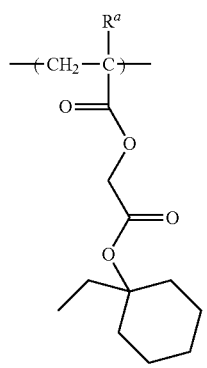
[Chemical Formula 25]
(a1-3-19)
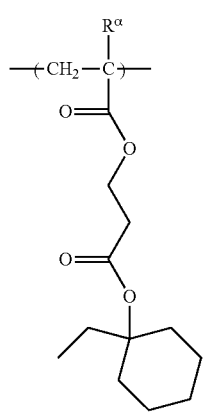
(a1-3-20)
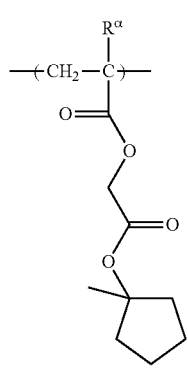
(a1-3-21)
(a1-3-22)
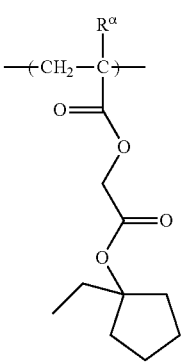
(a1-3-23)
(a1-3-24)

[Chemical Formula 26]
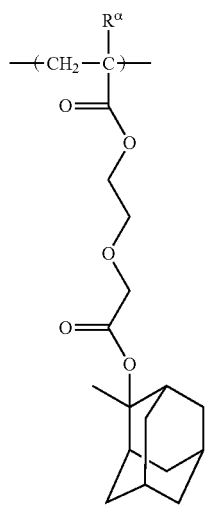
(a1-3-25)
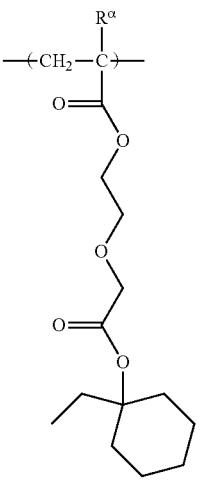
(a1-3-28)
(a1-3-26)
(a1-3-29)
(a1-3-27)
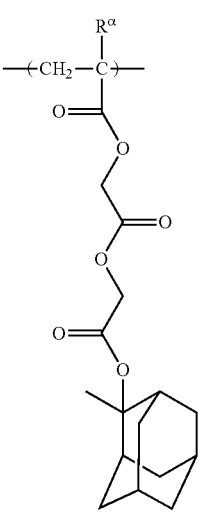
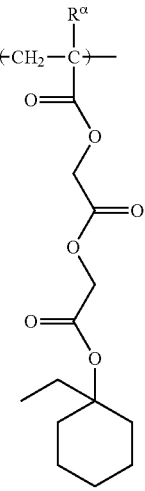
(a1-3-30)

(a1-3-31)
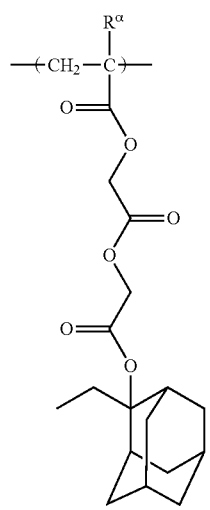
(a1-3-32)
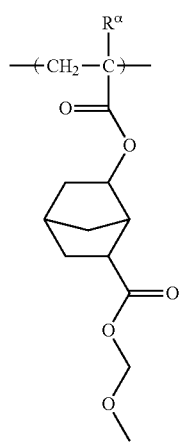
[Chemical Formula 27]
(a1-4-1)
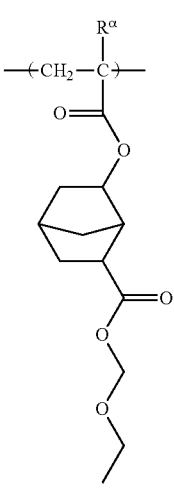
(a1-4-2)
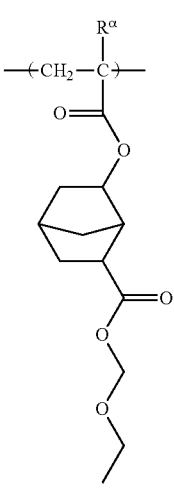
(a1-4-3)
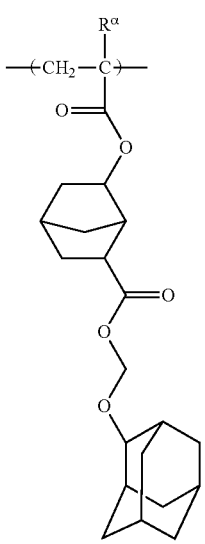
(a1-4-4)
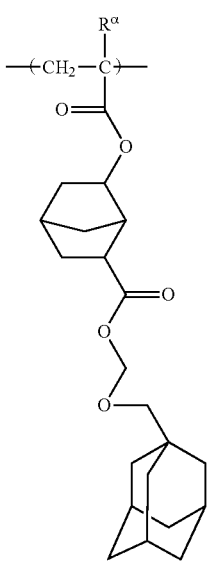

(a1-4-5)
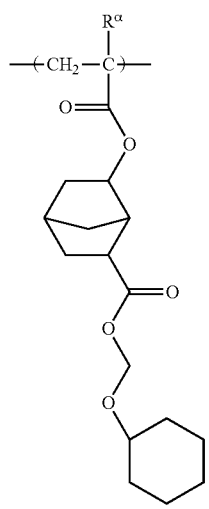
(a1-4-6)
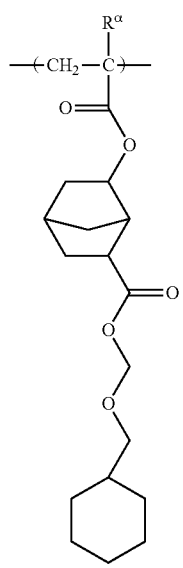
(a1-4-7)
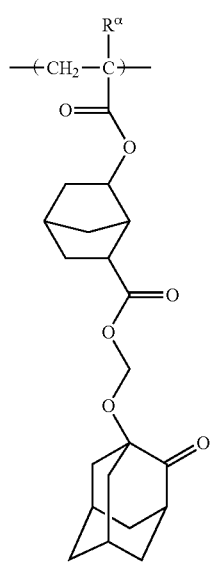
(a1-4-8)
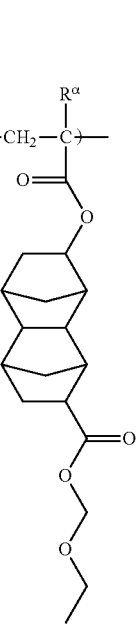
(a1-4-9)
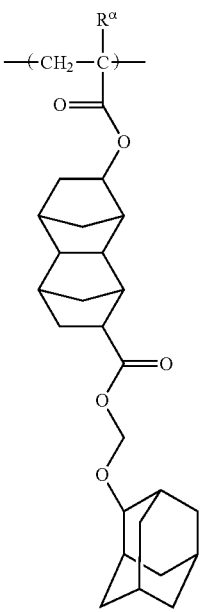

(a1-4-10)
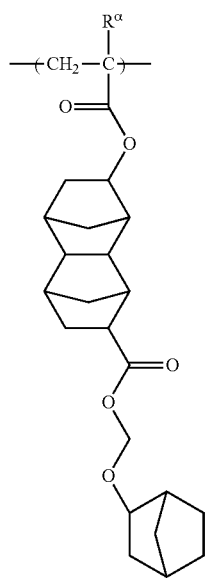
(a1-4-11)
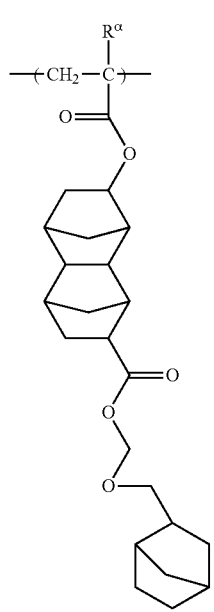
(a1-4-12)
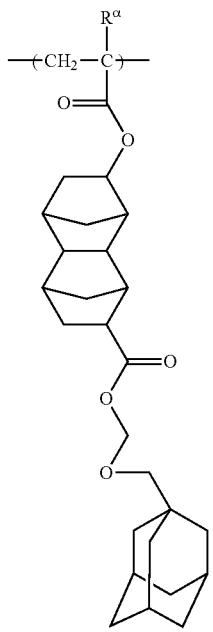
(a1-4-13)
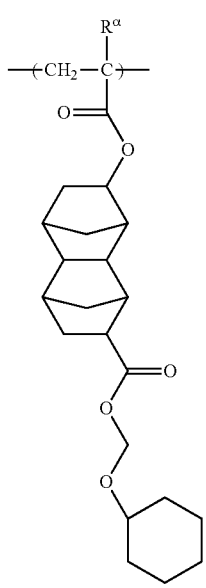

-continued (a1-4-14)

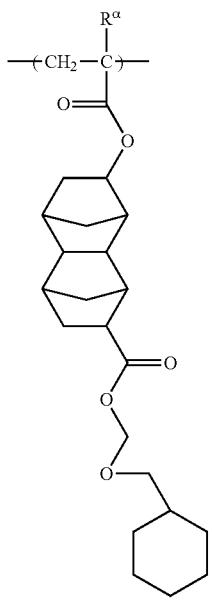

(a1-4-15)

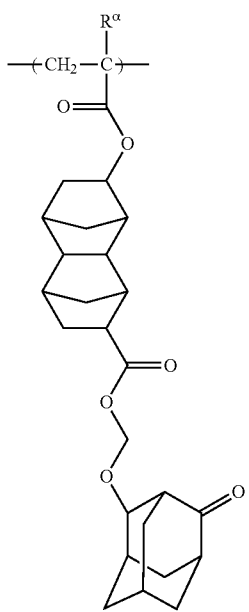

units represented by general formula (a11-0-14) shown below, and structural units represented by general formula (a11-0-15) shown below.

[Chemical Formula 28]

(a11-0-11)

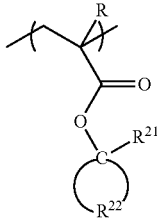

(a11-0-12)

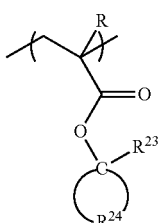

(a11-0-13)

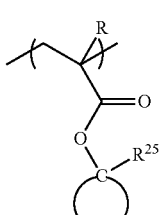

(a11-0-14)

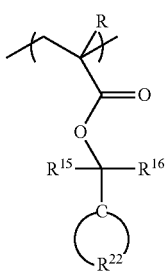

(a11-0-15)

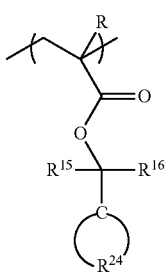

The present invention preferably includes, as the structural unit (a11), at least one structural unit selected from the group consisting of structural units represented by general formula (a11-0-11) shown below, structural units represented by general formula (a11-0-12) shown below, structural units represented by general formula (a11-0-13) shown below, structural units represented by general formula (a11-0-14) shown below, structural units represented by general formula (a11-0-15) shown below, and structural units represented by general formula (a11-0-2) shown below.

Among these structural units, it is more preferable to include at least one structural unit selected from the group consisting of structural units represented by general formula (a11-0-11) shown below, structural units represented by general formula (a11-0-12) shown below, structural units represented by general formula (a11-0-13) shown below, structural

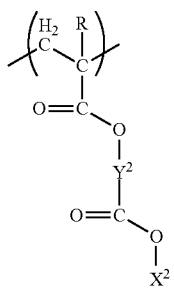

(a11-0-2)

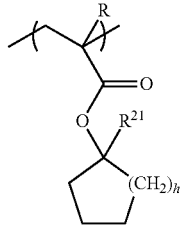

(a11-1-02)

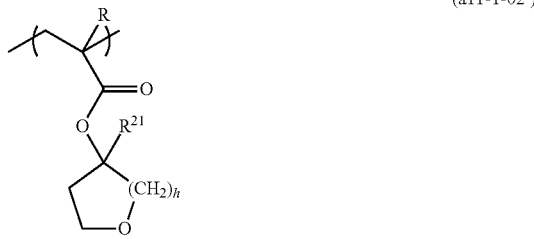

(a11-1-02')

In the formulas, R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocyclic group with the carbon atom to which this $R^{22}$ group is bonded; $R^{23}$ represents a branched alkyl group; $R^{24}$ represents a group which forms an aliphatic polycyclic group with the carbon atom to which this $R^{24}$ group is bonded; $R^{25}$ represents a linear alkyl group of 1 to 5 carbon atoms; each of $R^{15}$ and $R^{16}$ independently represents an alkyl group; $Y^2$ represents a divalent linking group; and $X^2$ represents an acid dissociable group.

In each of the above formulas, R, $Y^2$ and $X^2$ are the same as defined above.

In formula (a11-0-11), examples of the alkyl group for $R^{21}$ include the same alkyl groups as those described above for $R^{14}$ in the formulas (1-1) to (1-9), and a methyl group, an ethyl group or an isopropyl group is preferred.

In terms of $R^{22}$, examples of the aliphatic monocyclic group that is formed together with the carbon atom to which $R^{22}$ is bonded include the monocyclic groups among the aliphatic cyclic groups described above in connection with the tertiary alkyl ester-type acid dissociable groups. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

A portion of the carbon atoms that constitute the ring of the monocycloalkane may or may not be substituted with an ether group (—O—).

Further, the monocycloalkane may include an alkyl group of 1 to 5 carbon atoms, a fluorine atom, or a fluorinated alkyl group of 1 to 5 carbon atoms as a substituent.

Examples of the $R^{22}$ group that constitutes the aliphatic monocyclic group include linear alkylene groups which may have an ether group (—O—) interposed between the carbon atoms.

Specific examples of the structural units represented by formula (a11-0-11) include structural units represented by the above formulas (a1-1-16) to (a1-1-23), (a1-1-27) and (a1-1-31). Among these, structural units represented by general formula (a11-1-02) shown below, which includes the structural units represented by formulas (a1-1-16) and (a1-1-17), formulas (a1-1-20) to (a1-1-23), and formulas (a1-1-27), (a1-1-31), (a1-1-32) and (a1-1-33) are preferred. Furthermore, structural units represented by general formula (a11-1-02') shown below are also preferred.

In each of the formulas below, h represents an integer of 1 to 4, and is preferably 1 or 2.

[Chemical Formula 29]

In the formulas, R and $R^{21}$ are each the same as defined above, and h represents an integer of 1 to 4.

In formula (a11-0-12), examples of the branched alkyl group for $R^{23}$ include the same branched alkyl groups as those described above for the alkyl group for $R^{14}$ in the formulas (1-1) to (1-9), and an isopropyl group is particularly desirable.

Examples of the aliphatic polycyclic group formed by $R^{24}$ together with the carbon atom to which $R^{24}$ is bonded include the same polycyclic groups as those among the aliphatic cyclic groups described above in connection with the tertiary alkyl ester-type acid dissociable groups.

Specific examples of structural units represented by general formula (a11-0-12) include the structural units represented by the above formula (a1-1-26) and formulas (a1-1-28) to (a1-1-30).

The structural unit represented by formula (a11-0-12) is preferably a structural unit in which the aliphatic polycyclic group formed by $R^{24}$ together with the carbon atom to which $R^{24}$ is bonded is a 2-adamantyl group, and a structural unit represented by the above formula (a1-1-26) is particularly desirable.

In formula (a11-0-13), R and $R^{24}$ are each the same as defined above.

Examples of the linear alkyl group for $R^{25}$ include the same linear alkyl groups as those described above for the alkyl group for $R^{14}$ in the formulas (1-1) to (1-9), and a methyl group or an ethyl group is the most desirable.

Specific examples of the structural units represented by formula (a11-0-13) include the structural units represented by formulas (a1-1-1), (a1-1-2) and (a1-1-7) to (a1-1-15) which were described above as specific examples of the structural unit represented by the aforementioned general formula (a1-1).

The structural unit represented by formula (a11-0-13) is preferably a structural unit in which the aliphatic polycyclic group formed by $R^{24}$ together with the carbon atom to which $R^{24}$ is bonded is a 2-adamantyl group, and a structural unit represented by the above formula (a1-1-1) or (a1-1-2) is particularly desirable.

Further, structural units in which the aliphatic polycyclic group formed by $R^{24}$ together with the carbon atom to which $R^{24}$ is bonded is a "group where one or more hydrogen atoms have been removed from tetracyclododecane" are also preferred, and structural units represented by the above formula (a1-1-8), (a1-1-9) or (a1-1-30) are also preferred.

In formula (a11-0-14), R and $R^{22}$ are each the same as defined above. $R^{15}$ and $R^{16}$ are each the same as defined above for $R^{15}$ and $R^{16}$ in the aforementioned general formulas (2-1) to (2-6).

Specific examples of the structural units represented by formula (a11-0-14) include the structural units represented by formulas (a1-1-35) and (a1-1-36) which were described above as specific examples of the structural unit represented by the aforementioned general formula (a1-1).

In formula (a11-0-15), R and $R^{24}$ are each the same as defined above. $R^{15}$ and $R^{16}$ are each the same as defined above for $R^{15}$ and $R^{16}$ in the aforementioned general formulas (2-1) to (2-6).

Specific examples of the structural units represented by formula (a11-0-15) include the structural units represented by formulas (a1-1-4), (a1-1-6) and (a1-1-34) which were described above as specific examples of the structural unit represented by the aforementioned general formula (a1-1).

Examples of the structural units represented by formula (a11-0-2) include structural units represented by the above formulas (a1-3) and (a1-4), and of these, a structural unit represented by formula (a1-3) is particularly desirable.

As a structural unit represented by general formula (a11-0-2), those in which $Y^2$ in the formula is a group represented by the aforementioned formula —$Y^{21}$—O—$Y^{22}$— or —$Y^{21}$—C(O)—O—$Y^{22}$— is particularly desirable.

Preferred examples of such structural units include structural units represented by general formula (a1-3-01) shown below, structural units represented by general formula (a1-3-02) shown below, and structural units represented by general formula (a1-3-03) shown below.

[Chemical Formula 30]

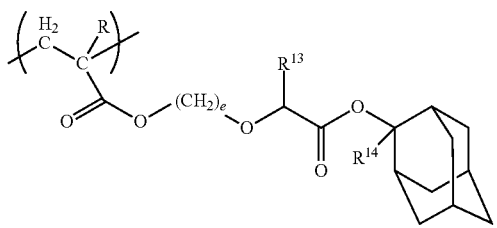

(a1-3-01)

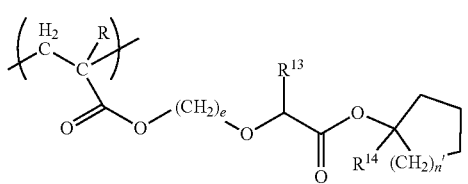

(a1-3-02)

In the formulas, R is the same as defined above; $R^{13}$ represents a hydrogen atom or a methyl group; $R^{14}$ represents an alkyl group; e represents an integer of 1 to 10; and n' represents an integer of 0 to 3.

[Chemical Formula 31]

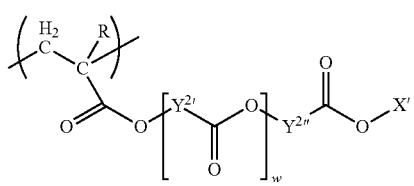

(a1-3-03)

In the formula, R is the same as defined above; each of $Y^{2\prime}$ and $Y^{2\prime\prime}$ independently represents a divalent linking group; X' represents an acid dissociable group; and w represents an integer of 0 to 3.

In formulas (a1-3-01) to (a1-3-02), $R^{13}$ is preferably a hydrogen atom.

$R^{14}$ is the same as defined for $R^{14}$ in the aforementioned formulas (1-1) to (1-9).

e is preferably an integer of 1 to 8, more preferably an integer of 1 to 5, and most preferably 1 or 2.

n' is preferably 1 or 2, and most preferably 2.

Specific examples of the structural units represented by formula (a1-3-01) include the structural units represented by the above formulas (a1-3-25) and (a1-3-26).

Specific examples of structural units represented by general formula (a1-3-02) include structural units represented by the aforementioned formulas (a1-3-27) and (a1-3-28).

Examples of the divalent linking groups for $Y^{2\prime}$ and $Y^{2\prime\prime}$ in formula (a1-3-03) include the same groups as those described above for $Y^2$ in the general formula (a1-3).

$Y^{2\prime}$ is preferably a divalent hydrocarbon group which may have a substituent, is more preferably a linear aliphatic hydrocarbon group, and is still more preferably a linear alkylene group. Among linear alkylene groups, a linear alkylene group of 1 to 5 carbon atoms is preferable, and a methylene group or an ethylene group is particularly desirable.

$Y^{2\prime\prime}$ is preferably a divalent hydrocarbon group which may have a substituent, is more preferably a linear aliphatic hydrocarbon group, and is still more preferably a linear alkylene group. Among linear alkylene groups, a linear alkylene group of 1 to 5 carbon atoms is preferable, and a methylene group or an ethylene group is particularly desirable.

The acid dissociable group for X' is the same as defined above, is preferably a tertiary alkyl ester-type acid dissociable group, is more preferably a group of type (i) described above, in which a substituent is bonded to a carbon atom that is bonded to the atom adjacent to the acid-dissociable group, thereby forming a tertiary carbon atom on the ring structure of a monovalent aliphatic cyclic group, and is most preferably a group represented by the above general formula (1-1).

w represents an integer of 0 to 3, and is preferably an integer of 0 to 2, more preferably 0 or 1, and most preferably 1.

The structural unit represented by general formula (a1-3-03) is preferably a structural unit represented by general formula (a1-3-03-1) or (a1-3-03-2) shown below, and among these, is most preferably a structural unit represented by formula (a1-3-03-1).

[Chemical Formula 32]

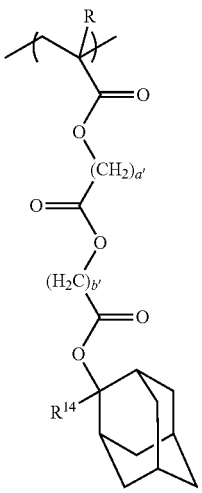
(a1-3-03-1)

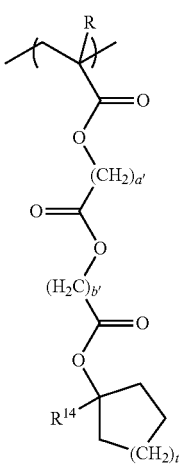
(a1-3-03-2)

In the formulas, R and $R^{14}$ are the same as defined above, a' represents an integer of 1 to 10, b' represents an integer of 1 to 10, and t represents an integer of 0 to 3.

In formulas (a1-3-03-1) and (a1-3-03-2), a' is the same as defined above, preferably an integer of 1 to 8, more preferably an integer of 1 to 5, and most preferably 1 or 2.

b' is the same as defined above, preferably an integer of 1 to 8, more preferably an integer of 1 to 5, and most preferably 1 or 2.

t is preferably an integer of 1 to 3, and most preferably 1 or 2.

Specific examples of the structural units represented by formulas (a1-3-03-1) and (a1-3-03-2) include the structural units represented by the above formulas (a1-3-29) to (a1-3-32).

(Structural Unit (a12), Structural Unit (a13))

In the present description, the structural unit (a12) is a structural unit derived from a hydroxystyrene or hydroxystyrene derivative and having at least part of the hydrogen atoms in the hydroxyl group of the structural unit has been protected with a substituent containing an acid decomposable group.

Further, the structural unit (a13) is a structural unit derived from a vinylbenzoic acid or vinylbenzoic acid derivative and having at least part of the hydrogen atom in the —C(=O)—OH group of the structural unit protected with a substituent containing an acid decomposable group.

In the structural units (a12) and (a13), preferred examples of the substituent containing an acid decomposable group include the same tertiary alkyl ester-type acid dissociable groups and acetal-type acid dissociable groups as those described above in connection with the structural unit (a11).

Preferred examples of the structural units (a12) and (a13) include structural units represented by any one of general formulas (a12-1) to (a12-4) and general formula (a13-1) shown below.

[Chemical Formula 33]

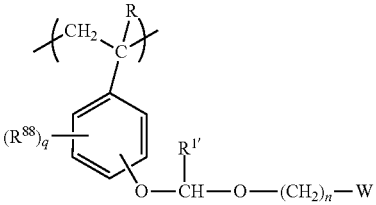
(a12-1)

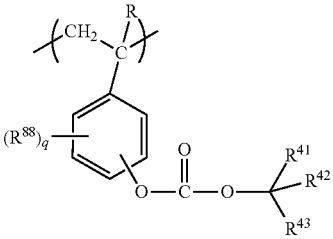
(a12-2)

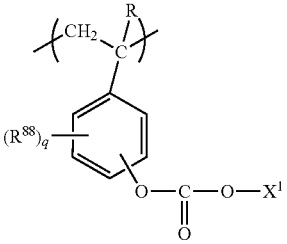
(a12-3)

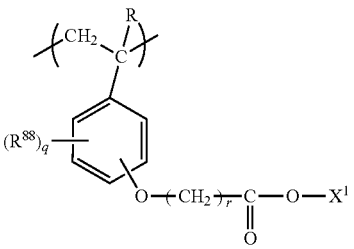
(a12-4)

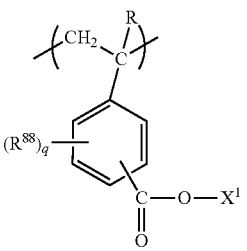
(a13-1)

In formulas (a12-1) to (a12-4) and (a13-1), R is the same as defined above; $R^{88}$ represents a halogen atom, an alkyl group of 1 to 5 carbon atoms or a halogenated alkyl group of 1 to 5 carbon atoms; q represents an integer of 0 to 4; $R^{1'}$ is the same as defined above; n represents an integer of 0 to 3; W represents an aliphatic cyclic group, an aromatic cyclic hydrocarbon group or an alkyl group of 1 to 5 carbon atoms; r represents 1 to 3; each of $R^{41}$, $R^{42}$ and $R^{43}$ independently represents a linear or branched alkyl group; and $X^1$ represents an acid dissociable group.

In the aforementioned formulas (a12-1) to (a12-4) and (a13-1), the bonding position for the groups "—O—$CHR^{1'}$—O—$(CH_2)_n$—W", "—O—C(O)—O—$C(R^{41})(R^{42})(R^{43})$", "—O—C(O)—O—$X^1$", "—O—$(CH_2)_r$—C(O)—O—$X^1$" and "—C(O)—O—$X^1$" may be any one of the o-position, the m-position, or the p-position of the phenyl group, and the p-position is most desirable, as the effects of the present invention are improved.

$R^{88}$ represents a halogen atom, an alkyl group of 1 to 5 carbon atoms or a halogenated alkyl group of 1 to 5 carbon atoms.

Examples of the halogen atom for $R^{88}$ include a fluorine atom, a chlorine atom, a bromine atom and an iodine atom, and a fluorine atom is preferable.

Examples of the alkyl group of 1 to 5 carbon atoms and halogenated alkyl group of 1 to 5 carbon atoms for $R^{88}$ include the same alkyl groups of 1 to 5 carbon atoms and halogenated alkyl groups of 1 to 5 carbon atoms as those described above for R.

When q is 1, the substitution position of $R^{88}$ may be any of the o-position, the m-position and the p-position.

When q is 2, a desired combination of the substitution positions can be used. However, $1 \leq p+q \leq 5$.

q is an integer of 0 to 4, preferably 0 or 1, and most preferably 0 from an industrial viewpoint.

n represents an integer of 0 to 3, is preferably an integer of 0 to 2, more preferably 0 or 1, and most preferably 0.

The aliphatic cyclic group for W is a monovalent aliphatic cyclic group. The aliphatic cyclic group can be selected appropriately, for example, from the multitude of groups that have been proposed for conventional ArF resists. Specific examples of the aliphatic cyclic group include an aliphatic monocyclic group of 5 to 7 carbon atoms and an aliphatic polycyclic group of 10 to 16 carbon atoms.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the aliphatic cyclic group exclusive of substituents is not limited to groups constituted from only carbon and hydrogen (not limited to hydrocarbon groups), and may include an oxygen atom or the like in the ring structure.

As the aliphatic monocyclic groups of 5 to 7 carbon atoms, groups in which one hydrogen atom has been removed from a monocycloalkane can be mentioned, and specific examples include groups in which one hydrogen atom has been removed from cyclopentane, cyclohexane or the like.

Examples of the aliphatic polycyclic group of 10 to 16 carbon atoms include groups in which one hydrogen atom has been removed from a bicycloalkane, tricycloalkane, tetracycloalkane or the like. Specific examples include groups in which one hydrogen atom has been removed from a polycycloalkane such as adamantane, norbornane, isobornane, tricyclodecane or tetracyclododecane. Of these, an adamantyl group, a norbornyl group and a tetracyclododecyl group is preferred industrially, and an adamantyl group is particularly desirable.

Examples of the aromatic cyclic hydrocarbon group for W include aromatic polycyclic groups of 10 to 16 carbon atoms. Specific examples of such aromatic polycyclic groups include groups in which one hydrogen atom has been removed from naphthalene, anthracene, phenanthrene, pyrene or the like. Specific examples include a 1-naphthyl group, a 2-naphthyl group, a 1-anthryl group, a 2-anthryl group, a 1-phenanthryl group, a 2-phenanthryl group, a 3-phenanthryl group and a 1-pyrenyl group, and a 2-naphthyl group is particularly preferred industrially.

Examples of the alkyl group of 1 to 5 carbon atoms for W include the same groups as those alkyl groups of 1 to 5 carbon atoms which may be bonded to the α-position of the aforementioned hydroxystyrene, although a methyl group or an ethyl group is more preferable, and an ethyl group is most preferable.

$R^{41}$ to $R^{43}$ are preferably an alkyl group of 1 to 5 carbon atoms, more preferably an alkyl group of 1 to 3 carbon atoms, and specific examples thereof include the same alkyl groups of 1 to 5 carbon atoms as those described above for R.

The acid dissociable group for $X^1$ is the same as defined for the acid dissociable group for $X^1$ in the aforementioned formula (a11-0-1).

r is preferably 1 or 2, and more preferably 1.

Among the above structural units (a12) and (a13), the structural unit (a12) is preferable, and structural units represented by general formula (a12-1) and structural units represented by general formula (a12-4) are more preferable.

Specific preferred examples of the structural unit (a12) are shown below.

[Chemical Formula 34]

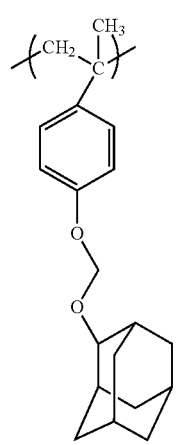

(a12-1-1)

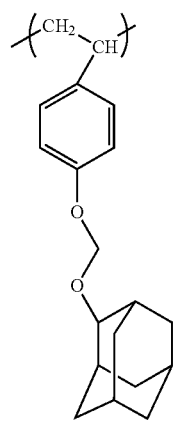

(a12-1-2)

(a12-1-3) 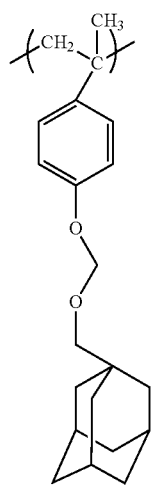
(a12-1-4) 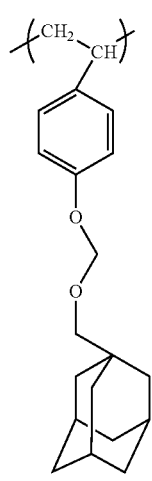
(a12-1-5) 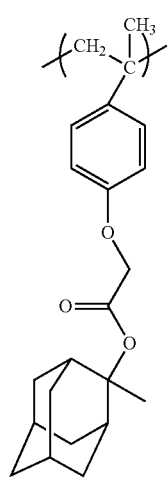
(a12-1-6) 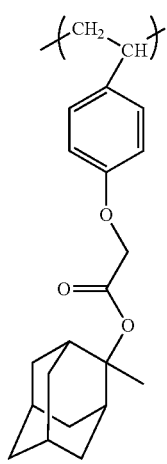
(a12-1-7) 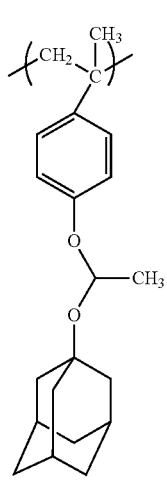
(a12-1-8) 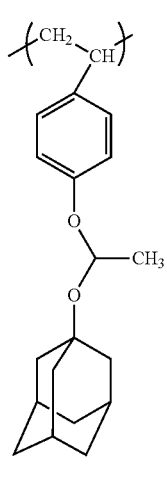

-continued

[Chemical Formula 35]

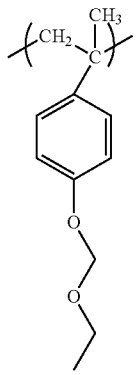

(a12-1-9)

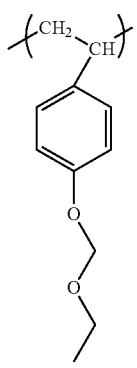

(a12-1-10)

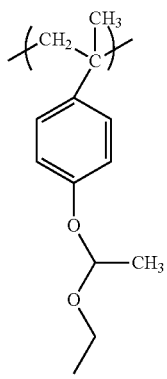

(a12-1-11)

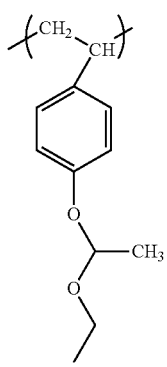

(a12-1-12)

As the structural unit (a12), at least one type of structural unit selected from those represented by chemical formulas (a12-1-1) to (a12-1-12) is preferable, and those represented by chemical formulas (a12-1-1), (a12-1-2) and (a12-1-5) to (a12-1-12) are most preferable.

The structural unit (a1) contained within the component (A1) may be either a single type of structural unit or a combination of two or more types of structural units.

Among the examples described above, the structural unit (a1) is preferably a structural unit (a11) derived from an acrylate ester which may have the hydrogen atom bonded to the carbon atom on the α-position substituted with a substituent.

The amount of the structural unit (a1) within the component (A1), based on the combined total of all the structural units that constitute the component (A1), is preferably within a range from 15 to 70 mol %, more preferably from 15 to 60 mol %, and still more preferably from 20 to 55 mol %.

When the amount of the structural unit (a1) is at least as large as the lower limit of the above-mentioned range, a pattern can be easily formed using a resist composition prepared from the component (A1), and the lithography properties such as the sensitivity, the resolution and the LWR also improve. On the other hand, when the amount of the structural unit (a1) is no more than the upper limit of the above-mentioned range, a good balance can be achieved with the other structural units.

When the component (A1)) contains two or more types of structural units (a1), a combination of two or more types of structural units having the aforementioned tertiary alkyl ester-type acid dissociable group is preferred, and (i) a combination of two or more types of structural units having the aforementioned "group which has a tertiary carbon atom on the ring structure of a cyclic alkyl group" is more preferred.

Furthermore, (ii) a combination of two or more types of structural units (at least one of which has a monocyclic ring structure while at least one of which has a polycyclic ring structure) having the aforementioned "group which has a tertiary carbon atom on the ring structure of a cyclic alkyl group"; and (iii) a combination of two or more types of structural units (all of which have a polycyclic ring structure) having the aforementioned "group which has a tertiary carbon atom on the ring structure of a cyclic alkyl group" are particularly preferred.

Specific examples of the combinations of type (ii) include a combination of structural unit represented by the aforementioned general formula (a11-0-11) and structural unit represented by the aforementioned general formula (a11-0-12); a combination of structural unit represented by the aforementioned general formula (a11-0-11) and structural unit represented by the aforementioned general formula (a11-0-13); and a combination of structural unit represented by the aforementioned general formula (a11-0-11), structural unit represented by the aforementioned general formula (a11-0-12) and structural unit represented by the aforementioned general formula (a11-0-13).

Specific examples of the combinations of type (iii) include a combination of structural unit represented by the aforementioned general formula (a11-0-12) and structural unit represented by the aforementioned general formula (a11-0-13).

In the case of combination of type (ii), the lithography properties such as the resolution or the LWR are improved, and in the case of combination of type (iii), the lithography properties such as the EL margin are improved.

When two types of structural units (a1) are used in combination, the percentage thereof (molar ratio) is preferably from 10:90 to 90:10, and more preferably from 30:70 to 70:30.

In particular, in the case of the aforementioned combination of type (ii), in terms of the percentage of the structural unit having a monocyclic ring structure and the structural unit having a polycyclic ring structure, the structural unit having a polycyclic ring structure is preferably at least 50 mol % based on the combined total of both structural units that constitute the structural unit (a1) because the resolution is improved, more preferably 70 to 95 mol %, and still more preferably 75 to 90 mol %. Further, the structural unit having a monocyclic ring structure is preferably at least 50 mol % because the LWR is improved, more preferably 50 to 80 mol %, and still more preferably 50 to 65 mol %.

[Other Structural Units]

The component (A1) may also have a structural unit other than the above-mentioned structural units (a0) and (a1), as long as the effects of the present invention are not impaired.

As such a structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used.

Examples of these other structural units include a structural unit (a2) which is a structural unit derived from an acrylate ester which may have the hydrogen atom bonded to the carbon atom on the α-position substituted with a substituent and contains a lactone-containing cyclic group;

a structural unit (a3) which is a structural unit derived from an acrylate ester which may have the hydrogen atom bonded to the carbon atom on the α-position substituted with a substituent and contains a polar group-containing aliphatic hydrocarbon group (excluding those that correspond to the aforementioned structural units (a0), (a1) and (a2)); and a structural unit (a4) which is a structural unit derived from an acrylate ester which may have the hydrogen atom bonded to the carbon atom on the α-position substituted with a substituent and contains a non-acid-dissociable aliphatic polycyclic group.

(Structural Unit (a2))

The structural unit (a2) is a structural unit derived from an acrylate ester which may have the hydrogen atom bonded to the carbon atom on the α-position substituted with a substituent and contains a lactone-containing cyclic group.

The term "lactone-containing cyclic group" refers to a cyclic group including one ring containing a —O—C(=O)— structure (lactone ring). The lactone ring is counted as the first ring, and a lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water (especially, in the case of alkali developing process).

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 36]

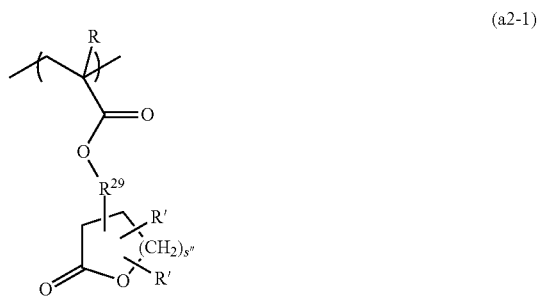
(a2-1)

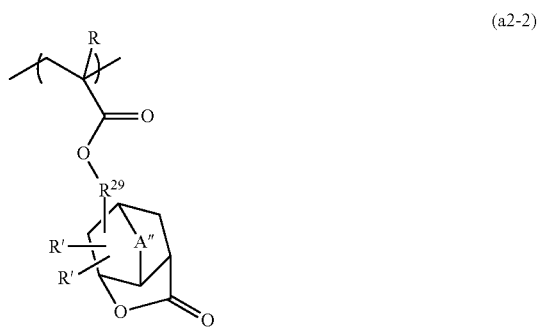
(a2-2)

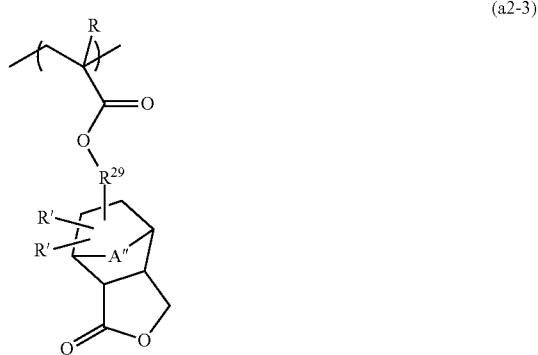
(a2-3)

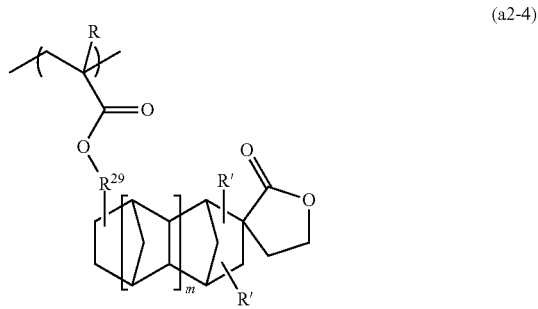
(a2-4)

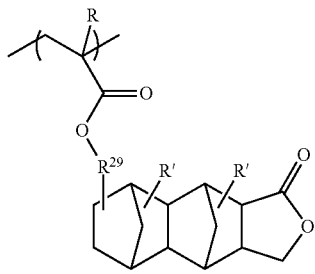
(a2-5)

In the formulas, R represents a hydrogen atom, a lower alkyl group or a halogenated lower alkyl group; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined above for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R include a methoxy group, an ethoxy group, an n-propoxy group, an iso-propoxy group, an n-butoxy group and a tert-butoxy group.

In terms of industrial availability, R' is preferably a hydrogen atom.

R" preferably represents a hydrogen atom or a linear, branched or cyclic alkyl group of 1 to 15 carbon atoms.

When R" is a linear or branched alkyl group, the alkyl group preferably contains 1 to 10 carbon atoms, and more preferably 1 to 5 carbon atoms.

When R" is a cyclic alkyl group (cycloalkyl group), it preferably contains 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms or —O—, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a11-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic hydrocarbon group represented by $Y^2$.

s" is preferably 1 or 2.

Specific examples of structural units represented by general formulas (a2-1) to (a2-5) are shown below.

In the formulas shown below, $R^\alpha$ represents a hydrogen atom, a methyl group or a trifluoromethyl group.

[Chemical Formula 37]

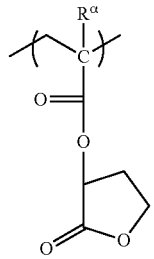
(a2-1-1)

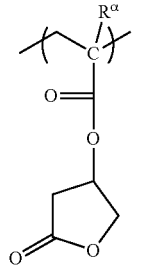
(a2-1-2)

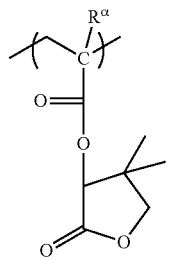
(a2-1-3)

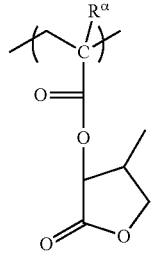
(a2-1-4)

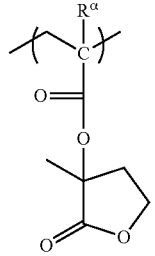
(a2-1-5)

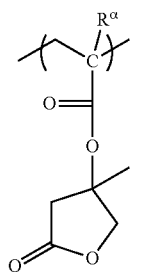 (a2-1-6)
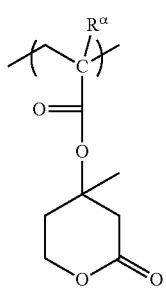 (a2-1-7)
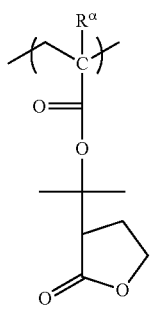 (a2-1-8)
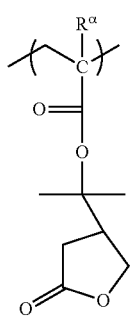 (a2-1-9)
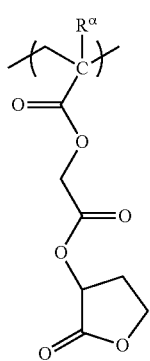 (a2-1-10)
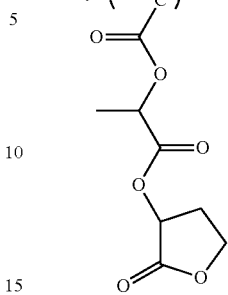 (a2-1-11)
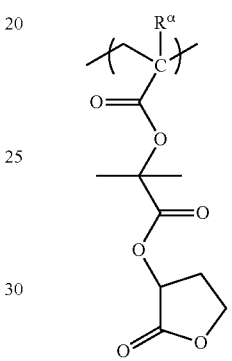 (a2-1-12)
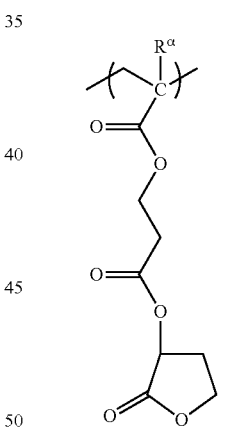 (a2-1-13)
[Chemical Formula 38]
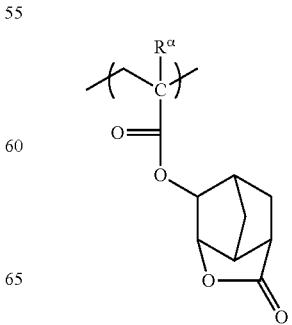 (a2-2-1)

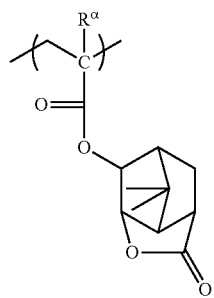
(a2-2-2)
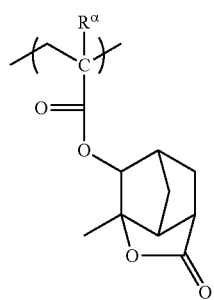
(a2-2-3)
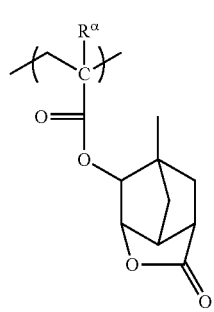
(a2-2-4)
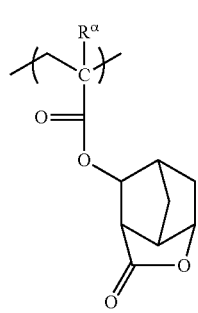
(a2-2-5)
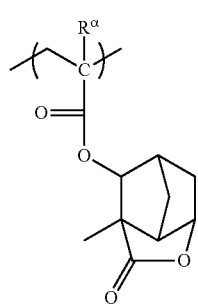
(a2-2-6)
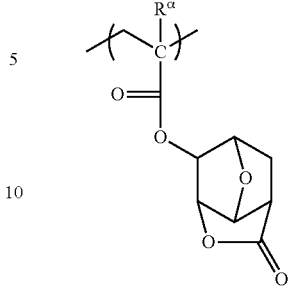
(a2-2-7)
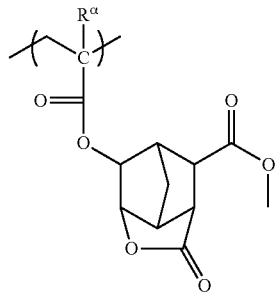
(a2-2-8)
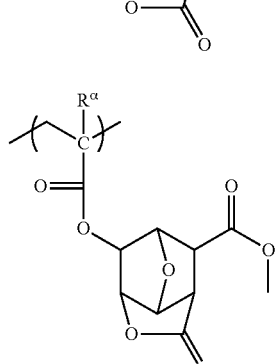
(a2-2-9)
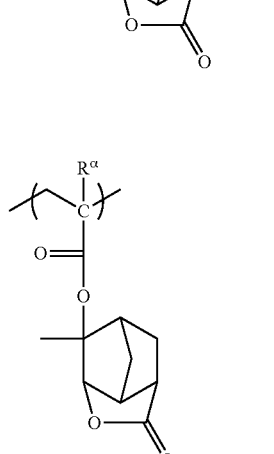
(a2-2-10)
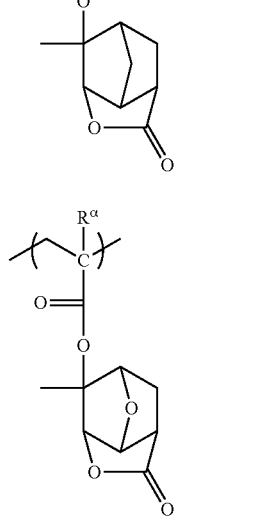
(a2-2-11)

(a2-2-12)
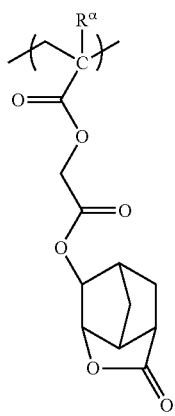
(a2-2-13)
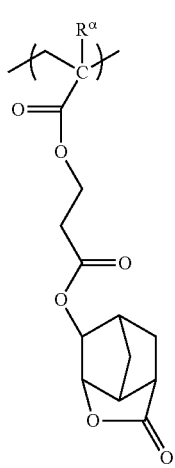
(a2-2-14)
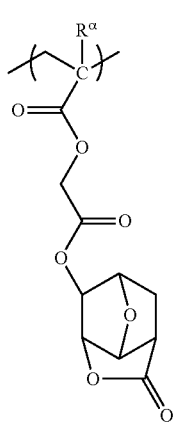
(a2-2-15)
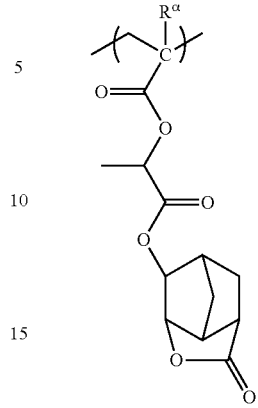
(a2-2-16)
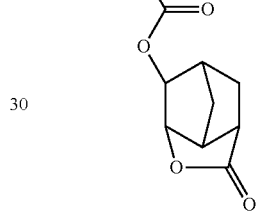
(a2-2-17)
[Chemical Formula 39]
(a2-3-1)
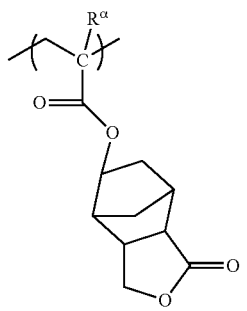

-continued
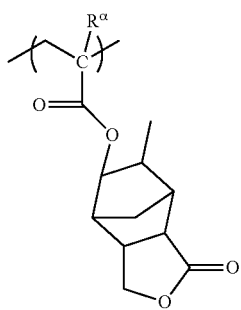 (a2-3-2)
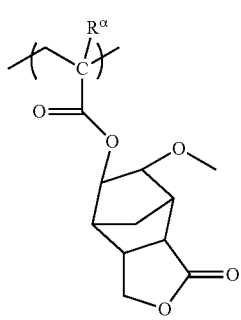 (a2-3-3)
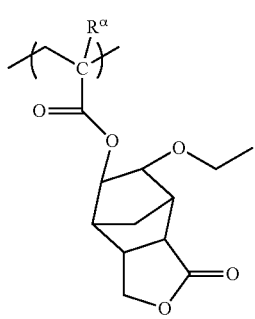 (a2-3-4)
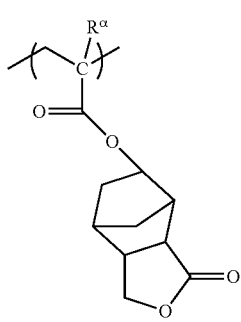 (a2-3-5)
[Chemical Formula 40]
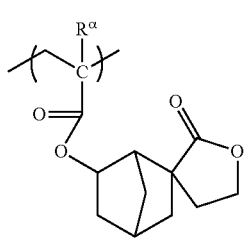 (a2-4-1)
-continued
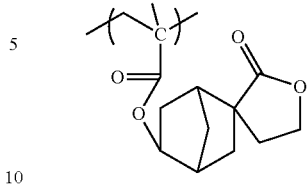 (a2-4-2)
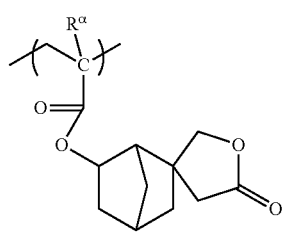 (a2-4-3)
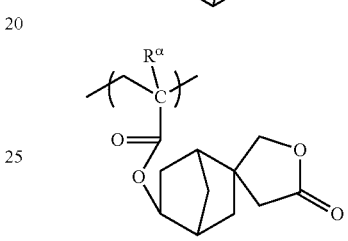 (a2-4-4)
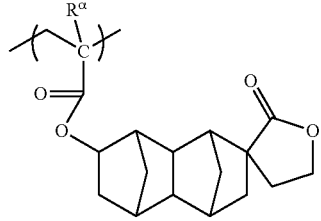 (a2-4-5)
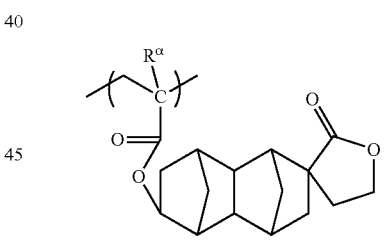 (a2-4-6)
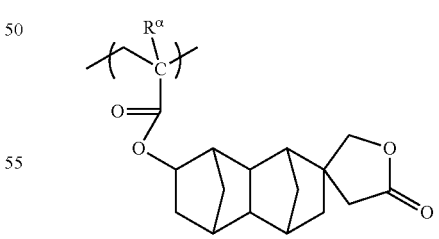 (a2-4-7)
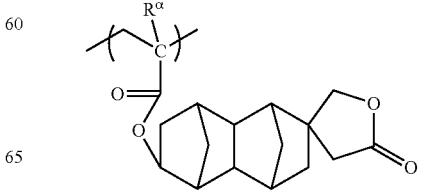 (a2-4-8)

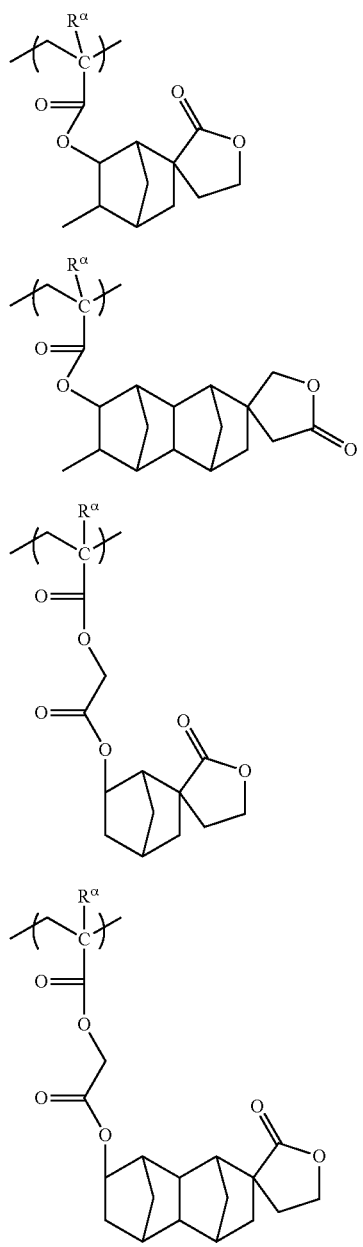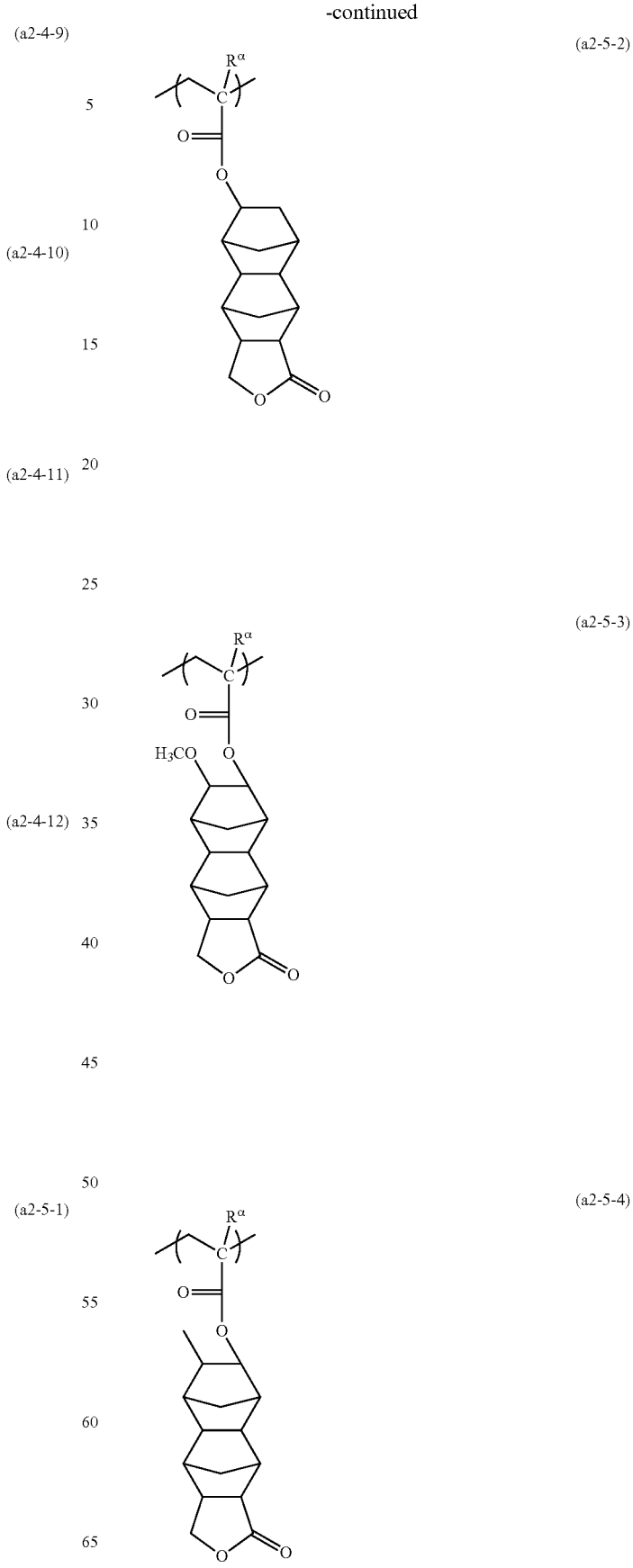

-continued

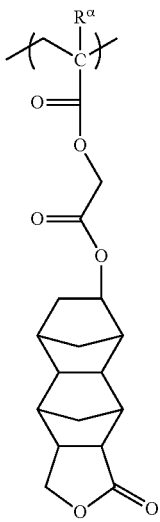

(a2-5-5)

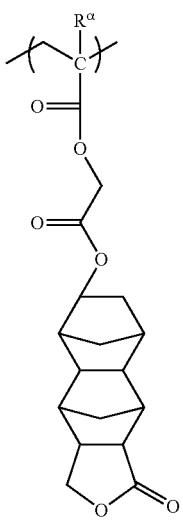

(a2-5-6)

The structural unit (a2) contained within the component (A1) may be either a single type of structural unit or a combination of two or more types of structural units.

As the structural unit (a2), at least one type of structural unit selected from the group consisting of structural units represented by general formulas (a2-1) to (a2-5) is preferable, and at least one type of structural unit selected from the group consisting of structural units represented by general formulas (a2-1) to (a2-3) is more preferable. Of these, it is preferable to use at least one type of structural unit selected from the group consisting of structural units represented by chemical formulas (a2-1-1), (a2-1-2), (a2-2-1), (a2-2-7), (a2-3-1) and (a2-3-5).

In the component (A1), the amount of the structural unit (a2) based on the combined total of all structural units constituting the component (A1) is preferably 5 to 60 mol %, more preferably 10 to 50 mol %, and still more preferably 10 to 45 mol %.

When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

(Structural Unit (a3))

The structural unit (a3) is a structural unit derived from an acrylate ester which may have the hydrogen atom bonded to the carbon atom on the α-position substituted with a substituent and contains a polar group-containing aliphatic hydrocarbon group (excluding those that correspond to the aforementioned structural units (a0), (a1) and (a2)).

When the component (A1)) includes the structural unit (a3), the hydrophilicity of the component (A) is improved, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable. These polar groups are bonded to the aliphatic hydrocarbon group.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups may be either a monocyclic group or a polycyclic group, and can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that includes an aliphatic polycyclic group containing a hydroxyl group, cyano group, carboxyl group or a hydroxyalkyl group in which some of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 42]

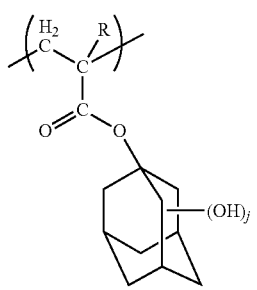

(a3-1)

-continued (a3-2)

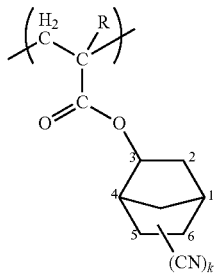

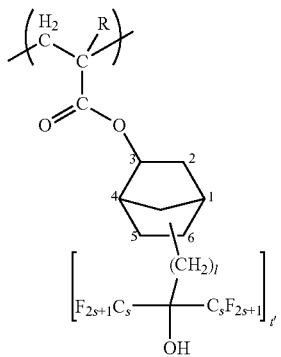

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxyl group of the acrylic acid. The fluorinated alkyl alcohol is preferably bonded to the 5th or 6th position of the norbornyl group.

Further, preferred examples of the structural unit (a3) also include structural units represented by any one of general formulas (a3-11) to (a3-13) shown below.

[Chemical Formula 43]

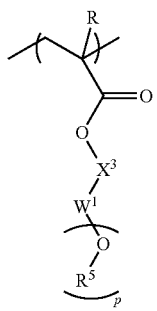

(a3-11)

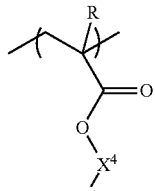

(a3-12)

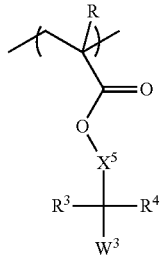

(a3-13)

In the formulas, R represents a hydrogen atom, an alkyl group of 1 to 5 carbon atoms or a halogenated alkyl group of 1 to 5 carbon atoms; $X^3$ represents a single bond or a divalent linking group; $W^1$, $W^2$ and $W^3$ represent a cyclic saturated hydrocarbon group which may have a substituent at an arbitrary position, with the provision that $W^2$ contains at least one OH group as a substituent; $R^5$ represents a saturated hydrocarbon group having at least one OH group as a substituent; p represents an integer of 1 to 3; $X^4$ and $X^5$ represent a divalent linking group; each of $R^3$ and $R^4$ independently represents a hydrogen atom, an alkyl group of 1 to 10 carbon atoms, an OH group, or an alkyl group of 1 to 10 carbon atoms having at least one OH group as a substituent, with the provision that at least one of $R^3$ and $R^4$ contains an OH group.

In formulas (a3-11) to (a3-13), R represents a hydrogen atom, an alkyl group of 1 to 5 carbon atoms or a halogenated alkyl group of 1 to 5 carbon atoms. As the alkyl group of 1 to 5 carbon atoms or halogenated alkyl group of 1 to 5 carbon atoms for R, the same alkyl groups of 1 to 5 carbon atoms or halogenated alkyl groups of 1 to 5 carbon atoms as those defined above for the substituent which may be bonded to the carbon atom on the α-position can be used.

In formula (a3-11), $X^3$ represents a single bond or a divalent linking group.

Preferred examples of the divalent linking group for $X^3$ include divalent hydrocarbon groups which may have a substituent, and divalent linking groups containing a hetero atom.

The description that the hydrocarbon group "may have a substituent" means that some or all of the hydrogen atoms within the hydrocarbon group may be substituted with an atom other than a hydrogen atom or with a group.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8 carbon atoms, still more preferably 1 to 5 carbon atoms, and most preferably 1 or 2 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of aromatic hydrocarbon groups include a divalent aromatic hydrocarbon group in which one hydrogen atom has been removed from an aromatic hydrocarbon ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from an aromatic hydrocarbon ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

With respect to the "divalent linking group containing a hetero atom", a hetero atom is an atom other than a carbon atom or hydrogen atom, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate bond (—O—C(=O)—O—), —NH—, —$NR^{04}$— ($R^{04}$ represents an alkyl group), —NH—C(=O)—, and =N—. The alkyl group for $R^{04}$ preferably has 1 to 10 carbon atoms, more preferably 1 to 8 carbon atoms, and most preferably 1 to 5 carbon atoms.

Further, a combination of any one of these "divalent linking groups containing a hetero atom" with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

$X^3$ may or may not have an acid dissociable portion in the structure thereof.

An "acid dissociable portion" refers to a portion within the organic group which is dissociated from the organic group by the action of acid generated upon exposure. When the $X^3$ group has an acid dissociable portion, it preferably has an acid dissociable portion having a tertiary carbon atom.

In the present invention, as $X^3$, a single bond, an alkylene group or a divalent linking group containing a hetero atom is preferable. Of these possibilities, a single bond or an alkylene group is particularly desirable.

When $X^3$ represents an alkylene group, the alkylene group preferably has 1 to 10 carbon atoms, more preferably 1 to 6 carbon atoms, still more preferably 1 to 4 carbon atoms, and most preferably 1 to 3 carbon atoms. Specific examples of alkylene groups include the aforementioned linear alkylene groups and branched alkylene groups.

When $X^3$ represents a divalent linking group containing a hetero atom, preferred examples of the divalent linking group include —O—, —C(=O)—O—, —C(=O)—, —O—C(=O)—O—, —C(=O)—NH—, —NH— (H may be replaced with a substituent such as an alkyl group or an acyl group), —S—, —S(=O)$_2$—, —S(=O)$_2$—O—, and a group represented by formula -A-O—B—, and a group represented by formula -[A-C(=O)—O]$_{m'}$—B—. Herein, each of A and B independently represents a divalent hydrocarbon group which may have a substituent, and m' represents an integer of 0 to 3.

When $X^3$ represents —NH—, this H may be substituted with a substituent such as an alkyl group or an acyl group. The substituent (an alkyl group, an acyl group or the like) preferably has 1 to 10 carbon atoms, more preferably 1 to 8 carbon atoms, and most preferably 1 to 5 carbon atoms.

In the group represented by the formula -A-O—B— or -[A-C(=O)—O]$_{m'}$—B—, each of A and B independently represents a divalent hydrocarbon group which may have a substituent.

Examples of divalent hydrocarbon groups for A and B which may have a substituent include the same groups as those described above for the "divalent hydrocarbon group which may have a substituent" usable as $X^3$.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

Further, in the group represented by the formula -[A-C(=O)—O]$_{m'}$—B—, m' represents an integer of 0 to 3, preferably an integer of 0 to 2, more preferably 0 or 1, and most preferably 1.

In formula (a3-11), $W^1$ represents a cyclic saturated hydrocarbon group which may have a substituent at an arbitrary position.

Examples of the cyclic saturated hydrocarbon group include the same cyclic aliphatic hydrocarbon groups as those described above in connection with the divalent linking group for $X^3$. Of these, groups in which two or more hydrogen atoms have been removed from a polycycloalkane such as adamantane, norbornane, isobornane, tricyclodecane or tetracyclododecane are preferred.

The cyclic saturated hydrocarbon group for $W^1$ may or may not have a substituent. Examples of the substituent include an alkyl group of 1 to 5 carbon atoms, a fluorine atom, a fluorinated alkyl group of 1 to 5 carbon atoms, and an oxygen atom (=O).

In formula (a3-11), $R^5$ represents a saturated hydrocarbon group having at least one OH group as a substituent.

The saturated hydrocarbon group for $R^5$ is preferably a linear, branched or cyclic alkyl group or a combination thereof, and more preferably a linear or branched alkyl group.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group.

The branched alkyl group preferably has 3 to 10 carbon atoms, and more preferably 3 to 5 carbon atoms. Specific examples of such branched alkyl groups include an isopropyl group, an isobutyl group, a tert-butyl group, an isopentyl group and a neopentyl group, and an isopropyl group is particularly desirable.

The cyclic alkyl group preferably has 4 to 20 carbon atoms, and more preferably 5 to 12 carbon atoms. Specific examples include groups in which one or more hydrogen atoms have been removed from a monocyclic group such as cyclopentane and cyclohexane, and groups in which one or more hydrogen atoms have been removed from a polycyclic group such as adamantane, norbornane, isobornane, tricyclodecane or tetracyclododecane.

The saturated hydrocarbon group for $R^5$ contains at least one OH group as a substituent at an arbitrary position. The saturated hydrocarbon group for $R^5$ may also have another substituent such as a fluorine atom and an oxygen atom (=O), in addition to the OH group as a substituent.

In formula (a3-11), p represents an integer of 1 to 3, is preferably 1 or 2, and is most preferably 1. When p is 2 or 3, the plurality of $R^5$ may be the same or different from each other.

Specific preferred examples of the structural units represented by formula (a3-11) are shown below.

In the formulas shown below, $R^\alpha$ represents a hydrogen atom, a methyl group or a trifluoromethyl group.

[Chemical Formula 44]

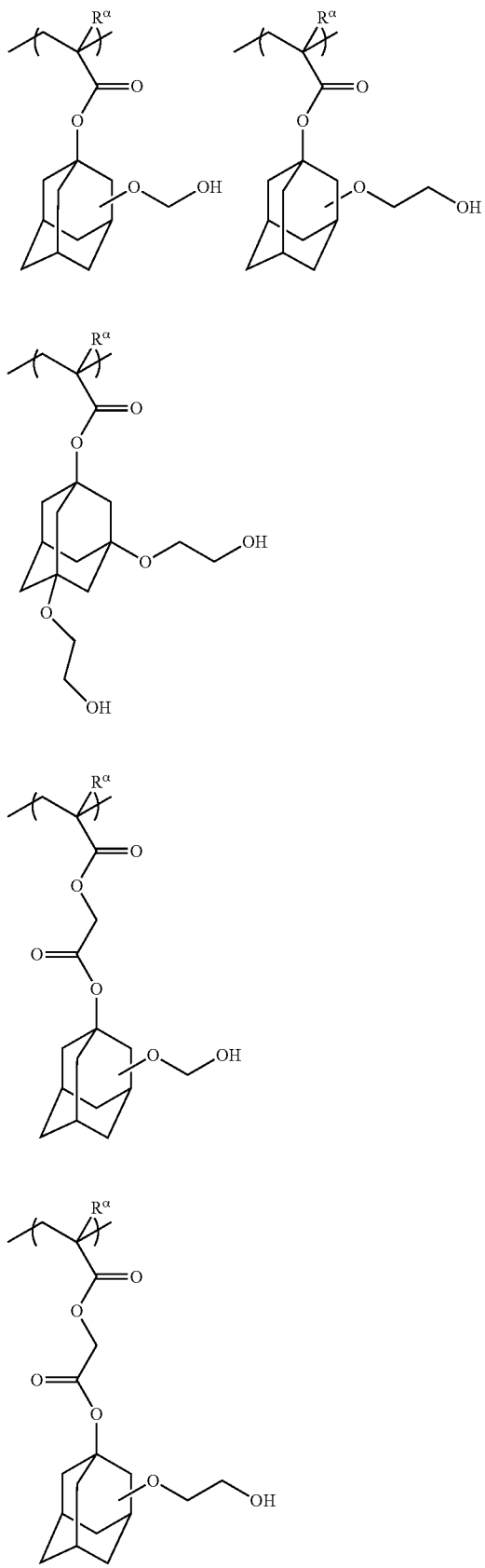

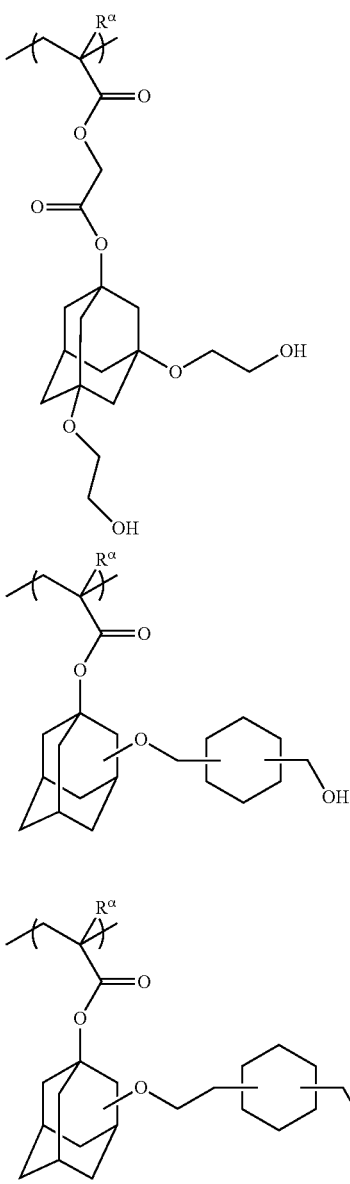

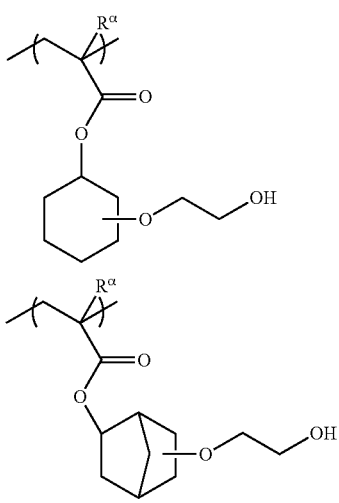

[Chemical Formula 45]

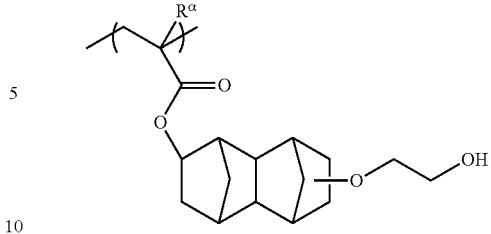

In formula (a3-12), $X^4$ represents a divalent linking group, and examples thereof include the same divalent linking groups as those described above for $X^3$. Among these, as the divalent linking group for $X^4$, an alkylene group is preferable, and a methylene group or an ethylene group is most preferable.

In formula (a3-12), $W^2$ represents a cyclic saturated hydrocarbon group which may have a substituent at an arbitrary position, and contains at least one OH group as a substituent.

The cyclic saturated hydrocarbon group may be either a polycyclic group or a monocyclic group. As the monocyclic group, a group in which one hydrogen atom has been removed from a monocycloalkane of 3 to 6 carbon atoms is preferable. Examples of the monocycloalkane include cyclopentane and cyclohexane. As the polycyclic group, a group in which one hydrogen atom has been removed from a polycycloalkane of 7 to 12 carbon atoms is preferable. Examples of the polycycloalkane include adamantane, norbornane, isobornane, tricyclodecane and tetracyclododecane. Of these, the cyclic saturated hydrocarbon group is preferably a group in which one hydrogen atom has been removed from a polycycloalkane.

The cyclic saturated hydrocarbon group may have another substituent other than the OH group, such as an alkyl group of 1 to 5 carbon atoms, a fluorine atom, a fluorinated alkyl group of 1 to 5 carbon atoms and an oxygen atom (=O).

The OH group as a substituent for $W^2$ is preferably bonded directly to the ring as a substituent for substituting a hydrogen atom of the hydrocarbon group that constitutes the ring of the cyclic aliphatic hydrocarbon group, and more preferably bonded to the tertiary carbon atom that constitutes the ring. The OH group is preferably bonded to the tertiary carbon atom because this OH group cannot be eliminated by a dehydration reaction.

Specific preferred examples of the structural units represented by formula (a3-12) are shown below.

In the formulas shown below, $R^\alpha$ represents a hydrogen atom, a methyl group or a trifluoromethyl group.

[Chemical Formula 46]

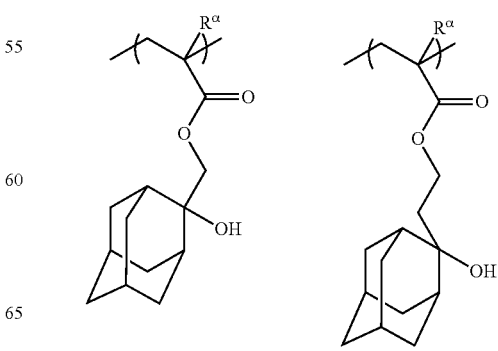

-continued

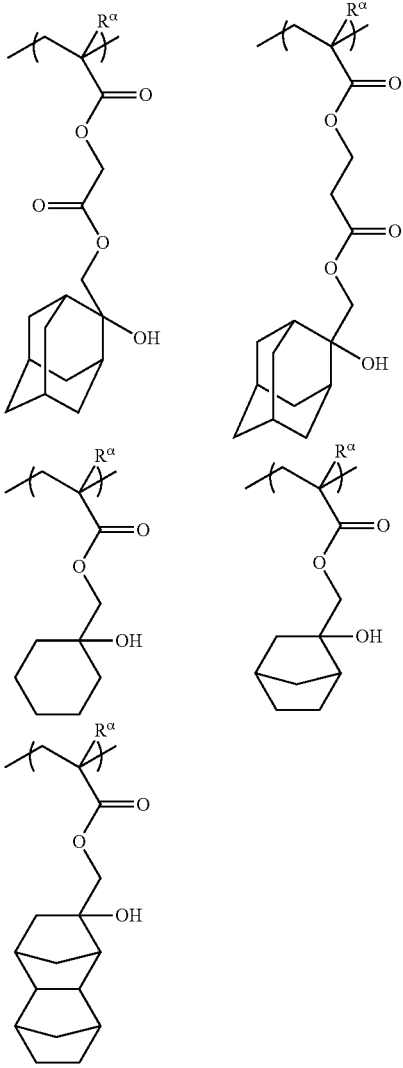

In formula (a3-13), $X^5$ represents a divalent linking group, and examples thereof include the same divalent linking groups as those described above for $X^4$.

In formula (a3-13), each of $R^3$ and $R^4$ independently represents a hydrogen atom, an alkyl group of 1 to 10 carbon atoms, an OH group, or an alkyl group of 1 to 10 carbon atoms having at least one OH group as a substituent, with the provision that at least one of $R^3$ and $R^4$ contains an OH group.

The alkyl group of 1 to 10 carbon atoms for $R^3$ and $R^4$ is preferably a chain-like alkyl group, and the chain-like alkyl group may be a linear or branched alkyl group.

Specific examples of the linear alkyl group include a methyl group, an ethyl group, a propyl group, a butyl group, a pentyl group, a hexyl group, a heptyl group, an octyl group, a nonyl group or a decyl group.

Specific examples of the branched alkyl group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Examples of the alkyl group of 1 to 10 carbon atoms for $R^3$ and $R^4$ which has at least one OH group as a substituent include groups in which one or more hydrogen atoms of the alkyl group of 1 to 10 carbon atoms described above for $R^3$ and $R^4$ have been substituted with an OH group.

In particular, in the present invention, it is preferable that only one of $R^3$ and $R^4$ contain an OH group, and it is particularly desirable that one of $R^3$ and $R^4$ represents an alkyl group while the other represents an OH group.

Specific preferred examples of the structural units represented by formula (a3-13) are shown below.

In the formulas shown below, $R^\alpha$ represents a hydrogen atom, a methyl group or a trifluoromethyl group.

[Chemical Formula 47]

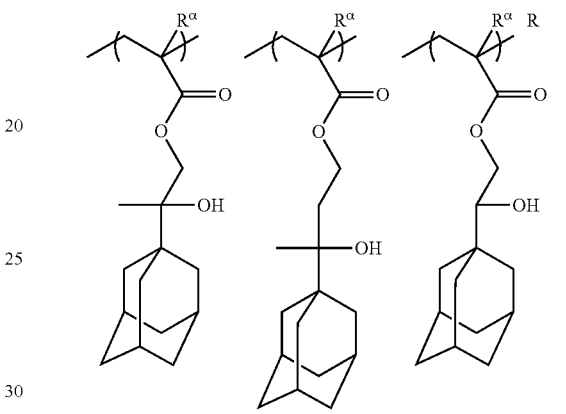

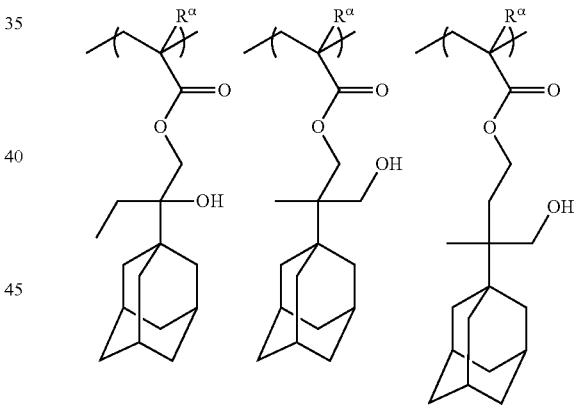

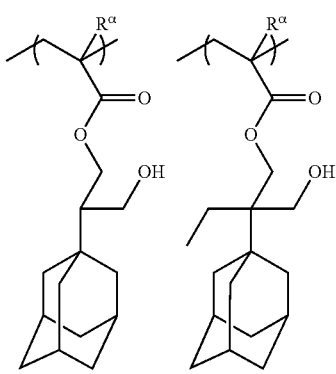

[Chemical Formula 48]

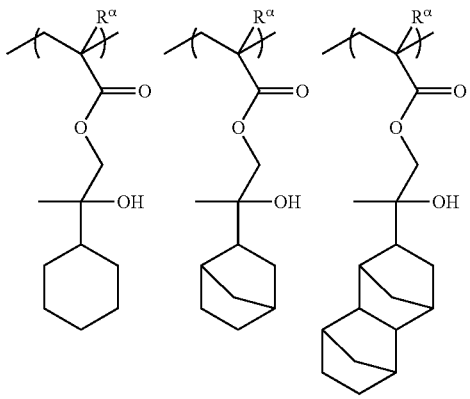

The structural unit (a3) contained within the component (A1)) may be either a single type of structural unit or a combination of two or more types of structural units.

Of the above possibilities, the structural unit (a3) is preferably a structural unit represented by any one of the above general formulas (a3-11) to (a3-13) since the lithography properties can be improved, and more preferably a structural unit represented by general formula (a3-12) or a structural unit represented by general formula (a3-13).

The amount of the structural unit (a3) within the component (A1) based on the combined total of all structural units constituting the component (A1) is preferably 1 to 45 mol %, more preferably 5 to 40 mol %, still more preferably 10 to 35 mol %, and most preferably 10 to 30 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit derived from an acrylate ester in which the hydrogen atom bonded to the carbon atom on the α-position may be substituted with a substituent and containing a non-acid-dissociable aliphatic polycyclic group.

In the structural unit (a4), examples of this polycyclic group include the same polycyclic groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 49]

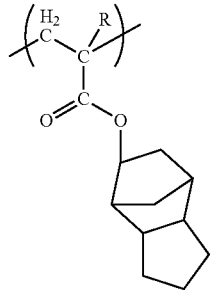
(a4-1)

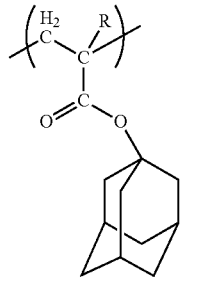
(a4-2)

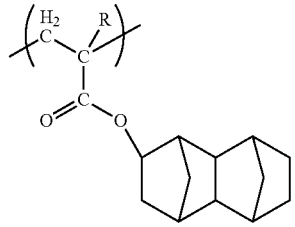
(a4-3)

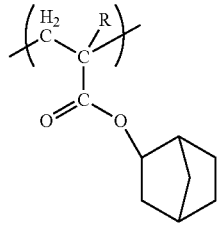
(a4-4)

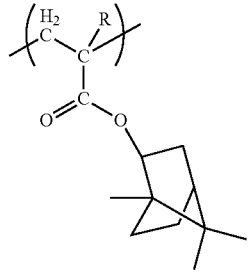
(a4-5)

In the formulas, R is the same as defined above.

When the structural unit (a4) is included in the component (A1), the amount of the structural unit (a4) based on the combined total of all the structural units that constitute the component (A1)) is preferably within the range from 1 to 30 mol %, and more preferably from 10 to 20 mol %.

In the resist composition of the present invention, the component (A) contains a resin component (A1) including the above-mentioned structural unit (a0) and structural unit (a1) (with the provision that the amount of the structural unit (a0)

based on the combined total of all structural units constituting the component (A1) is less than 50 mol %).

The component (A1) is preferably a polymeric compound including the structural unit (a0) and the structural unit (a1).

Specific examples of the component (A1)) include a polymeric compound composed of the structural unit (a0), the structural unit (a1), the structural unit (a2) and the structural unit (a3); and a polymeric compound composed of the structural unit (a0), the structural unit (a1) and the structural unit (a3).

More specifically, preferred examples of the component (A1) include a polymeric compound composed of the structural unit represented by the aforementioned formula (a0-0-12), the structural unit represented by the aforementioned formula (a11-0-11), the structural unit represented by the aforementioned formula (a11-0-12), the structural unit represented by the aforementioned formula (a2-1) and the structural unit represented by the aforementioned formula (a3-12); a polymeric compound composed of the structural unit represented by the aforementioned formula (a0-0-12), the structural unit represented by the aforementioned formula (a11-0-11) and the structural unit represented by the aforementioned formula (a3-12); a polymeric compound composed of the structural unit represented by the aforementioned formula (a0-0-12), the structural unit represented by the aforementioned formula (a11-0-12) and the structural unit represented by the aforementioned formula (a3-1); a polymeric compound composed of the structural unit represented by the aforementioned formula (a0-0-12), the structural unit represented by the aforementioned formula (a11-0-11), the structural unit represented by the aforementioned formula (a11-0-12) and the structural unit represented by the aforementioned formula (a3-12); a polymeric compound composed of the structural unit represented by the aforementioned formula (a0-0-12), the structural unit represented by the aforementioned formula (a11-0-12), the structural unit represented by the aforementioned formula (a11-0-13) and the structural unit represented by the aforementioned formula (a3-13); a polymeric compound composed of the structural unit represented by the aforementioned formula (a0-0-12), the structural unit represented by the aforementioned formula (a11-0-11), the structural unit represented by the aforementioned formula (a11-0-12) and the structural unit represented by the aforementioned formula (a3-1); and a polymeric compound composed of the structural unit represented by the aforementioned formula (a0-0-12), the structural unit represented by the aforementioned formula (a11-0-11) and the structural unit represented by the aforementioned formula (a3-1).

In the component (A), as the component (A1), one type may be used alone, or two or more types may be used in combination.

In the component (A), the amount of the component (A1), based on the total weight of the component (A), is preferably at least 25% by weight, more preferably 50% by weight or more, still more preferably 75% by weight or more, and most preferably 100% by weight. When the amount of the component (A1)) is 25% by weight or more, the effects of the present invention are further improved.

The weight average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and most preferably from 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, although there are no particular limitations on the dispersity (Mw/Mn) of the component (A1), the dispersity is preferably from 1.0 to 5.0, more preferably from 1.0 to 3.0, and most preferably from 1.0 to 2.5. Here, Mn is the number average molecular weight.

The component (A) may also include another base component (hereafter, this base component will be referred to as "component (A2)"), besides the component (A1), provided the inclusion of the component (A2) does not impair the effects of the present invention.

As the component (A2), a low molecular weight compound that has a molecular weight of at least 500 but less than 2,500, contains a hydrophilic group, and also contains an acid dissociable group such as those listed above in connection with the component (A1) may be used. Specific examples include compounds containing a plurality of phenol structures in which part or all of the hydrogen atoms of the hydroxyl groups have each been substituted with an aforementioned acid dissociable group.

This type of low molecular weight compound is preferably a low molecular weight phenol compound in which a portion of the hydroxyl group hydrogen atoms have each been substituted with an aforementioned acid-dissociable group. These types of compounds are known, for example, as sensitizers or heat resistance improvers for use in non-chemically amplified g-line or i-line resists, and any of these compounds may be used as appropriate.

Specific examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane structures is preferable, as such compounds yield superior levels of resolution and line width roughness (LWR). Also, there are no particular limitations on the acid dissociable group, and suitable examples include the groups described above.

In the resist composition of the present invention, the amount of the component (A) can be appropriately adjusted depending on the thickness of the resist film to be formed, and the like.

<Component (B)>

In the resist composition of the present invention, as the component (B), there is no particular limitation, and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-1) or (b-2) shown below can be used.

[Chemical Formula 50]

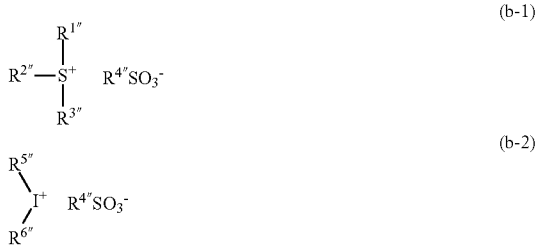

In the formulas, each of $R^{1\prime\prime}$ to $R^{3\prime\prime}$ and $R^{5\prime\prime}$ to $R^{6\prime\prime}$ independently represents an aryl group, alkyl group or alkenyl group which may have a substituent, wherein two of $R^{1\prime\prime}$ to $R^{3\prime\prime}$ in formula (b-1) may be bonded to each other to form a ring with the sulfur atom shown in the formula; and $R^{4\prime\prime}$ represents an alkyl group, halogenated alkyl group, aryl group or alkenyl group which may have a substituent.

In formula (b-1), each of $R^{1\prime\prime}$ to $R^{3\prime\prime}$ independently represents an aryl group, alkyl group or alkenyl group which may have a substituent. Two of $R^{1\prime\prime}$ to $R^{3\prime\prime}$ may be bonded to each other to form a ring together with the sulfur atom in the formula.

Further, at least one of $R^{1\prime\prime}$ to $R^{3\prime\prime}$ preferably represents an aryl group, more preferably two or more of $R^{1\prime\prime}$ to $R^{3\prime\prime}$ represent aryl groups, and it is particularly desirable that all of $R^{1\prime\prime}$ to $R^{3\prime\prime}$ be aryl groups, as such groups yield superior improvements in the lithography properties and resist pattern shape.

Examples of the aryl groups for $R^{1\prime\prime}$ to $R^{3\prime\prime}$ include an unsubstituted aryl group having 6 to 20 carbon atoms; and a substituted aryl group in which a part or all of the hydrogen atoms of the aforementioned unsubstituted aryl group has been substituted with alkyl groups, alkoxy groups, halogen atoms, hydroxyl groups, oxo groups (=O), aryl groups, alkoxyalkyloxy groups, alkoxycarbonylalkyloxy groups, —C(=O)—O—$R^{6\dagger}$, —O—C(=O)—$R^{7\dagger}$, —O—$R^{8\dagger}$ or the like. Each of $R^{6\dagger}$, $R^{7\dagger}$ and $R^{8\dagger}$ represents a linear or branched saturated hydrocarbon group of 1 to 25 carbon atoms, a cyclic saturated hydrocarbon group of 3 to 20 carbon atoms, or a linear or branched, aliphatic unsaturated hydrocarbon group of 2 to 5 carbon atoms.

The unsubstituted aryl group for $R^{1\prime\prime}$ to $R^{3\prime\prime}$ is preferably an aryl group of 6 to 10 carbon atoms because such groups enable lower cost synthesis. Specific examples thereof include a phenyl group and a naphthyl group.

The alkyl group as the substituent for the substituted aryl group represented by $R^{1\prime\prime}$ to $R^{3\prime\prime}$ is preferably an alkyl group of 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

Examples of the aryl group as the substituent for the substituted aryl group include the same aryl groups as those described above for $R^{1\prime\prime}$ to $R^{3\prime\prime}$, and of these, aryl groups of 6 to 20 carbon atoms are preferred, aryl groups of 6 to 10 carbon atoms are more preferred, and a phenyl group or naphthyl group is particularly desirable.

Examples of alkoxyalkyloxy groups as the substituent for the substituted aryl group include groups represented by a general formula shown below:

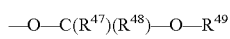

In this formula, each of $R^{47}$ and $R^{48}$ independently represents a hydrogen atom or a linear or branched alkyl group, and $R^{49}$ represents an alkyl group.

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of the polycycloalkane include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below:

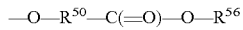

In this formula, $R^{50}$ represents a linear or branched alkylene group, and $R^{56}$ represents a tertiary alkyl group.

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

Examples of the tertiary alkyl group for $R^{56}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which $R^{56}$ in the group represented by the aforementioned general formula: —O—$R^{50}$—C(=O)—O—$R^{56}$ has been substituted with $R^{56'}$ can also be used. $R^{56'}$ represents a hydrogen atom, an alkyl group, a fluorinated alkyl group or an aliphatic cyclic group which may contain a hetero atom.

Examples of the alkyl group for $R^{56'}$ include the same groups as those described above for the alkyl group for $R^{49}$.

Examples of the fluorinated alkyl group for $R^{56'}$ include groups in which part or all of the hydrogen atoms within an aforementioned alkyl group for $R^{49}$ have each been substituted with a fluorine atom.

Examples of the aliphatic cyclic group which may contain a hetero atom for $R^{56'}$ include aliphatic cyclic groups that do not contain a hetero atom, aliphatic cyclic groups containing a hetero atom within the ring structure, and groups in which a hydrogen atom within an aliphatic cyclic group has been substituted with a hetero atom.

For $R^{56'}$, examples of the aliphatic cyclic groups that do not contain a hetero atom include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include groups represented by formulas (L1) to (L6) and (S1) to (S4) described later.

For $R^{56'}$, specific examples of the groups in which a hydrogen atom within the aliphatic cyclic group has been substituted with a hetero atom include groups in which two hydrogen atoms within an aliphatic cyclic group have been substituted with an oxygen atom (=O).

Each of $R^{6'}$, $R^{7'}$ and $R^{8'}$ in —C(=O)—O—$R^{6'}$, —O—C(=O)—$R^{7'}$, —O—$R^{8'}$ represents a linear or branched saturated hydrocarbon group of 1 to 25 carbon atoms, a cyclic saturated hydrocarbon group of 3 to 20 carbon atoms, or a linear or branched, aliphatic unsaturated hydrocarbon group of 2 to 5 carbon atoms.

The linear or branched saturated hydrocarbon group has 1 to 25 carbon atoms, preferably 1 to 15 carbon atoms, and more preferably 4 to 10 carbon atoms.

Examples of the linear saturated hydrocarbon group include a methyl group, an ethyl group, a propyl group, a butyl group, a pentyl group, a hexyl group, a heptyl group, an octyl group, a nonyl group and a decyl group.

Examples of the branched saturated hydrocarbon group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group, but excluding tertiary alkyl groups.

The linear or branched saturated hydrocarbon group may have a substituent. Examples of the substituent include an alkoxy group, a halogen atom, a halogenated alkyl group, a hydroxyl group, an oxygen atom (=O), a cyano group and a carboxyl group.

The alkoxy group as the substituent for the linear or branched saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched, saturated hydrocarbon group include a fluorine atom, a chlorine atom, a bromine atom and an iodine atom, and a fluorine atom is preferable.

Examples of the halogenated alkyl group as the substituent for the linear or branched saturated hydrocarbon group include groups in which part or all of the hydrogen atoms within an aforementioned linear or branched saturated hydrocarbon group have each been substituted with an aforementioned halogen atom.

The cyclic saturated hydrocarbon group of 3 to 20 carbon atoms for $R6'$, $R7'$ and $R8'$ may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane, and groups in which one hydrogen atom has been removed from a polycycloalkane such as adamantane, norbornane, isobornane, tricyclodecane or tetracyclododecane.

The cyclic saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

Examples of the former case include groups in which one or more hydrogen atoms have been removed from a heterocycloalkane in which a portion of the carbon atoms that constitute the ring(s) of an aforementioned monocycloalkane or polycycloalkane have been substituted with a hetero atom such as an oxygen atom, sulfur atom or nitrogen atom. Further, the ring may contain an ester bond (—C(=O)—O—). More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter case, examples of the substituent include the same substituents as those described above for the linear or branched alkyl group, and a lower alkyl group.

Alternatively, $R^{6'}$, $R^{7'}$ and $R^{8'}$ may be a combination of a linear or branched alkyl group and a cyclic alkyl group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the linear aliphatic unsaturated hydrocarbon group for $R^{6'}$, $R^{7'}$ and $R^{8'}$ include a vinyl group, a propenyl group (an allyl group) and a butynyl group.

Examples of the branched aliphatic unsaturated hydrocarbon group for $R^{6'}$, $R^{7'}$ and $R^{8'}$ include a 1-methylpropenyl group and a 2-methylpropenyl group.

The aforementioned linear or branched, aliphatic unsaturated hydrocarbon group may have a substituent. Examples of the substituents include the same substituents as those which the aforementioned linear or branched alkyl group may have.

Of the various possibilities described above, as $R^{7\prime}$ and $R^{8\prime}$, a linear or branched saturated hydrocarbon group of 1 to 15 carbon atoms or a cyclic saturated hydrocarbon group of 3 to 20 carbon atoms is preferable, as such groups yield superior lithography properties and resist pattern shape.

The aryl group for each of $R^{1\prime\prime}$ to $R^{3\prime\prime}$ is preferably a phenyl group or a naphthyl group.

Examples of the alkyl group for $R^{1\prime\prime}$ to $R^{3\prime\prime}$ include linear, branched or cyclic alkyl groups of 1 to 10 carbon atoms. Of these, in terms of achieving excellent resolution, an alkyl group of 1 to 5 carbon atoms is preferred. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkenyl group for $R^{1\prime\prime}$ to $R^{3\prime\prime}$ preferably has 2 to 10 carbon atoms, more preferably 2 to 5 carbon atoms, and still more preferably 2 to 4 carbon atoms. Specific examples thereof include a vinyl group, a propenyl group (allyl group), a butynyl group, a 1-methylpropenyl group and a 2-methylpropenyl group.

When two of $R^{1\prime\prime}$ to $R^{3\prime\prime}$ are bonded to each other to form a ring with the sulfur atom shown in the formula, it is preferable that the two of $R^{1\prime\prime}$ to $R^{3\prime\prime}$ form a 3 to 10-membered ring including the sulfur atom, and it is particularly desirable that the two of R1" to R3" form a 5 to 7-membered ring including the sulfur atom.

When two of R1" to R3" are bonded to each other to form a ring with the sulfur atom shown in the formula, the remaining one of R1" to R3" is preferably an aryl group. As examples of the aryl group, the same aryl groups as those described above for R1" to R3" can be used.

Specific examples of the cation moiety within the compound represented by the above general formula (b-1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methyl phenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

Further, specific examples of the preferred cation moiety for the compound represented by the above formula (b-1) include the cation moieties shown below.

[Chemical Formula 51]

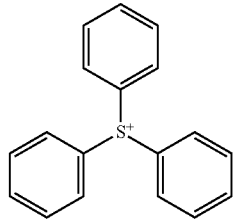

(b-1-1)

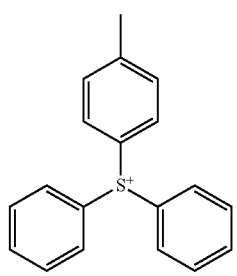

(b-1-2)

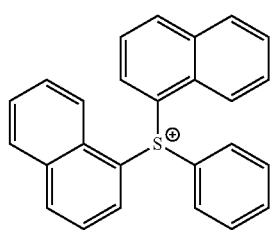

(b-1-3)

[Chemical Formula 52]

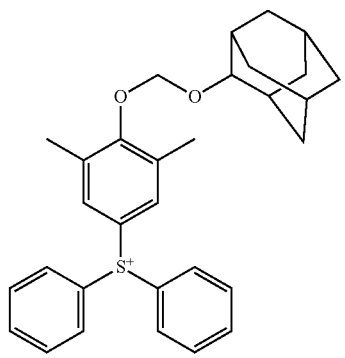

(b-1-4)

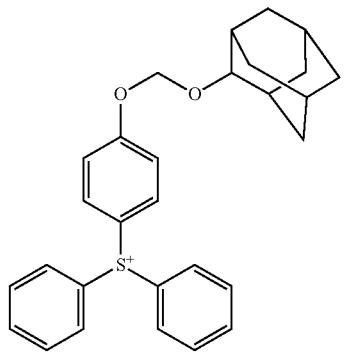

(b-1-5)

(b-1-6)
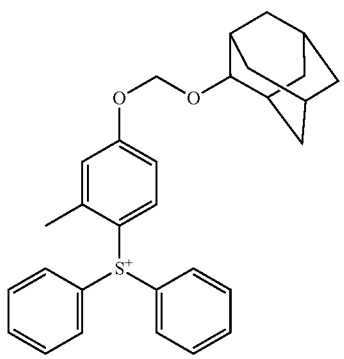
[Chemical Formula 53]
(b-1-7)
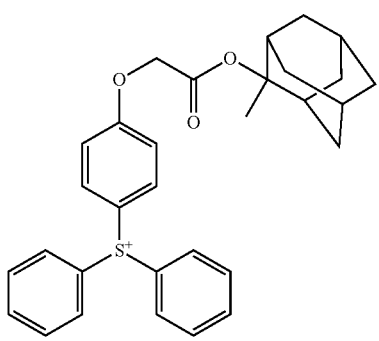
(b-1-8)
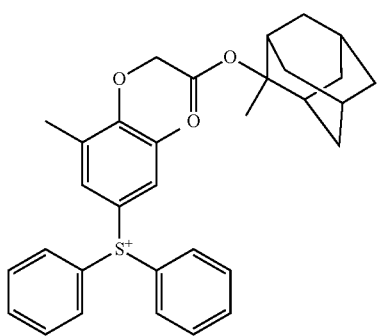
(b-1-9)
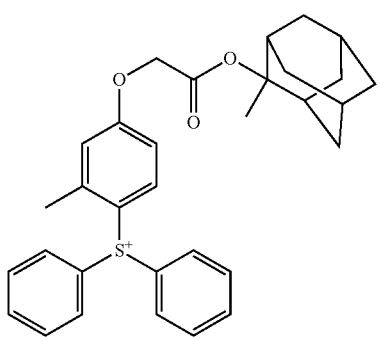
(b-1-10)
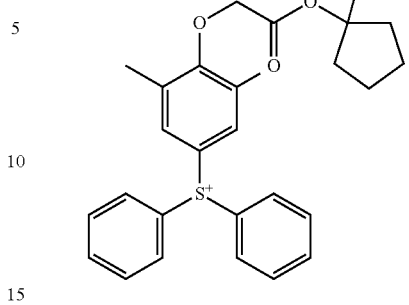
(b-1-11)
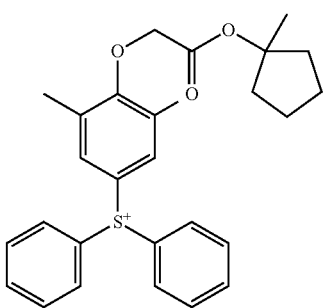
(b-1-12)
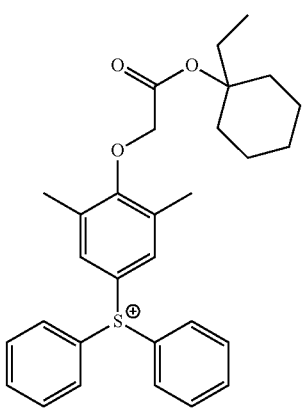
(b-1-13)
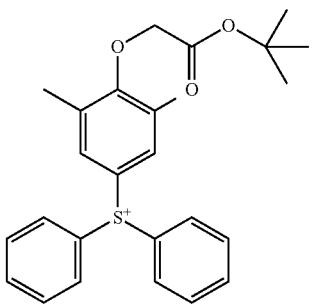

[Chemical Formula 54]
(b-1-14)
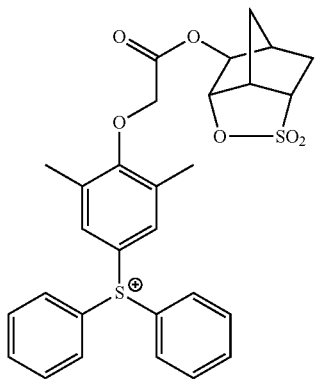
(b-1-15)
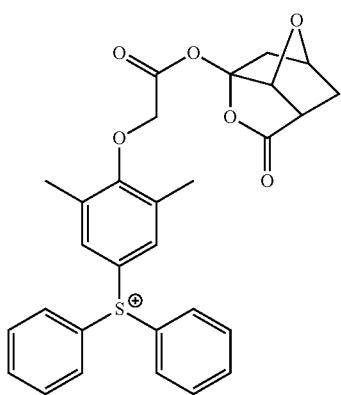
(b-1-16)
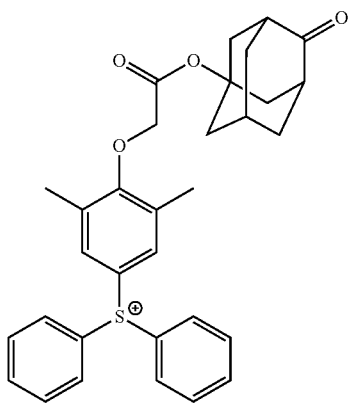
(b-1-17)
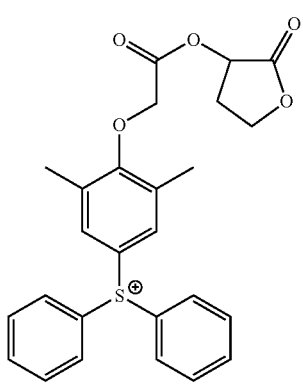
(b-1-18)
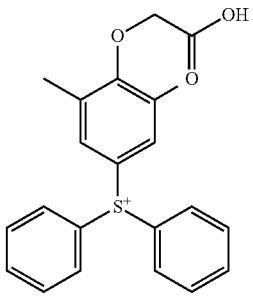
(b-1-19)
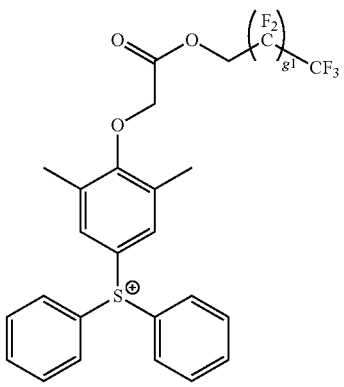
In the above formula, g1 represents the number of repeating units, and is typically an integer of 1 to 5.
[Chemical Formula 55]
(b-1-20)
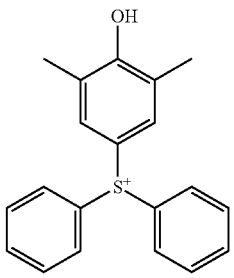
(b-1-21)
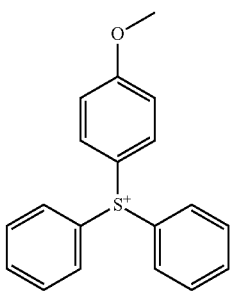

(b-1-22)
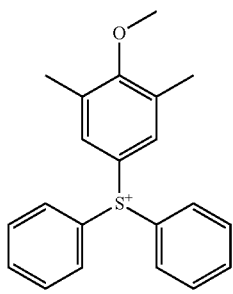
[Chemical Formula 56]
(b-1-23)
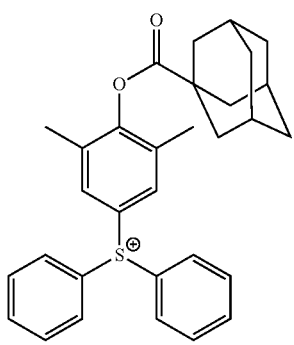
(b-1-24)
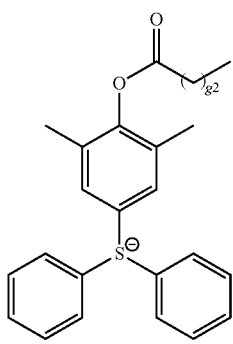
(b-1-25)
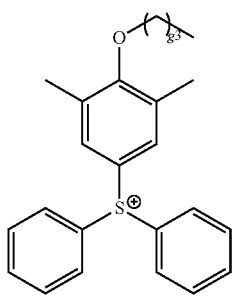
In the above formulas, g2 and g3 represent numbers of repeating units, wherein g2 is an integer of 0 to 20, and g3 is an integer of 0 to 20.
[Chemical Formula 57]
(b-1-26)
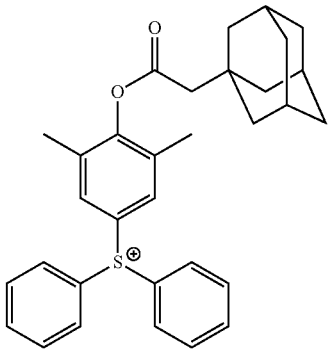
(b-1-27)
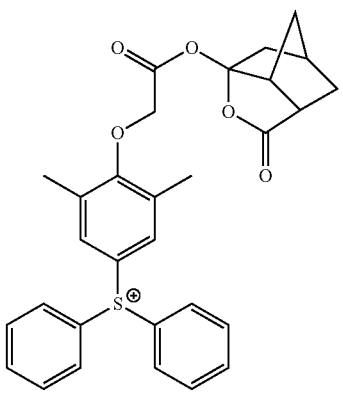
(b-1-28)
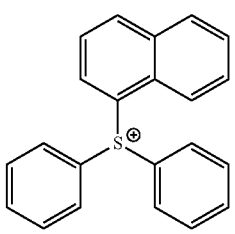
[Chemical Formula 58]
(b-1-29)
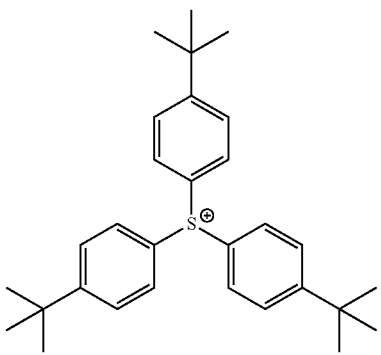

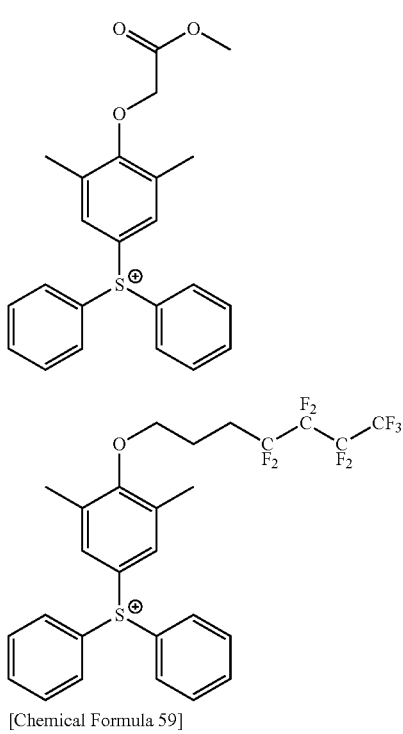

(b-1-30)

(b-1-31)

[Chemical Formula 59]

(b-1-32)

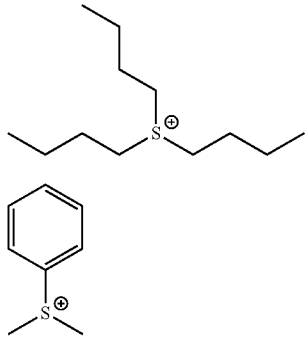

(b-1-33)

In the above formula (b-1), $R^{4'''}$ represents an alkyl group, halogenated alkyl group, aryl group or alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the halogen atom include a fluorine atom, a chlorine atom, a bromine atom and an iodine atom, and a fluorine atom is preferable.

In the halogenated alkyl group, the percentage of the number of halogen atoms relative to the total number of halogen atoms and hydrogen atoms within the halogenated alkyl group (namely, the halogenation ratio (%)) is preferably within a range from 10 to 100%, more preferably from 50 to 100%, and most preferably 100%. Higher halogenation ratios are preferable, as they result in increased acid strength.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part or all of the hydrogen atoms within the alkyl group, halogenated alkyl group, aryl group or alkenyl group may each be substituted with a substituent (an atom other than a hydrogen atom, or a group).

$R^{4'''}$ may have one substituent, or two or more substituents.

Examples of the substituent include a halogen atom, a hetero atom, an alkyl group, and a group represented by the formula $R^X$-$Q^1$- (in the formula, $Q^1$ represents a divalent linking group containing an oxygen atom, and $R^X$ represents a hydrocarbon group of 3 to 30 carbon atoms which may have a substituent).

Examples of the halogen atom and alkyl group include the same halogen atoms and alkyl groups as those described above with respect to the halogenated alkyl group for $R^{4'''}$.

Examples of the hetero atom include an oxygen atom, a nitrogen atom, and a sulfur atom.

In the group represented by formula $R^X$-$Q^1$-, $Q^1$ represents a divalent linking group containing an oxygen atom.

$Q^1$ may contain an atom other than the oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amide bond (—C(=O)—NH—), a carbonyl group (—C(=O)—) and a carbonate bond (—O—C(=O)—O—); and combinations of the aforementioned non-hydrocarbon, oxygen atom-containing linking groups with an alkylene group.

Specific examples of the combinations of the aforementioned non-hydrocarbon, oxygen atom-containing linking groups and an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

$Q^1$ is preferably a divalent linking group containing an ester bond or ether bond, and more preferably a group represented by —$R^{91}$—O—, —$R^{92}$—O—C(=O)— or —C(=O)—O—$R^{93}$—O—C(=O)—.

In the group represented by the formula $R^X\text{-}Q^1\text{-}$, the hydrocarbon group for $R^X$ may be either an aromatic hydrocarbon group or an aliphatic hydrocarbon group.

The aromatic hydrocarbon group is a hydrocarbon group having an aromatic ring. The aromatic hydrocarbon group preferably has 5 to 30 carbon atoms, more preferably 5 to 20 carbon atoms, still more preferably 6 to 15 carbon atoms, and most preferably 6 to 12 carbon atoms. Here, this number of carbon atoms does not include any carbon atoms within any substituents.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for $R^X$ may be either a saturated aliphatic hydrocarbon group or an unsaturated aliphatic hydrocarbon group. Further, the aliphatic hydrocarbon group may be linear, branched or cyclic.

In the aliphatic hydrocarbon group for $R^X$, a portion of the carbon atoms that constitute the aliphatic hydrocarbon group may be substituted with a substituent containing a hetero atom, or part or all of the hydrogen atoms that constitute the aliphatic hydrocarbon group may each be substituted with a substituent containing a hetero atom.

As the "hetero atom" for $R^X$, there is no particular limitation as long as it is an atom other than a carbon atom and a hydrogen atom. Examples of hetero atoms include a halogen atom, an oxygen atom, a sulfur atom and a nitrogen atom.

Examples of halogen atoms include a fluorine atom, a chlorine atom, an iodine atom and a bromine atom.

The substituent containing a hetero atom may consist solely of the hetero atom, or may be a group that also contains a group or atom other than the hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)2- and —S(=O)2-O—. When the aliphatic hydrocarbon group is cyclic, any of these substituents may be included within the ring structure of the aliphatic hydrocarbon group.

Examples of the substituent for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, or a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure thereof, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure thereof, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 60]

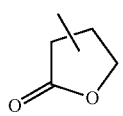
(L1)

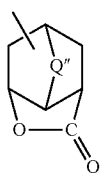
(L2)

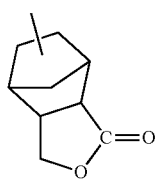
(L3)

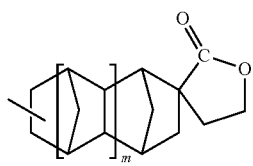
(L4)

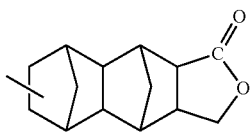
(L5)

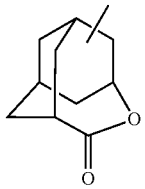
(L6)

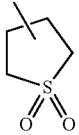
(S1)

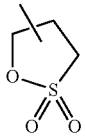
(S2)

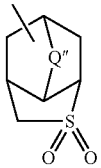
(S3)

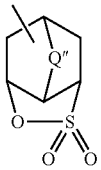
(S4)

In the formulas, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents an integer of 0 or 1.

Examples of the alkylene groups for Q", $R^{94}$ and $R^{95}$ include the same alkylene groups as those described above for $R^{91}$ to $R^{93}$.

In these aliphatic cyclic groups, part of the hydrogen atoms bonded to the carbon atoms constituting the ring structure may be substituted with a substituent. Examples of the substituent include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

Examples of the alkoxy group and the halogen atom include the same groups and atoms as those listed above for the substituent used for substituting part or all of the hydrogen atoms.

Among the examples described above, as $R^x$, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, an aliphatic polycyclic group which may have a substituent is preferable. As this polycyclic aliphatic cyclic group, groups in which one or more hydrogen atoms have been removed from an aforementioned polycycloalkane, and groups represented by the above formulas (L2) to (L5), and (S3) and (S4) are preferable.

Further, it is particularly desirable that $R^X$ have a polar moiety, because it results in improved lithography properties and resist pattern shape.

Specific examples of $R^X$ having a polar moiety include those in which a part of the carbon atoms constituting the aliphatic hydrocarbon group for X is substituted with a substituent group containing a hetero atom such as —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—.

Among the above possibilities, $R^{4''}$ is preferably a group having $R^X$-$Q^1$- as a substituent. In such cases, $R^{4''}$ is preferably a group represented by the formula $R^X$-$Q^1$-$Y^1$— (wherein $Q^1$ and $R^X$ are the same as defined above, and $Y^1$ represents an alkylene group of 1 to 4 carbon atoms which may have a substituent, or a fluorinated alkylene group of 1 to 4 carbon atoms which may have a substituent).

In the group represented by the formula $R^X$-$Q^1$-$Y^1$—, as the alkylene group for $Y^1$, the same alkylene group as those described above for $Q^1$ in which the number of carbon atoms is 1 to 4 can be used.

Examples of the fluorinated alkylene group for $Y^1$ include groups in which part or all of the hydrogen atoms of an above-mentioned alkylene group have each been substituted with a fluorine atom.

Specific examples of $Y^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—, —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—, —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)— and —C(CH$_3$)(CH$_2$CH$_3$)—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CH$_2$CF$_2$—, —CH$_2$CH$_2$CF$_2$—, —CH$_2$CF$_2$CF$_2$—, —CH$_2$CH$_2$CH$_2$CF$_2$—, —CH$_2$CH$_2$CF$_2$CF$_2$— and —CH$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may each be substituted, either with an atom other than a hydrogen atom or fluorine atom, or with a group.

Examples of substituents which the alkylene group or fluorinated alkylene group may have include an alkyl group of 1 to 4 carbon atoms, an alkoxy group of 1 to 4 carbon atoms, and a hydroxyl group.

In the above formula (b-2), each of $R^{5''}$ and $R^{6''}$ independently represents an aryl group, alkyl group or alkenyl group which may have a substituent.

Further, in terms of achieving better improvement in the lithography properties and the resist pattern shape, it is preferable that at least one of $R^{5''}$ and $R^{6''}$ is an aryl group, and more preferable that both of $R^{5''}$ and $R^{6''}$ are aryl groups.

Examples of the aryl group for $R^{5''}$ and $R^{6''}$ include the same aryl groups as those described for $R^{1''}$ to $R^{3''}$.

Examples of the alkyl group for $R^{5''}$ and $R^{6''}$ include the same alkyl groups as those described for $R^{1''}$ to $R^{3''}$.

Examples of the alkenyl group for $R^{5''}$ and $R^{6''}$ include the same alkenyl groups as those described for $R^{1''}$ to $R^{3''}$.

Among the various possibilities, the case in which $R^{5''}$ and $R^{6''}$ are both phenyl groups is the most desirable.

Specific examples of the cation moiety within the compound represented by the above formula (b-2) include diphenyliodonium and bis(4-tert-butylphenyl)iodonium.

Examples of $R^{4''}$ within the formula (b-2) include the same groups as those described above for $R^{4''}$ within the formula (b-1).

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)

tetrahydrothiophenium trifluoromethanesulfonate, heptafluoropropanesulfonate or nonafluorobutanesulfonate; 1-(4-methoxynaphthalen-1-yl)tetrahydrothiophenium trifluoromethanesulfonate, heptafluoropropanesulfonate or nonafluorobutanesulfonate; 1-(4-ethoxynaphthalen-1-yl)tetrahydrothiophenium trifluoromethanesulfonate, heptafluoropropanesulfonate or nonafluorobutanesulfonate; 1-(4-n-butoxynaphthalen-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate such as methanesulfonate, n-propanesulfonate, n-butanesulfonate, n-octanesulfonate, 1-adamantanesulfonate, or 2-norbornanesulfonate; or a sulfonate such as d-camphor-10-sulfonate, benzenesulfonate, perfluorobenzenesulfonate, or p-toluenesulfonate.

Further, onium salts in which the anion moiety of these onium salts has been replaced by an anion moiety represented by any one of formulas (b1) to (b8) shown below can also be used.

[Chemical Formula 61]

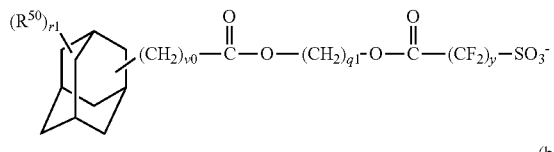

(b1)

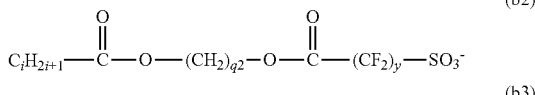

(b2)

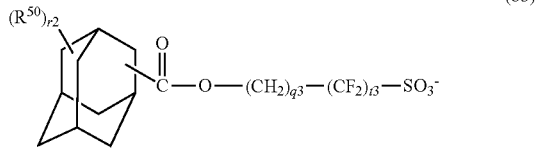

(b3)

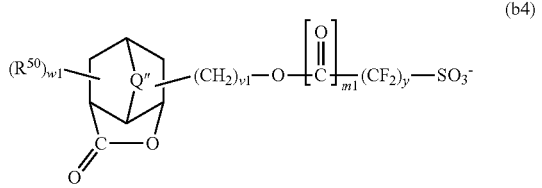

(b4)

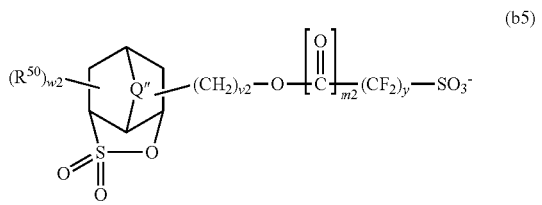

(b5)

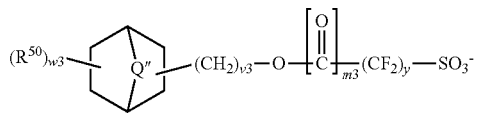

(b6)

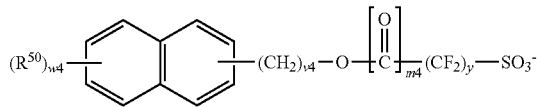

(b7)

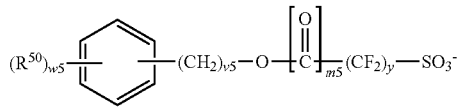

(b8)

In the formulas, y represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, i represents an integer of 1 to 20, $R^{50}$ represents a substituent, each of m1 to m5 independently represents 0 or 1, each of v0 to v5 independently represents an integer of 0 to 3, each of w1 to w5 independently represents an integer of 0 to 3, and Q″ is the same as defined above.

Examples of the substituent for $R^{50}$ include the same groups as those which the aforementioned aliphatic hydrocarbon group or aromatic hydrocarbon group for $R^X$ may have as a substituent.

If there are two or more $R^{50}$ groups, as indicated by the values r1, r2, and w1 to w5, then the plurality of $R^{50}$ groups within the compound may be the same or different from each other.

Further, onium salt-based acid generators in which the anion moiety ($R^{4''}SO_3^-$) in the above general formula (b-1) or (b-2) has been replaced with an anion moiety represented by general formula (b-3) or (b-4) shown below (but in which the cation moiety is the same as the cation moiety shown in the above formula (b-1) or (b-2)) can also be used favorably as the onium salt-based acid generator.

[Chemical Formula 62]

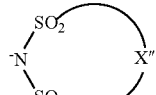

(b-3)

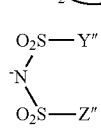

(b-4)

In the formulas, X″ represents an alkylene group of 2 to 6 carbon atoms in which at least one hydrogen atom has been substituted with a fluorine atom, and each of Y″ and Z″ independently represents an alkyl group of 1 to 10 carbon atoms in which at least one hydrogen atom has been substituted with a fluorine atom.

X″ represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all the hydrogen atoms are substituted with fluorine atoms.

Further, an onium salt-based acid generator in which the anion moiety ($R^{4"}SO_3^-$) in general formula (b-1) or (b-2) has been replaced with $R^h$—$COO^-$ (in the formula, $R^h$ represents an alkyl group or a fluorinated alkyl group) can also be used (the cation moiety is the same as that in general formula (b-1) or (b-2)).

Examples of $R^h$ in the above formula include the same groups as those listed above for $R^{4"}$.

Specific examples of the group represented by the formula "$R^h$—$COO^-$" include a trifluoroacetic acid ion, an acetic acid ion, and a 1-adamantanecarboxylic acid ion.

Furthermore, as an onium salt-based acid generator, a sulfonium salt having a cation represented by general formula (b-5) or (b-6) shown below as the cation moiety may also be used.

[Chemical Formula 63]

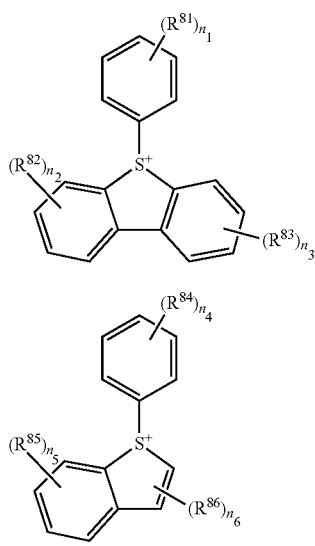

(b-5)

(b-6)

In the formulas, each of $R^{81}$ to $R^{86}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{81}$ to $R^{86}$, the alkyl group is preferably an alkyl group of 1 to 5 carbon atoms, more preferably a linear or branched alkyl group, and most preferably a methyl group, an ethyl group, a propyl group, an isopropyl group, a n-butyl group or a tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{81}$ to $R^{86}$ group, as indicated by the corresponding value of n1 to n6, then the two or more of the individual $R^{81}$ to $R^{86}$ group may be the same or different from each other.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Preferable examples of the cation represented by the above formula (b-5) or (b-6) are shown below.

[Chemical Formula 64]

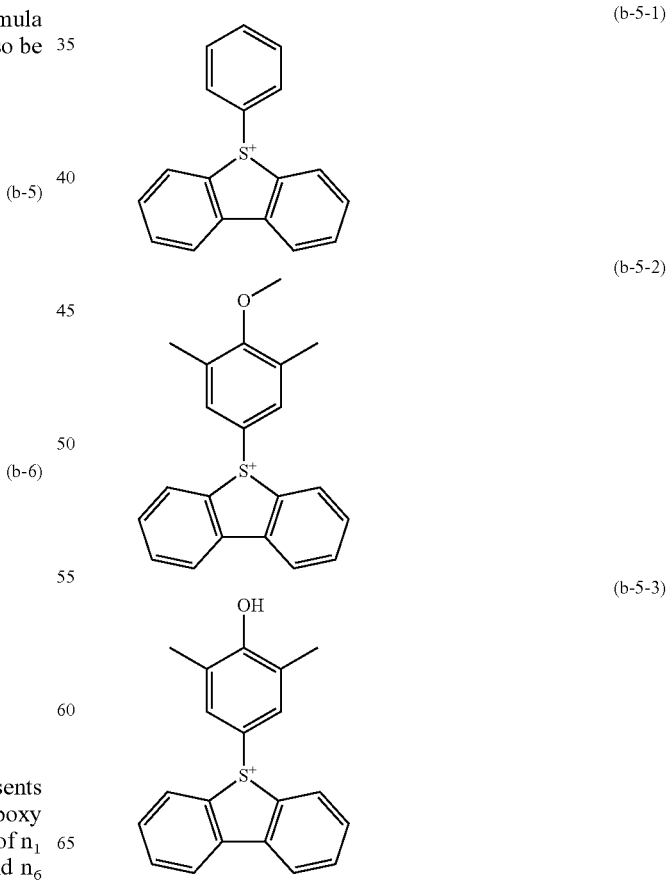

(b-5-1)

(b-5-2)

(b-5-3)

(b-5-4)

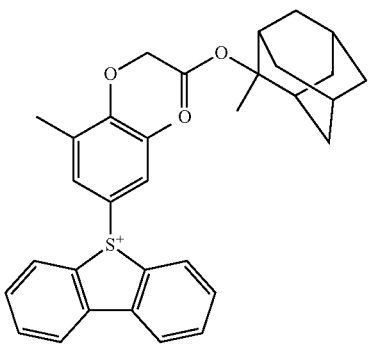

(b-5-5)

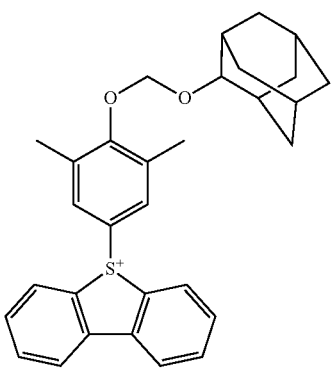

(b-5-6)

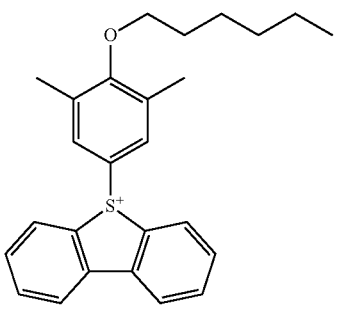

(b-6-1)

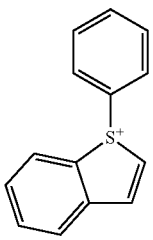

(b-6-2)

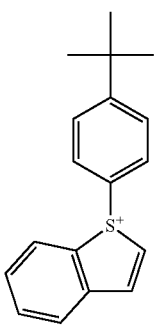

Furthermore, a sulfonium salt having a cation represented by general formula (b-7) or (b-8) shown below as the cation moiety may also be used.

[Chemical Formula 65]

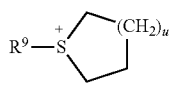

(b-7)

(b-8)

In formulas (b-7) and (b-8), each of $R^9$ and $R^{10}$ independently represents a phenyl group or naphthyl group which may have a substituent, an alkyl group of 1 to 5 carbon atoms, an alkoxy group or a hydroxyl group. Examples of the substituent include the same substituents as those described above for the substituted aryl groups mentioned within the description relating to the aryl groups for $R^{1\prime\prime\prime}$ to $R^{3\prime\prime\prime}$ (such as an alkyl group, an alkoxy group, an alkoxyalkyloxy group, an alkoxycarbonylalkyloxy group, a halogen atom, a hydroxyl group, an oxo group (=O), an aryl group, —C(=O)—O—$R^{6t}$, —O—C(=O)—$R^{7t}$, —O—$R^{8t}$, and a group represented by the above general formula —O—$R^{50}$—C(=O)—O—$R^{56}$ in which $R^{56}$ has been substituted with $R^{56t}$).

$R^{4t}$ represents an alkylene group of 1 to 5 carbon atoms.

u is an integer of 1 to 3, and most preferably 1 or 2.

Preferable examples of the cation represented by the above formula (b-7) or (b-8) are shown below. In the formulas below, $R^C$ represents a substituent mentioned above within the description relating to the substituted aryl group (namely, an alkyl group, an alkoxy group, an alkoxyalkyloxy group, an alkoxycarbonylalkyloxy group, a halogen atom, a hydroxyl group, an oxo group (=O), an aryl group, —C(=O)—O—$R^{6t}$, —O—C(=O)—$R^{7t}$ and —O—$R^{8t}$).

[Chemical Formula 66]

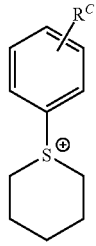

(b-7-1)

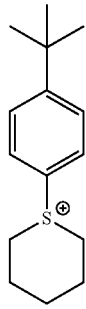

(b-7-2)

(b-7-3)

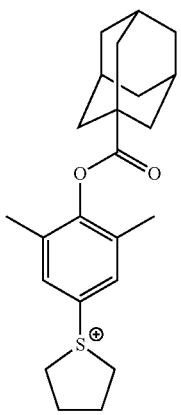

(b-7-4)

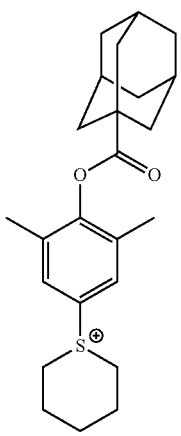

(b-7-5)

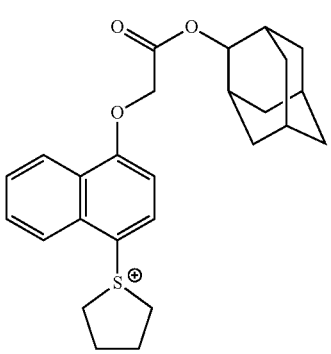

[Chemical Formula 67]

(b-8-1)

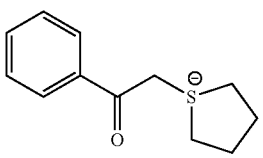

(b-8-2)

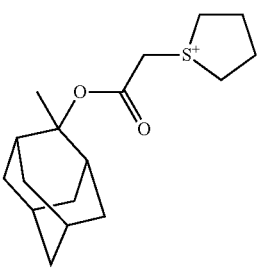

The anion moiety of the sulfonium salt having a cation represented by general formulas (b-5) to (b-8) for the cation moiety is not particularly limited, and the same anion moieties for onium salt-based acid generators which have been proposed may be used. Examples of such anion moieties include fluorinated alkylsulfonic acid ions such as anion moieties ($R^{4"}SO_3^-$) for onium salt-based acid generators represented by general formula (b-1) or (b-2) shown above; anion moieties represented by general formula (b-3) or (b-4) shown above; and anion moieties represented by any one of formulas (b1) to (b8) shown above.

In the present description, an oxime sulfonate-based acid generator is a compound having at least one group represented by general formula (B-1) shown below, and has a feature of generating acid upon irradiation (exposure). Such oxime sulfonate-based acid generators are widely used for a chemically amplified resist composition, and can be selected as appropriate.

[Chemical Formula 68]

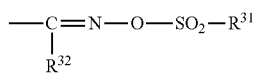

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

The organic group for $R^{31}$ is preferably a linear, branched or cyclic alkyl group, or an aryl group. The alkyl group or the aryl group may have a substituent. The substituent is not particularly limited, and examples thereof include a fluorine atom and a linear, branched, or cyclic alkyl group having 1 to 6 carbon atoms. The expression that the alkyl group or aryl group "may have a substituent" means that part or all of the hydrogen atoms of the alkyl group or aryl group may each be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

The organic group for $R^{32}$ is preferably a linear, branched or cyclic alkyl group, an aryl group, or a cyano group. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 69]

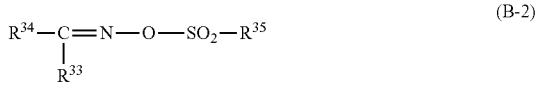

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 70]

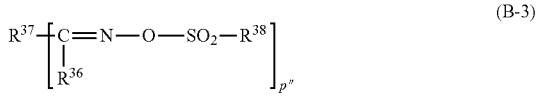

(B-3)

In the formula, $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group described above for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, the following compounds may also be used as preferred examples.

[Chemical Formula 71]

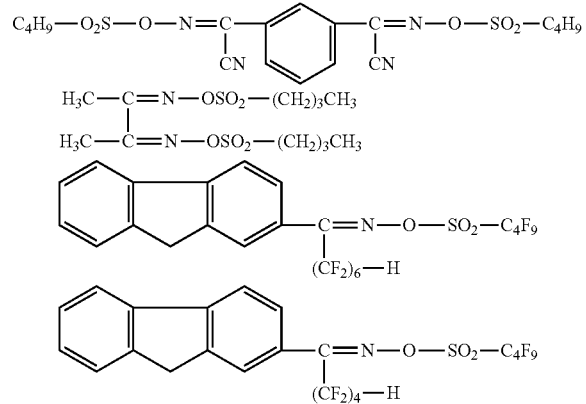

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or two or more types of acid generators may be used in combination.

In the resist composition of the present invention, the amount of the component (B) is preferably 0.5 to 60 parts by weight, more preferably 1 to 50 parts by weight, and still more preferably 1 to 40 parts by weight, relative to 100 parts by weight of the component (A). When the amount of the component (B) is within the above-mentioned range, formation of a resist pattern can be satisfactorily performed. Further, by virtue of the above-mentioned range, when each component of the resist composition is dissolved in an organic solvent, a uniform solution can be obtained and the storage stability tends to improve, which is desirable.

<Optional Components>

[Component (D)]

In the present invention, the resist composition may also contain a nitrogen-containing organic compound component (D) (hereafter, referred to as the component (D)), other than the aforementioned components (A) and (B), as long as the effects of the present invention are not impaired.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used. Examples of these conventional compounds include amines such as aliphatic amines and aromatic amines, and of these, an aliphatic amine, and particularly a secondary aliphatic amine or tertiary aliphatic amine, is preferable.

An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of 1 to 20 carbon atoms (i.e., alkylamines or alkyl alcohol amines), and cyclic amines.

The alkyl group for the above alkyl groups and hydroxyalkyl groups may be any of linear, branched or cyclic.

When the alkyl group is a linear or branched group, the group preferably contains 2 to 20 carbon atoms, and more preferably 2 to 8 carbon atoms.

When the alkyl group is a cyclic group (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Specific examples thereof include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane.

Specific examples of the alkylamines include monoalkylamines such as n-hexylamine, n-heptylamine, n-octylamine, n-nonylamine and n-decylamine; dialkylamines such as diethylamine, di-n-propylamine, di-n-heptylamine, di-n-octylamine and dicyclohexylamine; and trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine and tri-n-dodecylamine.

Specific examples of the alkyl alcohol amines include diethanolamine, triethanolamine, diisopropanolamine, triisopropanolamine, di-n-octanolamine, tri-n-octanolamine, stearyldiethanolamine and lauryldiethanolamine.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

These compounds can be used either alone, or in combinations of two or more different compounds.

The component (D) is typically used in an amount within a range from 0.01 to 5.0 parts by weight, relative to 100 parts by weight of the component (A). By ensuring that the amount of the component (D) is within the aforementioned range, the shape of the resist pattern and the post exposure stability of the latent image formed by the pattern-wise exposure of the resist layer are improved.

[Component (E)]

Furthermore, for preventing any deterioration in sensitivity, and improving the resist pattern shape and the post exposure stability of the latent image formed by the pattern-wise exposure of the resist layer, the resist composition of the present invention may contain at least one compound (E) (hereafter referred to as "component (E)") selected from the group consisting of organic carboxylic acids, and phosphorus oxo acids and derivatives thereof as an optional component.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenyl phosphonate, diphenyl phosphonate and dibenzyl phosphonate.

Examples of phosphinic acid derivatives include phenylphosphinic acid and phosphinic acid esters.

As the component (E), one type may be used alone, or two or more types may be used in combination.

The component (E) is typically used in an amount within a range from 0.01 to 5.0 parts by weight, relative to 100 parts by weight of the component (A).

[Component (F)]

The resist composition of the present invention may further include a fluorine additive (hereafter, referred to as "component (F)") for imparting water repellency to the resist film. By further including the component (F), the hydrophobicity of the resist film surface can be enhanced, and the occurrence of defects following development can be further suppressed.

As the component (F), for example, a fluorine-containing polymeric compound described in Japanese Unexamined Patent Application, First Publication No. 2010-002870 or the like can be used.

Specific preferred examples of the component (F) include copolymers having a structural unit represented by general formula (f1) shown below. More specifically, the component (F) is preferably a polymer (homopolymer) consisting solely of a structural unit represented by formula (f1) shown below; a copolymer of a structural unit represented by formula (f1) shown below and the aforementioned structural unit (a1); or a copolymer of a structural unit represented by formula (f1) shown below, a structural unit derived from acrylic acid or methacrylic acid and the aforementioned structural unit (a1).

Among the structural units included within the definition of the structural unit (a1), a structural unit represented by the aforementioned formula (a1-1-32) is particularly desirable.

[Chemical Formula 72]

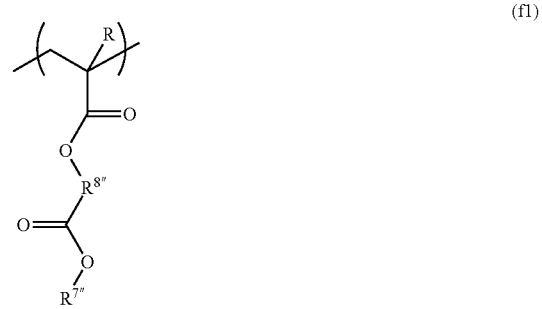

(f1)

In the formula, R represents a hydrogen atom, an alkyl group of 1 to 5 carbon atoms or a halogenated alkyl group of 1 to 5 carbon atoms; $R^{7\prime\prime}$ represents an organic group containing a fluorine atom; and $R^{8\prime\prime}$ represents an alkylene group of 1 to 5 carbon atoms which may have a substituent.

In the above formula (f1), $R^{7\prime\prime}$ represents an organic group containing a fluorine atom, and is preferably a hydrocarbon group containing a fluorine atom. The hydrocarbon group containing a fluorine atom is preferably a fluorinated alkyl group, and more preferably a fluorinated alkyl group of 1 to 5 carbon atoms. Among these, as $R^{7\prime\prime}$, a group represented by the formula "—$(CH_2)o$-$CF_3$" is preferable (in the formula, o represents the number of repetitions of $CH_2$, and is an integer of 1 to 3).

In formula (f1), the alkylene group for $R^{8\prime\prime}$ has 1 to 5 carbon atoms, preferably 1 to 3 carbon atoms, and more preferably 1 or 2 carbon atoms. The hydrogen atom of the alkylene group for $R^{8\prime\prime}$ may be substituted with a fluorine atom, an alkyl group of 1 to 5 carbon atoms or a fluorinated alkyl group of 1 to 5 carbon atoms.

In formula (f1), R is the same as defined above. As R, a hydrogen atom or a methyl group is preferable.

As the component (F), one type may be used alone, or two or more types may be used in combination.

The component (F) in the resist composition is preferably used in an amount within a range from 1 to 10 parts by weight, relative to 100 parts by weight of the component (A). When the amount of the component (F) is within the above-mentioned range, the hydrophobicity of the resist film surface can be enhanced, and the occurrence of defects following development can be further suppressed.

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The resist composition of the present invention can be prepared by dissolving the materials for the resist composition in an organic solvent (hereinafter frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as a mixed solvent containing two or more solvents.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Alternatively, when PGME and cyclohexanone are mixed as the polar solvents, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of PGMEA, EL or an aforementioned mixed solvent of PGMEA and a polar solvent, with γ-butyrolactone is also preferable. In this case, the mixing ratio (former:latter) of such a mixed solvent is preferably from 70:30 to 95:5.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

The above-mentioned resist composition of the present invention exhibits excellent resolution, enables to suppress the occurrence of defects following development, and also exhibits excellent lithography properties and resist pattern shape. The reason why these effects can be achieved has not been elucidated yet, but is presumed as follows.

The resist composition of the present invention contains, as the base component (A), the resin component (A1) including the structural unit (a0) represented by the general formula (a0-1) and the structural unit (a1) containing an acid decomposable group that exhibits increased polarity under the action of acid, wherein the amount of the structural unit (a0) is less than 50 mol %.

By including the structural unit (a0) containing —C(=O)—NH— and —SO$_2$— containing cyclic group within the side chain, as well as the structural unit (a1), the polarity of the component (A1) increases compared to the case of containing —C(=O)—O— and —SO$_2$— containing cyclic group within the side chain, and thus the diffusion of the acid generated from the component (B) upon exposure is further suppressed. It is thought that, as a result, high resolution can be achieved for the resist composition of the present invention.

Further, by including the structural unit (a0) in addition to the structural unit (a1), the hydrophilicity of the resist film surface can be enhanced. For this reason, when rinsed with water after the alkali developing, for example, precipitation of the base resin components dissolved in an alkali developing solution and their subsequent deposition on the resist pattern surface with high hydrophobicity (that is, the occurrence of defects known as Blobs) can be suppressed. It is thought that, as a result, the resist composition of the present invention enables to suppress the occurrence of defects.

On the other hand, by including the structural unit (a0), when the polarity of the component (A1)) becomes too high, the solubility in an organic solvent for the resist (component (S)) decreases, thereby making various lithography properties or resist pattern shape prone to deterioration. In the resist composition of the present invention, by ensuring that the amount of the structural unit (a0) based on the combined total of all structural units constituting the component (A1) is less than 50 mol %, the polarity of the component (A1) does not increase too much, thereby maintaining the solubility in an organic solvent for the resist (component (S)) at a favorable level. In addition, the diffusion of acid generated from the component (B) upon exposure can be suppressed. It is thought that, as a result, excellent lithography properties as well as a favorable resist pattern shape with high rectangularity can be achieved for the resist composition of the present invention.

The hydrophobicity and hydrophilicity of a resist film can be evaluated by measuring the contact angles relative to water, such as the static contact angle (the contact angle between the surface of a water droplet on the resist film in a horizontal state and the resist film surface), and the dynamic contact angles (including the contact angle at which a water droplet starts to slide when the resist film is inclined (the sliding angle), the contact angle at the front-end point of the water droplet in the sliding direction (the advancing angle), and the contact angle at the rear-end point of the water droplet in the sliding direction (the receding angle)). The higher the hydrophobicity of the resist film, the larger the static contact angle, the advancing angle and the receding angle, and the smaller the sliding angle.

Subsequently, various angles described above (dynamic contact angles (such as the advancing angle, the receding angle and the sliding angle) and static contact angles) can be measured using commercially available measurement apparatuses such as DROP MASTER-700 (product name; manufactured by Kyowa Interface Science Co., Ltd.), AUTO SLIDING ANGLE: SA-30 DM (product name; manufactured by Kyowa Interface Science Co., Ltd.), and AUTO DISPENSER: AD-31 (product name; manufactured by Kyowa Interface Science Co., Ltd.).

<<Method of Forming a Resist Pattern>>

The method of forming a resist pattern according to the present invention includes: using the aforementioned resist composition of the present invention to form a resist film on a substrate; conducting exposure of the resist film; and developing the resist film to form a resist pattern.

More specifically, the method of forming a resist pattern according to the present invention can be performed, for example, as follows.

First, the resist composition of the present invention is applied onto a substrate using a spinner or the like, and a bake treatment (post applied bake (PAB)) is conducted under temperature conditions of 80 to 150° C. for 40 to 120 seconds, and preferably 60 to 90 seconds to form a resist film.

Subsequently, the resist film is selectively exposed using an exposure apparatus such as an ArF exposure apparatus, an electron beam lithography apparatus or an EUV exposure apparatus, either by irradiation through a mask having a predetermined pattern formed therein (namely, a mask pattern), or by patterning via direct irradiation with an electron beam without using a mask pattern, and the resist film is then subjected to a bake treatment (post exposure bake (PEB)) under temperature conditions of 80 to 150° C. for 40 to 120 seconds, and preferably 60 to 90 seconds.

Next, the resist film is subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing an organic solvent.

In the case of a solvent developing process, residual developing solution or rinse liquid adhered onto the pattern following the developing treatment or rinse treatment may be removed using a supercritical fluid.

Drying is performed following the developing treatment or rinse treatment. Further, in some cases, a bake treatment (post bake) may be performed following the developing treatment. In this manner, a resist pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (a lower-layer organic film) and at least one layer of a resist film (an upper-layer resist film) are provided on a substrate, and a resist pattern formed on the upper-layer resist film is used as a mask to conduct patterning of the lower-layer organic film. This method is considered as being capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (triple-layer resist method).

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is particularly effective for use with a KrF excimer laser, ArF excimer laser, EB or EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethylammonium hydroxide (TMAH).

The organic solvent within the organic developing solution that is used in the solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon-based solvents.

If required, known additives can be added to the organic developing solution. Examples of these additives include surfactants. There are no particular limitations on the surfactants, and ionic and nonionic fluorine-based surfactants and/or silicon-based surfactants can be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinse treatment performed following the developing treatment in a solvent developing process include those organic solvents among the solvents described above for the organic solvent of the organic developing solution which exhibit poor dissolution of the resist pattern. In general, at least one type of solvent selected from amongst hydrocarbon-based solvents, ketone-based solvents, ester-based solvents, alcohol-based solvents, amide-based solvents and ether-based solvents is used. Among these, at least one solvent selected from among hydrocarbon-based solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

<<Polymeric Compound>>

The polymeric compound of the present invention is a compound including the structural unit (a0) represented by general formula (a0-1) shown below and the structural unit (a1) containing an acid decomposable group that exhibits increased polarity under the action of acid, wherein the amount of the structural unit (a0) based on the combined total of all structural units constituting the polymeric compound is less than 50 mol %.

[Chemical Formula 73]

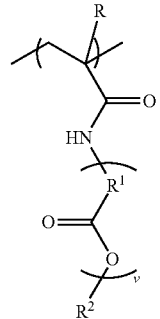

(a0-1)

In the formula, R represents a hydrogen atom, an alkyl group of 1 to 5 carbon atoms or a halogenated alkyl group of 1 to 5 carbon atoms; $R^1$ represents a divalent linking group; $R^2$ represents a —$SO_2$— containing cyclic group; and v represents 0 or 1.

In the polymeric compound of the present invention, the aforementioned structural unit (a1) is preferably a structural unit (a11) derived from an acrylate ester which may have the hydrogen atom bonded to the carbon atom on the α-position substituted with a substituent.

The polymeric compound of the present invention is the same as defined above for the component (A1) of the resist composition according to the first aspect of the present invention (namely, a polymeric compound including the structural unit (a0) and the structural unit (a1)), and each of the structural units and the amounts thereof in the component (A1) are the same as described above.

The polymeric compound of the present invention is a novel compound useful as a base resin for the resist composition, and can be suitably added to a resist composition as a base component capable of forming a film.

<<Production Method of Polymeric Compound>>

The polymeric compound according to the third aspect of the present invention can be produced by dissolving monomers for deriving each of the structural units in a polymerization solvent, and adding thereto, for example, a radical polymerization initiator such as azobisisobutyronitrile (AIBN) and dimethyl azobisisobutyrate to effect polymerization.

As the polymerization solvent, since the solubility of a compound (monomer) for deriving the structural unit (a0) is particularly improved, it is preferable to use a nitrogen-containing solvent. The term "nitrogen-containing solvent" refers to an organic solvent containing a nitrogen atom within the molecule. As the nitrogen-containing solvent, amide group-containing solvents are preferred. More specifically, N-methylpyrrolidone (NMP), N,N-dimethylformamide (DMF) or the like is preferred, and N-methylpyrrolidone (NMP) is particularly desirable.

As a polymerization solvent, solvents other than the nitrogen-containing solvents can also be used, and in such cases, it is preferable to use a polar solvent such as γ-butyrolactone, dioxane and dimethyl sulfoxide.

Furthermore, in the polymeric compound according to the present invention, by using a chain transfer agent such as HS—$CH_2$—$CH_2$—$CH_2$—$C(CF_3)_2$—OH during the above polymerization, a —$C(CF_3)_2$—OH group can be introduced at the terminals of the polymeric compound. Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

A monomer (a0-1-1) for deriving the structural unit (a0) (in the case of v=1 in general formula (a0-1)) can be produced, for example, by the following methods (i) and (ii).

Of these methods, it is preferable to use the method (i) for the production.

Method (i):

The monomer (a0-1-1) can be produced by first reacting a compound (X-1) represented by general formula (X-1) shown below with a compound (X-2) represented by general formula (X-2) shown below to prepare a compound (X-3), and then reacting the compound (X-3) with a compound (X-4) represented by general formula (X-4) shown below.

[Chemical Formula 74]

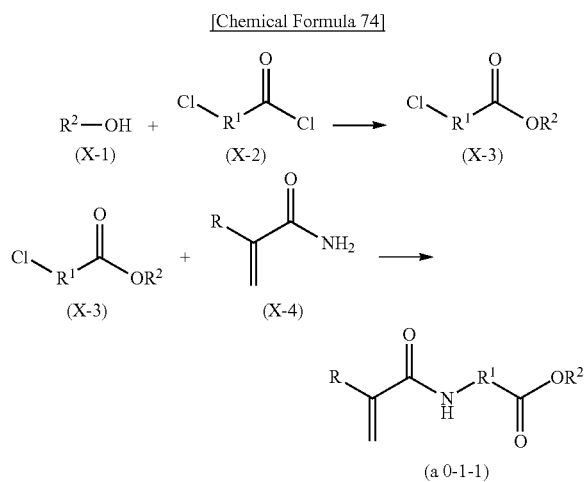

(a 0-1-1)

In the formulas, R, $R^1$ and $R^2$ are each the same as defined for R, $R^1$ and $R^2$ in the aforementioned general formula (a0-1).

The compound (X-1) can be reacted with the compound (X-2), for example, by dissolving and stirring these compounds in a solvent such as tetrahydrofuran (THF).

The reaction temperature is preferably about −20 to about 70° C., and more preferably about 0 to about 60° C. The reaction time varies, depending on the reactivity of the compound (X-1) with the compound (X-2), the reaction temperature, and the like, but in general, the reaction time is preferably 1 to 20 hours, and more preferably 1 to 10 hours.

In general, the amount of the compound (X-2) used in the above reaction is preferably about 1 to 2 moles, per 1 mole of the compound (X-1).

The compound (X-3) can be reacted with the compound (X-4), for example, by dissolving and stirring these compounds in a solvent such as tetrahydrofuran (THF).

The reaction temperature is preferably about −20 to about 70° C., and more preferably about 0 to about 60° C. The reaction time varies, depending on the reactivity of the compound (X-3) with the compound (X-4), the reaction temperature, and the like, but in general, the reaction time is preferably 1 to 20 hours, and more preferably 1 to 10 hours.

In general, the amount of the compound (X-4) used in the above reaction is preferably about 0.5 to 2 moles, per 1 mole of the compound (X-3).

Method (ii):

The monomer (a0-1-1) can be produced by reacting a compound (X-1) represented by general formula (X-1) shown below with a compound (X-5) represented by general formula (X-5) shown below.

[Chemical Formula 75]

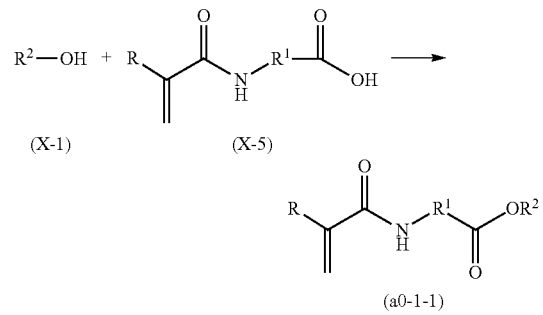

(a0-1-1)

In the formulas, R, $R^1$ and $R^2$ are each the same as defined for R, $R^1$ and $R^2$ in the aforementioned general formula (a0-1).

The compound (X-1) can be reacted with the compound (X-5), for example, by dissolving and stirring these compounds in a solvent such as tetrahydrofuran (THF).

The reaction temperature is preferably about −20 to about 70° C., and more preferably about 0 to about 60° C. The reaction time varies, depending on the reactivity of the compound (X-1) with the compound (X-5), the reaction temperature, and the like, but in general, the reaction time is preferably 1 to 20 hours, and more preferably 1 to 10 hours.

In general, the amount of the compound (X-5) used in the above reaction is preferably about 1 to 2 moles, per 1 mole of the compound (X-1).

A monomer (a0-1-0) for deriving the structural unit (a0) (in the case of v=0 in general formula (a0-1)) can be produced, for example, by the following method (iii).

Method (iii):

The monomer (a0-1-0) can be produced by reacting a compound (X-6) represented by general formula (X-6) shown below with a compound (X-7) represented by general formula (X-7) shown below.

[Chemical Formula 76]

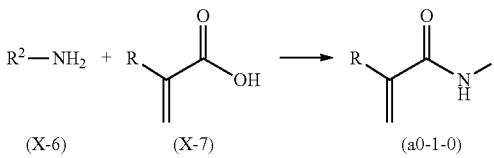

In the formulas, R and $R^2$ are each the same as defined for R and $R^2$ in the aforementioned general formula (a0-1).

The compound (X-6) can be reacted with the compound (X-7), for example, by dissolving and stirring these compounds in a solvent such as tetrahydrofuran (THF).

The reaction temperature is preferably about −20 to about 70° C., and more preferably about 0 to about 60° C. The reaction time varies, depending on the reactivity of the compound (X-6) with the compound (X-7), the reaction temperature, and the like, but in general, the reaction time is preferably 1 to 20 hours, and more preferably 1 to 10 hours.

In general, the amount of the compound (X-7) used in the above reaction is preferably about 1 to 2 moles, per 1 mole of the compound (X-6).

Following completion of the reaction, the separation and purification of the monomers (a0-1-1) and (a0-1-0) in the reaction solution can be conducted by a conventional method. For example, any one of concentration, solvent extraction, distillation, crystallization, recrystallization and chromatography can be used alone, or two or more of these methods may be used in combination.

The structure of the polymeric compound according to the present invention which is obtained in the manner described above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

EXAMPLES

As follows is a more detailed description of the present invention based on a series of examples, although the scope of the present invention is in no way limited by these examples.

In the following examples, a compound represented by a chemical formula (1) is designated as "compound (1)", and the same labeling system applies for compounds represented by other chemical formulas.

Monomer Synthesis Example

Synthesis of Compound (2)

24.0 g (126.2 mmol) of an alcohol (1-1) and 126 g of THF were charged into a 500 mL three-necked flask in a nitrogen atmosphere, and after adding 14.0 g (177.0 mmol) of pyridine thereto, the resulting mixture was stirred at room temperature for 15 minutes. Then, 18.8 g (166.5 mmol) of chloroacetic acid chloride was dropwise added thereto under ice cooling (0° C.), and the resulting mixture was stirred for 2 hours at 5 to 10° C. Thereafter, 76 g of water and 76 g of ethyl acetate were added to the reaction mixture, and following stirring, the resulting organic layer was washed with 76 g of a 8% by weight aqueous solution of sodium hydrogen carbonate and was then washed with 76 g of water, followed by the removal of solvent by distillation. The obtained residue was recrystallized using an ethyl acetate/toluene mixture, thereby obtaining 25.8 g (96.7 mmol) of a compound (1-2) (yield: 76.7%).

[Chemical Formula 77]

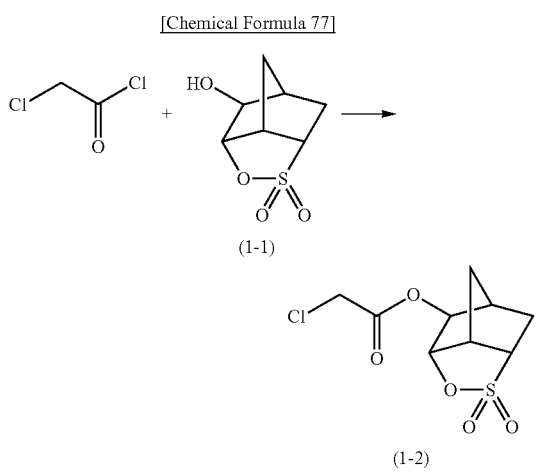

Subsequently, 12.1 g (45.3 mmol) of the compound (1-2), 63.5 g of THF, 5.00 g (36.2 mmol) of potassium carbonate and 0.163 g (0.44 mmol) of tetrabutylammonium iodide were added to a three-necked flask in a nitrogen atmosphere and then heated to 40° C. Then, 4.63 g (54.4 mmol) of methacrylic acid amide was added thereto while stirring, and the resulting mixture was heated to 50° C., stirred for 3 hours, and was then cooled to room temperature. 64.2 g of toluene and 38.1 g of water were added to the reaction solution, and following stirring, the resulting organic layer was washed twice with 38.0 g of water, followed by the removal of solvent by distillation. The obtained residue was recrystallized using a toluene/diisopropylether mixture, thereby obtaining 11.7 g (37.2 mmol) of a compound (2) (yield: 82.1%).

[Chemical Formula 78]

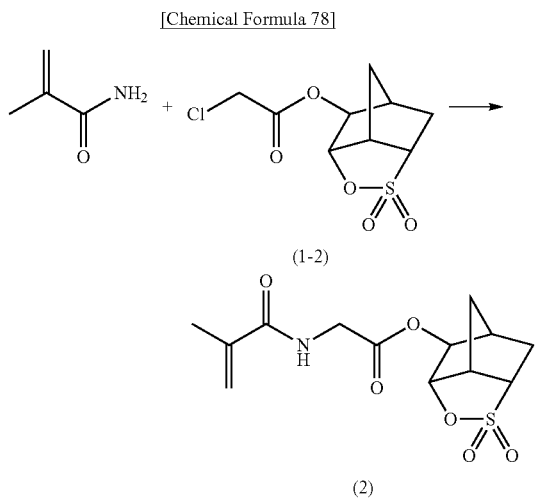

The obtained compound (2) was analyzed by $^1$H-NMR, and the structure was identified on the basis of the results shown below. It was confirmed that the compound (2) had the above-mentioned structure.

In the NMR analysis, the internal standard for $^1$H-NMR was tetramethylsilane (TMS).

$^1$H-NMR (CDCl$_3$, 400 MHz): δ (ppm)=8.37 (s, 1H), 5.72 (s, 1H), 5.38 (s, 1H), 4.79 (m, 1H), 4.56 (m, 1H), 3.88-3.95

(m, 3H), 3.46-3.50 (m, 1H), 2.41-2.52 (m, 1H), 2.10-2.20 (m, 1H), 1.81-1.90 (m, 5H), 1.75-1.79 (m, 1H)

Polymer Synthesis Example 1

Synthesis of Polymeric Compound (1)

In a separable flask equipped with a thermometer, a reflux tube and a nitrogen feeding pipe, 12.00 g (70.52 mmol) of a compound (1), 12.81 g (40.63 mmol) of a compound (2), 17.88 g (68.13 mmol) of a compound (3), and 5.63 g (33.47 mmol) of a compound (4), and 6.59 g (26.32 mmol) of a compound (5) were dissolved in 66.42 g of N-methylpyrrolidone (NMP). Subsequently, 11.95 mmol of dimethyl azobisisobutyrate (V-601, manufactured by Wako Pure Chemical Industries, Ltd.) was added and dissolved in the resulting solution as a polymerization initiator.

The resulting solution was added dropwise, over a period of four hours and under a nitrogen atmosphere, to N-methylpyrrolidone (NMP) that was heated to 80° C. Following completion of the dropwise addition, the reaction solution was heated while stirring for one hour, and was then cooled to room temperature.

The obtained reaction polymer solution was dropwise added to an excess amount of methanol to deposit a polymer. Thereafter, the precipitated white powder was separated by filtration, followed by washing with methanol and drying, thereby obtaining 35.21 g of a polymeric compound (1) as an objective compound.

For this polymeric compound (1), the polystyrene-equivalent weight average molecular weight (Mw) determined by GPC measurement was 7,700, and the molecular weight dispersity (Mw/Mn) was 1.62. Further, the compositional ratio of the copolymer (the proportion (molar ratio) of each of the structural units within the structural formula) determined by carbon-13 nuclear magnetic resonance spectroscopy (600 MHz, 13C-NMR) was l/m/n/o/p=37.2/15.1/17.9/16.1/13.7.

[Chemical Formula 79]

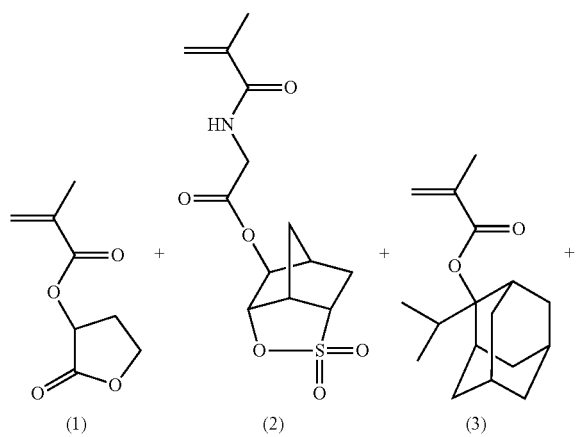

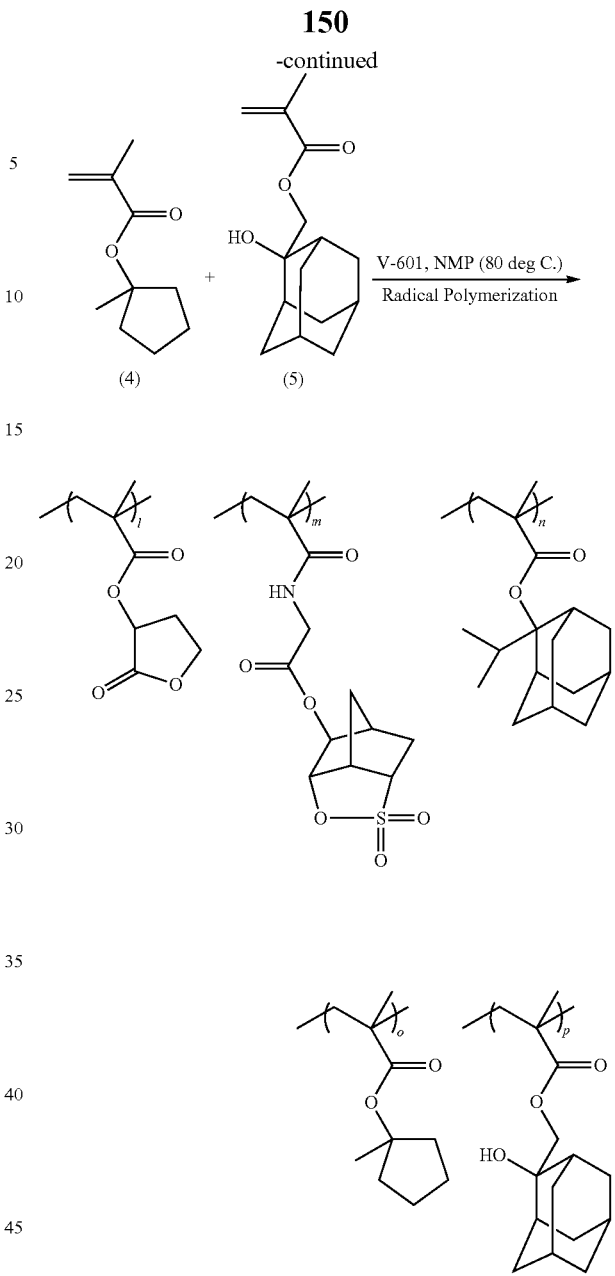

Polymeric compound (1)

Polymer Synthesis Examples 2 to 13

Synthesis of Polymeric Compounds (2) to (13)

Polymeric compounds (2) to (13) were synthesized by the same method as described above in the Polymer Synthesis Example 1 with the exception that the following compounds (1) to (10) that give rise to the structural units constituting the respective copolymers were used at a predetermined molar ratio.

For each copolymer, the compounds for deriving the respective structural units, the compositional ratio of the copolymer as determined by carbon-13 nuclear magnetic resonance spectroscopy (600 MHz, $^{13}$C-NMR), and the weight average molecular weight (Mw) and the dispersity (Mw/Mn) in terms of the polystyrene equivalent value measured by gel permeation chromatography (GPC) are shown in Table 1.

[Chemical Formula 80]
(1) 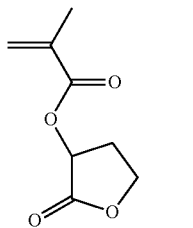
(2) 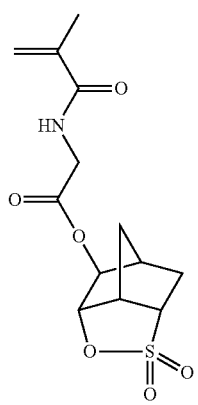
(3) 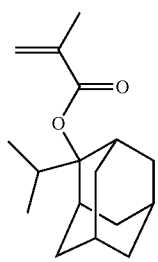
(4) 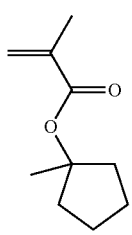
(5) 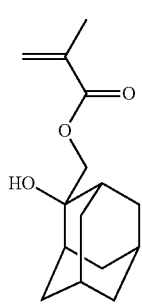
-continued
(6) 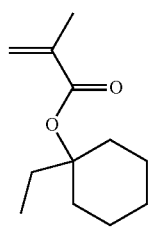
(7) 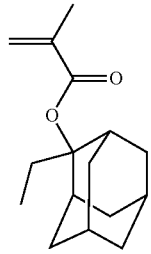
(8) 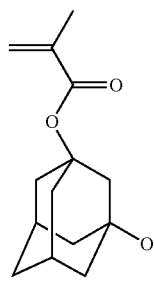
(9) 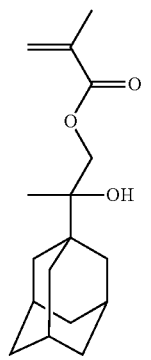
(10) 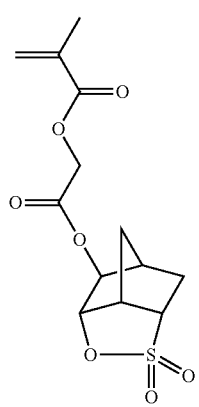

TABLE 1

| | Compounds for deriving each structural unit | Copolymer compositional ratio | Mw | Mw/Mn |
|---|---|---|---|---|
| Polymeric compound (1) | (1)/(2)/(3)/(4)/(5) | 37.2/15.1/17.9/16.1/13.7 | 7,700 | 1.62 |
| Polymeric compound (2) | (2)/(6)/(5) | 31.1/42.2/26.7 | 6,700 | 1.62 |
| Polymeric compound (3) | (2)/(3)/(8) | 31.7/43.9/24.4 | 7,400 | 1.57 |
| Polymeric compound (4) | (2)/(3)/(6)/(5) | 37.0/40.7/8.1/14.2 | 7,200 | 1.64 |
| Polymeric compound (5) | (2)/(3)/(7)/(9) | 37.5/39.8/8.2/14.5 | 7,800 | 1.63 |
| Polymeric compound (6) | (2)/(6)/(5) | 51.3/30.4/18.3 | 6,500 | 1.56 |
| Polymeric compound (7) | (1)/(10)/(3)/(4)/(5) | 37.2/15.1/17.9/16.1/13.7 | 7,100 | 1.63 |
| Polymeric compound (8) | (10)/(6)/(5) | 32.1/43.8/24.1 | 7,500 | 1.57 |
| Polymeric compound (9) | (10)/(3)/(8) | 32.0/43.9/24.1 | 7,000 | 1.56 |
| Polymeric compound (10) | (10)/(3)/(7)/(9) | 36.8/40.0/8.1/15.1 | 7,300 | 1.66 |
| Polymeric compound (11) | (2)/(3)/(6)/(8) | 36.8/40.0/8.1/15.1 | 7,300 | 1.66 |
| Polymeric compound (12) | (2)/(3)/(6)/(5) | 37.0/20.7/28.1/14.2 | 7,300 | 1.66 |
| Polymeric compound (13) | (2)/(6)/(8) | 32.5/40.2/27.3 | 7,600 | 1.55 |

Preparation of Resist Compositions

Examples 1 to 13, Comparative Examples 1 to 8

The components shown in Tables 2 and 3 were mixed together and dissolved to obtain resist compositions.

TABLE 2

| | Component (A) | Component (B) | | Component (D) | Component (E) | Component (S) | | |
|---|---|---|---|---|---|---|---|---|
| Ex. 1 | (A)-1 [100] | (B)-1 [9.0] | (B)-2 [3.0] | (D)-1 [0.6] | (E)-1 [0.8] | (S)-1 [1,410] | (S)-2 [940] | (S)-3 [780] |
| Ex. 2 | (A)-2 [100] | (B)-1 [9.0] | (B)-2 [3.0] | (D)-1 [0.6] | (E)-1 [0.8] | (S)-1 [1,410] | (S)-2 [940] | (S)-3 [780] |
| Ex. 3 | (A)-3 [100] | (B)-1 [9.0] | (B)-2 [3.0] | (D)-1 [0.6] | (E)-1 [0.8] | (S)-1 [1,410] | (S)-2 [940] | (S)-3 [780] |
| Ex. 4 | (A)-4 [100] | (B)-1 [9.0] | (B)-2 [3.0] | (D)-1 [0.6] | (E)-1 [0.8] | (S)-1 [1,410] | (S)-2 [940] | (S)-3 [780] |
| Ex. 5 | (A)-5 [100] | (B)-1 [9.0] | (B)-2 [3.0] | (D)-1 [0.6] | (E)-1 [0.8] | (S)-1 [1,410] | (S)-2 [940] | (S)-3 [780] |
| Comp. Ex. 1 | (A)-7 [100] | (B)-1 [9.0] | (B)-2 [3.0] | (D)-1 [0.6] | (E)-1 [0.8] | (S)-1 [1,410] | (S)-2 [940] | (S)-3 [780] |
| Comp. Ex. 2 | (A)-8 [100] | (B)-1 [9.0] | (B)-2 [3.0] | (D)-1 [0.6] | (E)-1 [0.8] | (S)-1 [1,410] | (S)-2 [940] | (S)-3 [780] |
| Comp. Ex. 3 | (A)-9 [100] | (B)-1 [9.0] | (B)-2 [3.0] | (D)-1 [0.6] | (E)-1 [0.8] | (S)-1 [1,410] | (S)-2 [940] | (S)-3 [780] |
| Comp. Ex. 4 | (A)-10 [100] | (B)-1 [9.0] | (B)-2 [3.0] | (D)-1 [0.6] | (E)-1 [0.8] | (S)-1 [1,410] | (S)-2 [940] | (S)-3 [780] |
| Ex. 6 | (A)-11 [100] | (B)-1 [9.0] | (B)-2 [3.0] | (D)-1 [0.6] | (E)-1 [0.8] | (S)-1 [1,410] | (S)-2 [940] | (S)-3 [780] |
| Ex. 7 | (A)-12 [100] | (B)-1 [9.0] | (B)-2 [3.0] | (D)-1 [0.6] | (E)-1 [0.8] | (S)-1 [1,410] | (S)-2 [940] | (S)-3 [780] |
| Ex. 8 | (A)-13 [100] | (B)-1 [9.0] | (B)-2 [3.0] | (D)-1 [0.6] | (E)-1 [0.8] | (S)-1 [1,410] | (S)-2 [940] | (S)-3 [780] |

TABLE 3

| | Component (A) | Component (B) | | Component (D) | Component (E) | Component (F) | Component (S) | | |
|---|---|---|---|---|---|---|---|---|---|
| Ex. 9 | (A)-1 [100] | (B)-1 [9.0] | (B)-2 [3.0] | (D)-1 [0.6] | (E)-1 [0.8] | (F)-1 [3.0] | (S)-1 [1,410] | (S)-2 [940] | (S)-3 [780] |
| Comp. Ex. 5 | (A)-7 [100] | (B)-1 [9.0] | (B)-2 [3.0] | (D)-1 [0.6] | (E)-1 [0.8] | (F)-1 [3.0] | (S)-1 [1,410] | (S)-2 [940] | (S)-3 [780] |
| Ex. 10 | (A)-2 [100] | (B)-1 [9.0] | (B)-2 [3.0] | (D)-1 [0.6] | (E)-1 [0.8] | (F)-1 [3.0] | (S)-1 [1,410] | (S)-2 [940] | (S)-3 [780] |
| Comp. Ex. 6 | (A)-8 [100] | (B)-1 [9.0] | (B)-2 [3.0] | (D)-1 [0.6] | (E)-1 [0.8] | (F)-1 [3.0] | (S)-1 [1,410] | (S)-2 [940] | (S)-3 [780] |
| Ex. 11 | (A)-3 [100] | (B)-1 [9.0] | (B)-2 [3.0] | (D)-1 [0.6] | (E)-1 [0.8] | (F)-1 [3.0] | (S)-1 [1,410] | (S)-2 [940] | (S)-3 [780] |
| Comp. Ex. 7 | (A)-9 [100] | (B)-1 [9.0] | (B)-2 [3.0] | (D)-1 [0.6] | (E)-1 [0.8] | (F)-1 [3.0] | (S)-1 [1,410] | (S)-2 [940] | (S)-3 [780] |
| Ex. 12 | (A)-4 [100] | (B)-1 [9.0] | (B)-2 [3.0] | (D)-1 [0.6] | (E)-1 [0.8] | (F)-1 [3.0] | (S)-1 [1,410] | (S)-2 [940] | (S)-3 [780] |
| Ex. 13 | (A)-5 [100] | (B)-1 [9.0] | (B)-2 [3.0] | (D)-1 [0.6] | (E)-1 [0.8] | (F)-1 [3.0] | (S)-1 [1,410] | (S)-2 [940] | (S)-3 [780] |

TABLE 3-continued

| | Component (A) | Component (B) | | Component (D) | Component (E) | Component (F) | Component (S) | | |
|---|---|---|---|---|---|---|---|---|---|
| Comp. Ex. 8 | (A)-10 [100] | (B)-1 [9.0] | (B)-2 [3.0] | (D)-1 [0.6] | (E)-1 [0.8] | (F)-1 [3.0] | (S)-1 [1,410] | (S)-2 [940] | (S)-3 [780] |

In Tables 2 to 6, the values in brackets [ ] indicate the amount (in terms of parts by weight) of the component added, and the reference characters indicate the following.

(A)-1 to (A)-5: the aforementioned polymeric compounds (1) to (5)

(A)-7 to (A)-13: the aforementioned polymeric compounds (7) to (13)

(B)-1: an acid generator represented by chemical formula (B)-1 shown below (B)-2: an acid generator represented by chemical formula (B)-2 shown below

[Chemical Formula 81]

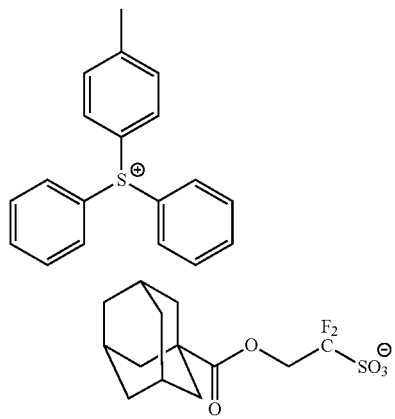

(D)-1: tri-n-pentylamine
(E)-1: salicylic acid
(F)-1: a fluorine-containing copolymer represented by chemical formula (F)-1 shown below, Mw: 17,700, Mw/Mn: 1.29. In the chemical formula (F)-1, the subscript numerals shown on the bottom right of the parentheses ( ) indicate the percentage (mol %) of the respective structural units. The compositional ratio of the copolymer (the proportion (molar ratio) of each of the structural units within the structural formula) was l/m/n=80.2/13.7/6.1.

[Chemical Formula 82]

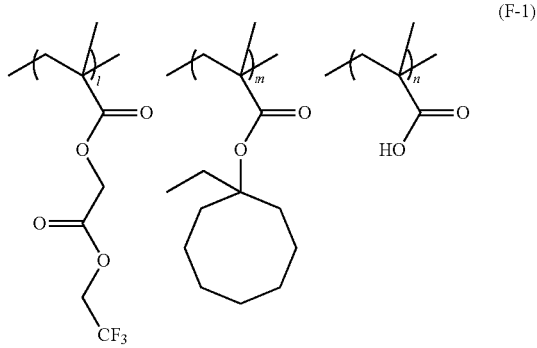

(S)-1: propylene glycol monomethyl ether acetate
(S)-2: propylene glycol monomethyl ether
(S)-3: cyclohexanone <Resist Pattern Formation (1)>

An organic antireflection film composition (product name: ARC29A, manufactured by Brewer Science Ltd.) was applied onto a 12-inch silicon wafer using a spinner, and the composition was then baked and dried on a hotplate at 205° C. for 60 seconds, thereby forming an organic antireflection film having a film thickness of 89 nm.

Then, each of the resist compositions obtained in Examples 1 to 8 and Comparative Examples 1 to 4 was applied onto the organic antireflection film using a spinner, and was then pre-baked (PAB) on a hotplate at 110° C. for 60 seconds and dried, thereby forming a resist film having a film thickness of 90 nm.

Subsequently, the resist film was selectively irradiated with an ArF excimer laser (193 nm) through a mask using an ArF exposure apparatus (product name: NSR-S609B, manufactured by Nikon Corporation, NA (numerical aperture)=1.08; Cross pole).

Thereafter, a post exposure bake (PEB) treatment was conducted at the temperature indicated in Table 4 for 60 seconds, followed by alkali development for 10 seconds at 23° C. in a 2.38% by weight aqueous solution of tetramethylammonium hydroxide (TMAH). Then, the resist film was washed for 15 seconds with pure water, followed by drying by shaking. Then, a post bake was conducted at 100° C. for 45 seconds.

As a result, in each of the examples, a 1:1 line and space pattern (LS pattern) with a line width of 49 nm and a pitch of 98 nm was formed.

The optimum exposure dose Eop (mJ/cm$^2$; sensitivity) with which the LS pattern was formed was determined. The results are shown in Table 4.

[Evaluation of Exposure Latitude (EL Margin)]

With respect to the optimum exposure dose Eop described above, the exposure dose with which an LS pattern was formed within a dimensional variation of ±5% from the target dimension (line width of 49 nm) (namely, within a range from 46.55 nm to 51.45 nm) was determined, and the EL margin (unit: %) was determined by the following formula. The results are shown in Table 4.

$$EL\ margin\ (\%) = (|E1-E2|/Eop) \times 100$$

E1: Exposure dose (mJ/cm$^2$) with which an LS pattern having a line width of 46.55 nm was formed E2: Exposure dose (mJ/cm$^2$) with which an L/S pattern having a line width of 51.45 nm was formed The larger the value of EL margin, the smaller the fluctuation in the pattern size accompanied by the variation in the exposure dose.

[Evaluation of Line Width Roughness (LWR)]

With respect to each of the LS patterns formed with the above optimum exposure dose Eop and having a line width of 49 nm and a pitch of 98 nm, the space width at 400 points in the lengthwise direction of the space were measured using a measuring scanning electron microscope (SEM) (product name: S-9380, manufactured by Hitachi High-Technologies Corporation; acceleration voltage: 300V). From the results, the value of 3 times the standard deviation s (i.e., 3 s) was determined, and the average of the 3 s values at 400 points was calculated as a yardstick of LWR. The results are shown in Table 4.

The smaller this 3 s value is, the lower the level of roughness of the line width, indicating that an LS pattern with a uniform width was obtained.

[Evaluation of Resolution]

The critical resolution (nm) with the above optimum exposure dose Eop was determined using a scanning electron microscope (product name: S-9380, manufactured by Hitachi High-Technologies Corporation). The results are indicated as "resolution (nm)" in Table 4.

[Evaluation of Resist Pattern Shape]

With respect to each of the 1:1 LS patterns formed with the above optimum exposure dose Eop, the cross-sectional shape was observed using a scanning electron microscope (product name: SU-8000, manufactured by Hitachi High-Technologies Corporation) to thereby evaluate the resist pattern shape. The results are shown in Table 4.

TABLE 4

| | PEB (° C.) | Eop (mJ/cm$^2$) | EL margin (%) | LWR (nm) | Resolution (nm) | Resist pattern shape |
|---|---|---|---|---|---|---|
| Ex. 1 | 90 | 28 | 5.9 | 5.1 | 41 | Rectangular |
| Ex. 2 | 95 | 26 | 4.2 | 4.8 | 43 | Rectangular |
| Ex. 3 | 90 | 22 | 5.7 | 5.2 | 42 | Rectangular |
| Ex. 4 | 85 | 24 | 5.6 | 5.4 | 41 | Rectangular |
| Ex. 5 | 85 | 25 | 5.8 | 5.1 | 43 | Rectangular |
| Comp. Ex. 1 | 90 | 26 | 4.8 | 6.8 | 45 | Rectangular |
| Comp. Ex. 2 | 95 | 24 | 4.0 | 6.5 | 47 | Tapered |
| Comp. Ex. 3 | 90 | 21 | 4.5 | 7.0 | 48 | Tapered |
| Comp. Ex. 4 | 85 | 23 | 4.7 | 6.9 | 48 | Tapered |
| Ex. 6 | 90 | 26 | 5.2 | 5.6 | 43 | Rectangular |
| Ex. 7 | 85 | 27 | 5.6 | 5.1 | 43 | Rectangular |
| Ex. 8 | 95 | 26 | 5.2 | 5.8 | 43 | Rectangular |

From the results shown in Table 4, it is clear that the resist compositions of Examples 1 to 8 which employed the present invention exhibited excellent resolution, as well as excellent lithography properties and resist pattern shape.

<Evaluation of Contact Angle in Resist Film>

Subsequently, using a spinner, each of the resist compositions obtained in Examples 1 to 5 and Comparative Examples 1 to 4 was applied onto an 8-inch silicon wafer that had been treated with hexamethyldisilazane (HMDS), and was then prebaked and dried on a hotplate at 110° C. for 60 seconds, thereby forming a resist film having a film thickness of 90 nm.

A water droplet was dripped onto the surface of each resist film (the resist film prior to exposure), and a DROP MASTER-700 apparatus (a product name, manufactured by Kyowa Interface Science Co., Ltd.) was used to measure the contact angle (contact angle measurement: water 2 µL). The result of this measurement was recorded as the "contact angle) (° after coating".

Thereafter, following measurement of the contact angle after coating, the wafer was subjected to an alkali developing treatment for 30 seconds at 23° C. in a 2.38% by weight aqueous solution of tetramethylammonium hydroxide (TMAH). The wafer was then rinsed with pure water for 15 seconds, followed by drying by shaking. Subsequently, the contact angle was measured in the same manner as that described above. The measured values were defined as the "contact angle (°) after development".

The results are shown in Table 5.

<Resist Pattern Formation (2)>

An organic antireflection film composition (product name: ARC29A, manufactured by Brewer Science Ltd.) was applied onto an 8-inch silicon wafer using a spinner, and the composition was then baked and dried on a hotplate at 205° C. for 60 seconds, thereby forming an organic antireflection film having a film thickness of 89 nm.

Then, each of the resist compositions obtained in Examples 1 to 5, 9 to 13 and Comparative Examples 1 to 8 was applied onto the organic antireflection film using a spinner, and was then prebaked (PAB) on a hotplate at 110° C. for 60 seconds and dried, thereby forming a resist film having a film thickness of 90 nm.

Subsequently, the resist film was selectively irradiated with an ArF excimer laser (193 nm) through a mask (6% halftone) using an ArF exposure apparatus (product name: NSR-S308, manufactured by Nikon Corporation; NA (numerical aperture)=0.92; dipole).

Thereafter, a post exposure bake (PEB) treatment was conducted at the temperature indicated in Table 5 for 60 seconds, followed by alkali development for 10 seconds at 23° C. in a 2.38% by weight aqueous solution of tetramethylammonium hydroxide (TMAH). Then, the resist film was washed for 15 seconds with pure water, followed by drying by shaking.

As a result, in each of the examples, a 1:1 line and space pattern (LS pattern) with a line width of 65 nm and a pitch of 130 nm was formed.

The optimum exposure dose Eop (mJ/cm$^2$; sensitivity) with which the LS pattern was formed was determined. The results are shown in Table 5.

[Evaluation of Developing Defect]

The 1:1 LS pattern having a line width of 65 nm and a pitch of 130 nm which was obtained as described above in the resist pattern formation method (2) was observed using a surface defect detection apparatus (product name: "KLA2371") manufactured by KLA-TENCOR Corporation. The number of developing defects in the unexposed portions per one silicon wafer was determined. The results are shown in Table 5.

TABLE 5

| | PEB (° C.) | Contact angle after coating (°) | Contact angle after development (°) | Number of defects (unexposed portions) |
|---|---|---|---|---|
| Ex. 1 | 90 | 72 | 62 | 3,200 |
| Comp. Ex. 1 | 90 | 75 | 66 | >10,000 |

TABLE 5-continued

| | PEB (° C.) | Contact angle after coating (°) | Contact angle after development (°) | Number of defects (unexposed portions) |
|---|---|---|---|---|
| Ex. 2 | 95 | 70 | 61 | 2,800 |
| Comp. Ex. 2 | 95 | 73 | 64 | >10,000 |
| Ex. 3 | 90 | 72 | 60 | 2,500 |
| Comp. Ex. 3 | 90 | 76 | 65 | >10,000 |
| Ex. 4 | 85 | 72 | 61 | 2,700 |
| Ex. 5 | 85 | 73 | 62 | 3,100 |
| Comp. Ex. 4 | 85 | 77 | 65 | >10,000 |
| Ex. 9 | 90 | 87 | 42 | 74 |
| Comp. Ex. 5 | 90 | 88 | 46 | 170 |
| Ex. 10 | 95 | 87 | 40 | 56 |
| Comp. Ex. 6 | 95 | 87 | 44 | 147 |
| Ex. 11 | 90 | 88 | 43 | 83 |
| Comp. Ex. 7 | 90 | 88 | 46 | 184 |
| Ex. 12 | 85 | 85 | 41 | 68 |
| Ex. 13 | 85 | 86 | 43 | 80 |
| Comp. Ex. 8 | 85 | 86 | 45 | 151 |

From the results shown in Table 5, it can be confirmed that, as compared to the resist compositions of Comparative Examples 1 to 8, the resist compositions of Example 1 to 5 and 9 to 13 which employed the present invention exhibited a lower contact angle following developing and a smaller number of defects, and thus it is clear that the occurrence of defects following developing was suppressed.

[Evaluation of Solubility of Polymeric Compound in Organic Solvent]

Using the polymeric compounds and organic solvent shown below, each of the polymeric compounds was added and mixed with the organic solvent so as to prepare 20% by weight solutions for each polymeric compound, and whether or not each of the polymeric compounds had dissolved at room temperature conditions (23° C.) was confirmed.

Polymeric compound: the aforementioned polymeric compounds (1) to (6)

Organic solvent: propylene glycol monomethyl ether acetate (PGMEA)

The obtained evaluation results are shown in Table 6. In the table, the letter "A" indicates that the polymeric compound was dissolved, whereas the letter "B" indicates that the polymeric compound was not dissolved, respectively.

TABLE 6

| | Solubility in PGMEA |
|---|---|
| Polymeric compound (1) | A |
| Polymeric compound (2) | A |
| Polymeric compound (3) | A |
| Polymeric compound (4) | A |
| Polymeric compound (5) | A |
| Polymeric compound (6) | B |

From the results shown in Table 6, it is evident that the polymeric compound (6) including the structural unit (a0) defined in the present invention in an amount of at least 50 mol % exhibited poor solubility in the organic solvent.

What is claimed is:

1. A resist composition comprising:
a base component (A) that exhibits changed solubility in a developing solution under action of acid; and
an acid generator component (B) that generates acid upon exposure,
wherein said base component (A) comprises a resin component (A1) including a structural unit (a0) represented by general formula (a0-1) shown below and a structural unit (a1) containing an acid decomposable group that exhibits increased polarity under action of acid, and
an amount of said structural unit (a0) is less than 50 mol %,

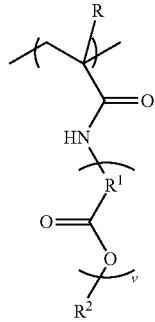

(a0-1)

wherein R represents a hydrogen atom, an alkyl group of 1 to 5 carbon atoms or a halogenated alkyl group of 1 to 5 carbon atoms; $R^1$ represents a divalent linking group; $R^2$ represents a —$SO_2$— containing cyclic group; and v represents 0 or 1.

2. The resist composition according to claim 1,
wherein said structural unit (a1) is a structural unit (a11) derived from an acrylate ester which may have a hydrogen atom bonded to a carbon atom on the α-position substituted with a substituent.

3. A method of forming a resist pattern, comprising:
using a resist composition of claim 1 or 2 to form a resist film on a substrate;
conducting exposure of said resist film; and
developing said resist film to form a resist pattern.

4. A polymeric compound comprising:
a structural unit (a0) represented by general formula (a0-1) shown below; and
a structural unit (a1) containing an acid decomposable group that exhibits increased polarity under action of acid,
wherein an amount of said structural unit (a0) is less than 50 mol %,

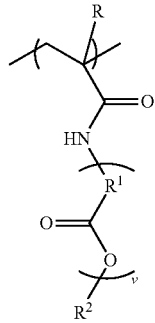

(a0-1)

wherein R represents a hydrogen atom, an alkyl group of 1 to 5 carbon atoms or a halogenated alkyl group of 1 to 5 carbon atoms; $R^1$ represents a divalent linking group; $R^2$ represents a —$SO_2$— containing cyclic group; and v represents 0 or 1.

5. The polymeric compound according to claim 4,
wherein said structural unit (a1) is a structural unit (a11) derived from an acrylate ester which may have a hydrogen atom bonded to a carbon atom on the α-position substituted with a substituent.

6. A method of producing a polymeric compound which is a method of producing a polymeric compound of claim 4 or 5, the method comprising using a nitrogen-containing solvent as a polymerization solvent.

\* \* \* \* \*